(12) United States Patent
Hatakeyama et al.

(10) Patent No.: US 8,846,303 B2
(45) Date of Patent: Sep. 30, 2014

(54) RESIST TOP COAT COMPOSITION AND PATTERNING PROCESS

(71) Applicant: Shin-Etsu Chemical Co., Ltd., Tokyo (JP)

(72) Inventors: Jun Hatakeyama, Jyoetsu (JP); Daisuke Kori, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 80 days.

(21) Appl. No.: 13/626,401

(22) Filed: Sep. 25, 2012

(65) Prior Publication Data

US 2013/0089820 A1   Apr. 11, 2013

(30) Foreign Application Priority Data

Oct. 11, 2011   (JP) ................................. 2011-224132

(51) Int. Cl.
| | | |
|---|---|---|
| G03F 7/004 | (2006.01) |
| G03F 7/039 | (2006.01) |
| G03F 7/11  | (2006.01) |
| G03F 7/20  | (2006.01) |
| G03F 7/30  | (2006.01) |

(52) U.S. Cl.
USPC ........ 430/311; 430/325; 430/326; 430/273.1; 430/905; 430/907; 430/910; 430/921; 430/925; 430/942

(58) Field of Classification Search
None
See application file for complete search history.

(56) References Cited

U.S. PATENT DOCUMENTS

| | | |
|---|---|---|
| 6,448,420 B1 | 9/2002 | Kinsho et al. |
| 2007/0122741 A1 | 5/2007 | Hatakeyama et al. |
| 2008/0118860 A1 | 5/2008 | Harada et al. |
| 2012/0208125 A1* | 8/2012 | Hatakeyama ............ 430/281.1 |
| 2012/0208127 A1* | 8/2012 | Hatakeyama ............ 430/283.1 |

FOREIGN PATENT DOCUMENTS

| | | |
|---|---|---|
| JP | A-9-246173 | 9/1997 |
| JP | A-2000-327633 | 11/2000 |
| JP | A-2006-58739 | 3/2006 |
| JP | A-2006-285075 | 10/2006 |
| JP | A-2008-65304 | 3/2008 |
| JP | A-2008-76850 | 4/2008 |
| JP | A-2008-111103 | 5/2008 |
| JP | B2-4425776 | 3/2010 |
| JP | A-2011-138107 | 7/2011 |
| JP | B2-4716027 | 7/2011 |
| JP | B2-4771083 | 9/2011 |

OTHER PUBLICATIONS

Kim et al., "CD Uniformity Improvement for EUV Resists Process: EUV Resolution Enhancement Layer," *Proc. of SPIE*, vol. 7969, 2011, pp. 796916-1 thru 796916-10.

\* cited by examiner

Primary Examiner — Sin J. Lee
(74) *Attorney, Agent, or Firm* — Oliff PLC

(57) ABSTRACT

There is disclosed a resist top coat composition, used in a patterning process onto a photoresist film, wherein a resist top coat is formed by using the resist top coat composition onto a photoresist film formed on a wafer, and then, after exposure, removal of the resist top coat and development of the photoresist film are performed to effect the patterning on the photoresist film, wherein the resist top coat composition contains a truxene compound having phenol groups shown by the following general formula (1). As a result, there is provided a resist top coat composition not only having an effect from an environment to a resist film reduced and effectively shielding an OOB light, but also reducing film loss of a resist pattern and bridging between patterns and having an effect to enhance sensitivity of the resist; and a patterning process using this.

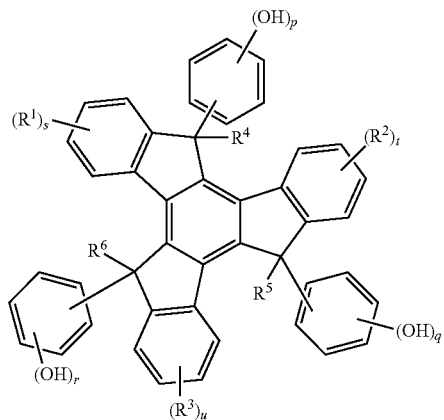

11 Claims, 2 Drawing Sheets

RESIST TOP COAT COMPOSITION AND PATTERNING PROCESS

BACKGROUND OF THE INVENTION

1. Field of the Invention

The present invention relates to a resist top coat composition and to a patterning process using the composition thereof.

2. Description of the Related Art

As LSI progresses toward a higher integration and a higher processing speed, miniaturization of a pattern rule progresses rapidly. In background of this rapid progress of miniaturization, there exist shifting of a projection lens to a higher NA, improvement of a resist composition performance, and shifting to a shorter wavelength.

General use of a resist composition for a KrF excimer laser (248 nm) started in a 0.3-μm process; and this has been used until mass-production of a 0.13-μm rule. Shift to a shorter wavelength from a KrF excimer laser to an ArF excimer laser (193 nm) makes it possible to miniaturize a design rule till 0.13 μm or less; but because a resin such as a novolak resin and a polyvinyl phenol resin, which have been used in the past, has strong absorption near 193 nm, they cannot be used as a resist base resin. To secure transparency and necessary dry etching resistance, an acryl resin and a cycloolefin-based alicyclic resin have been investigated; and as a result, mass-production of a device using an ArF lithography was realized.

In the next 45-nm node device, wavelength of exposure light was made shorter; and thus, an $F_2$ lithography of 157 nm became a candidate for this. However, this has many problems such as cost-up of a scanner due to large consumption of expensive $CaF_2$ single crystals in a projection lens, change of an optical system due to extremely poor durability of a soft pellicle thereby leading to introduction of a hard pellicle, and decrease of resist etching resistance; and thus, postponement of an $F_2$ lithography and early introduction of an ArF immersion lithography were proposed, with which a 45-nm node device is produced in a large scale. For mass-production of a 32-nm node device, a double patterning process using a sidewall spacer is used; but there is a problem of a long and complicated process thereof.

In a device after 32 nm, not an expensive double patterning process but an extreme UV (EUV) lithography of 13.5 nm, resolution thereof being improved by shift of the exposure light to a shorter wavelength by more than one digit, is wanted; and thus, development of it is progressing.

In the EUV lithography, power of a laser is weak and amount of light is decreased because of attenuation of a reflective mirror light; and thus, light intensity reaching to a wafer surface is low. To acquire throughput with a low light intensity, development of a highly sensitive resist is an urgent task. However, if resist sensitivity is enhanced, there is a problem of deterioration in edge roughness (LER and LWR); and thus, a trade-off relationship with the sensitivity is pointed out.

The EUV resist has a problem that it is easily affected from an environment because of its high sensitivity. Usually, an amine quencher is added in a chemically amplified resist to ease the effect of an amine contamination in an air; but amount of the amine quencher added in the EUV resist is a few percentages as compared with the ArF resist and so forth. Accordingly, the EUV resist is prone to form a T-top configuration by receiving the effect of an amine from the resist surface.

To shut the environmental effect, formation of a top coat on a resist upperlayer is effective. In a chemically amplified resist of an early type for a KrF excimer laser based on a t-BOC-protected polyhydroxy styrene, which was not added therein an amine quencher, use of a top coat was effective. In an early stage of an ArF immersion lithography too, a top coat was used to prohibit elution of an acid generator into water thereby avoiding a T-top configuration caused therefrom.

Here, in the EUV lithography process too, proposal was made to form a top coat on the resist upperlayer (Patent Document 1, Patent Document 2, Patent Document 3, and Nonpatent Document 1). By forming a top coat, environmental resistance can be improved and an outgoing gas from a resist film can be reduced.

From an EUV laser of DPP (Discharge Produced Plasma) and LPP (Laser Produced Plasma), in addition to the light of 13.5 nm which is used for patterning, a broad light of 140 to 300 nm (out-of-band, OOB) is oscillated, though is weak. Although intensity of the broad light is weak, but energy amount of this light cannot be neglected because of its wide wavelength range. A Zr filter is provided to an EUV microstepper to cut the OOB light, but this decreases a light intensity. In an EUV scanner in which, to improve throughput, decrease of a light intensity is not allowed, there exists a possibility of not using this filter.

Therefore, development of a resist which is not sensitive to OOB but sensitive to EUV is necessary. As to the resist like this, a cationic structure of a sulfonium salt of PAG is important; and in paragraph [0052] of the Patent Document 5, a bound type acid generator having a low sensitivity to the OOB light but having a high sensitivity to the EUV light is described. In Nonpatent Document 1, superiority of forming a top coat to shield the OOB light on the resist upperlayer is shown.

In the case of a top coat for an immersion lithography, it is pointed that a solvent for a top coat dissolves surface of a resist film thereby causing mixing between the top coat and the resist film, and this in turn causes film loss of a resist pattern after development (Patent Document 4). Especially, when an alcohol solvent is used, film loss is eminent. It is shown that an ether solvent is effective to inhibit film loss. As to a polymer which is soluble in an ether solvent, a polymer which contains a hexafluoroalcohol (HFA), as described in the Patent Document 4, may be mentioned. However, a fluorine atom has a strong absorption to the EUV light; and thus, if a HFA-containing polymer is used as a top coat of a resist upperlayer, there is a problem of lowered resist sensitivity after patterning.

A positive resist having a truxene structure is proposed (Patent Document 6). A resist based on a truxene having a hydroxyl group thereof substituted with an acid labile group is introduced as the EB (electron beam) resist and the EUV resist having excellent etching resistance. Among the underlayer materials having a plurality of bisphenols and excellent etching resistance, a truxene bisphenol compound is shown (Patent Document 7).

CITATION LIST

Patent Document

[PATENT DOCUMENT 1] Japanese Patent Laid-Open Publication No. 2006-58739
[PATENT DOCUMENT 2] Japanese Patent No. 4716027
[PATENT DOCUMENT 3] Japanese Patent Laid-Open Publication No. 2008-65304
[PATENT DOCUMENT 4] Japanese Patent No. 4771083
[PATENT DOCUMENT 5] Japanese Patent Laid-Open Publication No. 2011-138107

[PATENT DOCUMENT 6] Japanese Patent Laid-Open Publication No. 2008-76850
[PATENT DOCUMENT 7] Japanese Patent Laid-Open Publication No. 2006-285075

Nonpatent Document

[NONPATENT DOCUMENT 1] Proc. SPIE Vol. 7969, p796916-1 (2011)

SUMMARY OF THE INVENTION

The present invention was made in view of the situation described above, and has an object to provide; a resist top coat composition not only having an effect from an environment to a resist film reduced and effectively shielding an OOB light, but also reducing film loss of a resist pattern and bridging between patterns and having an effect to enhance sensitivity of the resist; and a patterning process using this.

In order to solve the above problems, the present invention a resist top coat composition, used in a patterning process onto a photoresist film, wherein a resist top coat is formed by using the resist top coat composition onto a photoresist film formed on a wafer, and then, after exposure, removal of the resist top coat and development of the photoresist film are performed to effect the patterning on the photoresist film, wherein the resist top coat composition contains a truxene compound having phenol groups shown by the following general formula (1),

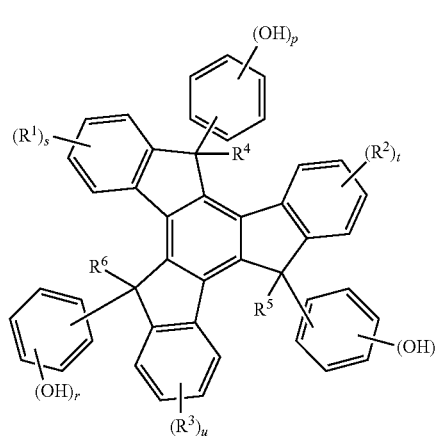

wherein $R^1$, $R^2$, and $R^3$ represent the same or different groups of a hydrogen atom; a hydroxyl group; a carboxyl group; a cyano group; a nitro group; an amino group; a halogen atom; or a linear, a branched, or a cyclic alkyl group having 1 to 10 carbon atoms, an alkoxy group, or an acyloxy group; each $R^4$, $R^5$, and $R^6$ represents a hydrogen atom, a hydroxyl group, or a substituted or an unsubstituted phenol group, or a naphthol group; p, q, and r represent an integer of 1 to 5; and s, t, and u represent an integer of 1 to 4.

A resist top coat composition like this not only can reduce an effect from an environment to a resist film and shield an OOB light effectively, but also can reduce film loss of a resist pattern and bridging between patterns and have an effect to enhance the resist sensitivity.

Alternatively, it is preferable that the resist top coat composition is soluble in an alkaline developer.

If it is soluble in an alkaline developer, after the exposure, removal of the resist top coat and development of the photoresist film can be performed simultaneously; and thus, the resist top coat can be removed more conveniently without additionally installing a removal equipment to the existing equipment.

Further, it is preferable that an organic solvent which is a mixture of an alcohol solvent with an ether solvent or with an aromatic solvent is contained therein.

If an organic solvent like this is contained therein, the photoresist film is not easily dissolved so that intermixing can be suppressed further, and therefore, film loss of the resist pattern can be suppressed further.

Alternatively, the present invention provides a patterning process, wherein at least, a photoresist film is formed on a wafer, and then on the photoresist film is formed a resist top coat by using the resist top coat composition, and then, after exposure, development of the photoresist film is performed.

A patterning process like this not only can reduce an effect from an environment to the resist film and shield an OOB light effectively, but also can reduce film loss of the resist pattern and bridging between patterns and expose the photoresist more sensitively.

Further, the exposure can be performed under vacuum.

According to the patterning process of the present invention, exposure can be performed not only in immersion but also under vacuum; and with this, exposure can also be performed by using an EUV and an electron beam (EB). In addition, when exposure is performed under vacuum, emission of an outgoing gas from the resist film can be suppressed by the resist top coat.

Alternatively, the exposure can be performed by using a light with a wavelength of 3 to 15 nm, or an electron beam.

According to the patterning process of the present invention, even if the OOB light is oscillated by exposure like this, the OOB light can be effectively shielded by the resist top coat; and thus, sensitization of the photoresist can be avoided so that a pattern of a high resolution can be obtained.

Further, in the development, it is preferable that development of the photoresist film by an alkaline developer and removal of the resist top coat are performed.

By doing so, the resist top coat can be removed more conveniently without additionally installing a removal equipment to the existing equipment. In addition, a process is simpler as compared with a top coat of a solvent removal type; and thus, increase of a processing cost can be minimized.

Alternatively, in formation of the photoresist film, it is preferable that the photoresist film having a base resin of a polymer having an average molecular weight of 1000 to 500000 and comprising repeating units a1 and a2 shown by the following general formula (2) and repeating units b1 and b2 shown by the following general formula (3) is formed on the wafer,

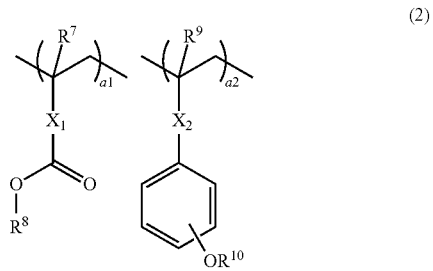

-continued

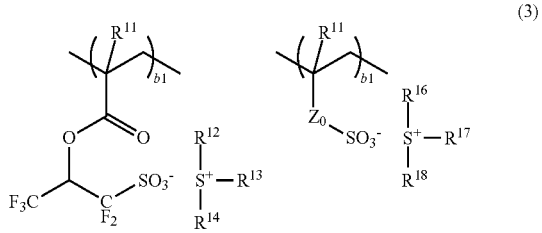

(3)

wherein each $R^7$ and $R^9$ independently represents a hydrogen atom or a methyl group; $R^8$ and $R^{10}$ represent an acid labile group; $X_1$ represents a connecting group having 1 to 14 carbon atoms and having any one, or two or more of a single bond, an ester group, a lactone ring, a phenylene group, and a naphthylene group; $X_2$ represents a single bond, an ester group, or an amide group; and in the general formula (3), each $R^{11}$ and $R^{15}$ independently represents a hydrogen atom, a fluorine atom, a methyl group, or a trifluoromethyl group; $R^{12}$, $R^{13}$, $R^{14}$, $R^{16}$, $R^{17}$, and $R^{18}$ represent the same or different linear, branched, or cyclic alkyl group having 1 to 12 carbon atoms and optionally containing a carbonyl group, an ester group, or an ether group, or an aryl group having 6 to 12 carbon atoms, an aralkyl group having 7 to 20 carbon atoms, or a thiophenyl group; $Z_0$ represents a single bond, a methylene group, an ethylene group, a phenylene group, a fluorinated phenylene group, —O—$R^{19}$—, or —C(=O)—$Z_1$—$R^{19}$—; $Z_1$ represents an oxygen atom or NH; $R^{19}$ represents a linear, a branched, or a cyclic alkylene group, a phenylene group, or an alkenylene group having 1 to 13 carbon atoms wherein these groups may optionally contain a carbonyl group, an ester group, an ether group, or a hydroxyl group, or may be optionally fluorine-substituted; and each repeating unit satisfies: $0 \le a1 \le 0.9$, $0 \le a2 \le 0.9$, $0 < a1+a2 < 1$, $0 \le b1 \le 0.3$, $0 \le b2 \le 0.3$, $0 < b1+b2 \le 0.3$, and $0 < a1+a2+b1+b2 \le 1$.

When a photoresist film is formed by using, as a photoresist composition, a polymer having an acid generator like this bound to a polymer main chain, edge roughness of the pattern after development can be made further smaller.

As explained above, the resist top coat composition of the present invention can reduce an environmental effect to the resist film so that head enlargement of the resist pattern due to an amine contamination in an air may be avoided; in addition, not only an OOB light can be effectively shielded, but also film loss of the resist pattern and bridging between the patterns can be reduced; and still in addition, resist sensitivity may be enhanced due to sensitization effect to the resist film. In addition, by addition of an acid generator and an amine quencher into the top coat composition, acid contrast in the resist top coat can be enhanced so that edge roughness in the resist pattern can be reduced, rectangularity of the resist pattern can be improved, and bridging between resist patterns can be avoided more surely. At the same time, generation of an outgoing gas from the resist film by exposure under vacuum can be suppressed. The resist top coat composition of the present invention is soluble in an alkaline developer; and thus, removal of the top coat can be performed simultaneously with development of the resist film. In addition, the resist film is not dissolved nor forms a mixing layer; and thus, there is no change in the resist form after development. Further, an out-of-band (OOB) light with a wavelength of 140 to 300 nm which is generated from an EUV laser and so forth is absorbed so that the photoresist may be protected from being sensitized.

DETAILED DESCRIPTION OF THE PREFERRED EMBODIMENTS

Figure 1:
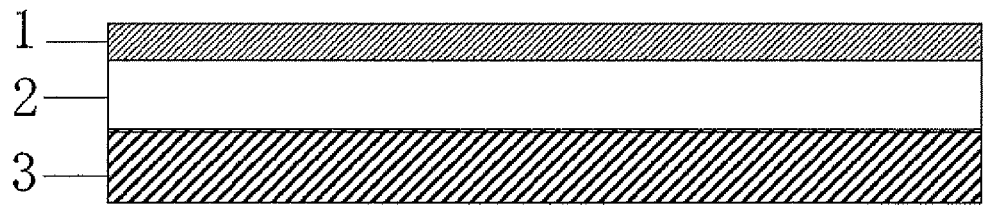
FIG. 1 is a cross section view of the wafer having a resist top coat of the present invention formed on a photoresist film.

Inventors of the present invention performed an extensive investigation to accomplish the object mentioned above, and as a result, found that to form a top coat as mentioned later was effective in reducing an effect from an environment to the resist film, in absorbing an OOB light, and in reducing film loss of the resist pattern and bridging between patterns. This top coat is soluble in an alkaline developer so that it can be simultaneously removed with development of the resist film, and in addition, a process is simpler as compared with a top coat of a solvent removal type; and thus, increase of a processing cost can be minimized.

Meanwhile, it is reported that, at 13.5 nm, a hydrogen atom, a carbon atom, a silicon atom, and a sulfur atom have small absorption, while an oxygen atom and a fluorine atom have large absorption. A fluorinated polymer described in the foregoing Patent Document 1 has large absorption at 13.5 nm. If a resist top coat has absorption, sensitivity of the resist film shifts to a lower sensitivity side. In the EUV lithography having a low laser power, lowered sensitivity of the resist is a problem. Accordingly, the resist top coat needs to be highly transparent. In addition, the foregoing fluorinated polymer is not soluble in an alkaline developer; and thus, a separate cup exclusively dedicated for removal of the resist top coat is necessary before development thereby leading to a cumbersome process. A top coat which can be removed simultaneously with development of the resist film is desirable; and thus, a material having an alkaline-soluble group is necessary in designing of the top coat composition. The top coat composition of the present invention which will be mentioned later satisfies such requirements.

As to the alkaline-soluble group, a carboxyl group, a phenol group, a sulfo group, a hexafluoroalcohol group, and so forth may be mentioned; but in view of transparency, a hexafluoroalcohol group has strong absorption due to 6 fluorine atoms, and thus, it is not desirable to use this as the alkaline soluble group of a top coat.

It is reported that a resist based on a polyhydroxy styrene has a high efficiency in generating an acid by exposure to EUV. Sensitivity is enhanced by a sensitization effect due to exposure to EUV, which causes energy transfer from a phenol group to an acid generator. Accordingly, to enhance the resist sensitivity, a resist based on a polyhydroxy styrene has been investigated.

A resist having an acid generator (PAG) bound to a polymer main chain has been proposed. Especially, if an acid generator of a sulfonium salt or an iodonium salt having a sulfonic acid bound to a polymer main chain is used, unsharpness due to acid diffusion can be suppressed by shortening of an acid diffusion distance; and thus, this is advantageous in fine patterning (Japanese Patent No. 4425776). A drawback of the resist having a bound PAG resides in its low sensitivity. Accordingly, enhancement of sensitivity is sought by copolymerizing thereof with a hydroxy styrene and so on which have a phenol group. However, copolymerization with a monomer having a phenol group, which enhances an alkaline-dissolution rate, causes film loss of a resist pattern, which is not desirable. As discussed above, development of a resist which is highly sensitive and low in film loss of a pattern after development is wanted.

In view of the above-mentioned, the present invention provides a resist top coat composition and a patterning process described below.

As shown in FIG. 1, a resist top coat composition of the present invention is to be used in a patterning process onto a photoresist film, wherein a resist top coat 1 is formed by using the resist top coat composition onto a photoresist film 2 formed on a wafer 3, and then, after exposure, removal of the resist top coat and development of the photoresist film are performed to effect the patterning on the photoresist film, wherein the resist top coat composition contains a truxene compound shown by the following general formula (1) which is formed of a hydrocarbon and contains an alkaline-soluble phenol group,

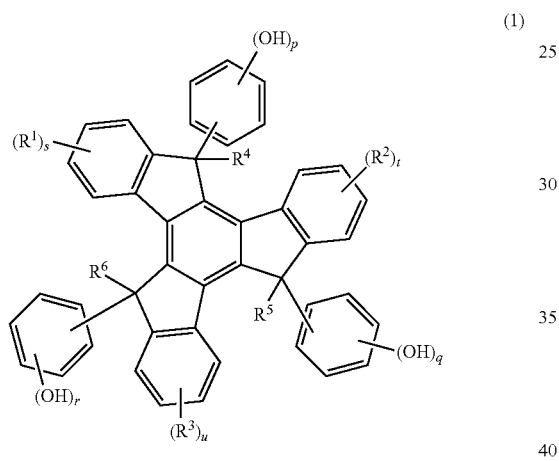

wherein $R^1$, $R^2$, and $R^3$ represent the same or different groups of a hydrogen atom; a hydroxyl group; a carboxyl group; a cyano group; a nitro group; an amino group; a halogen atom; or a linear, a branched, or a cyclic alkyl group, an alkoxy group, or an acyloxy group having 1 to 10 carbon atoms; each $R^4$, $R^5$, and $R^6$ represents a hydrogen atom, a hydroxyl group, or a substituted or an unsubstituted phenol group, or a naphthol group; p, q, and r represent an integer of 1 to 5; and s, t, and u represent an integer of 1 to 4.

In the general formula (1), $R^1$, $R^2$, and $R^3$ represent the same or different groups of a hydrogen atom; a hydroxyl group; a carboxyl group; a cyano group; a nitro group; an amino group; a halogen atom; a linear, a branched, or a cyclic alkyl group having 1 to 10 carbon atoms, or a linear, a branched, or a cyclic alkoxy group having 1 to 10 carbon atoms, a linear, a branched, or a cyclic acyloxy group having 1 to 10 carbon atoms.

Each $R^4$, $R^5$, and $R^6$ represents a hydrogen atom, a hydroxyl group, or a substituted or an unsubstituted phenol group or a substituted or an unsubstituted naphthol group. As illustrative examples of the substituted phenol and naphthol groups, a phenol and a naphthol group whose hydrogen atom is substituted with a methyl group and so forth may be mentioned.

p, q, and r represent an integer of 1 to 5; and s, t, and u represent an integer of 1 to 4.

Specific example of the truxene compound having a phenol group in the general formula (1) includes the compounds shown below.

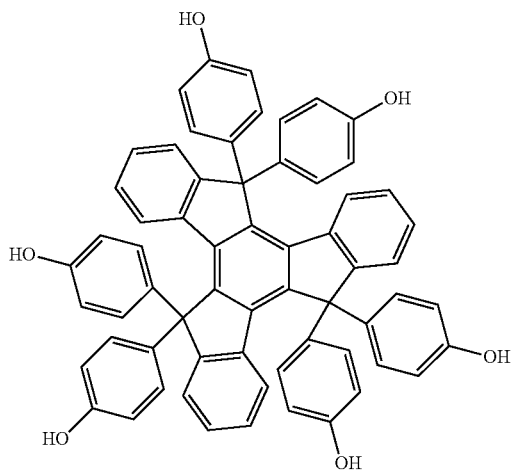

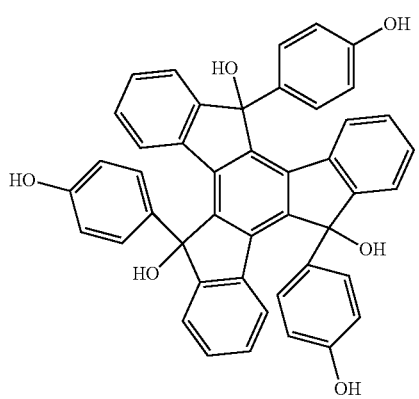

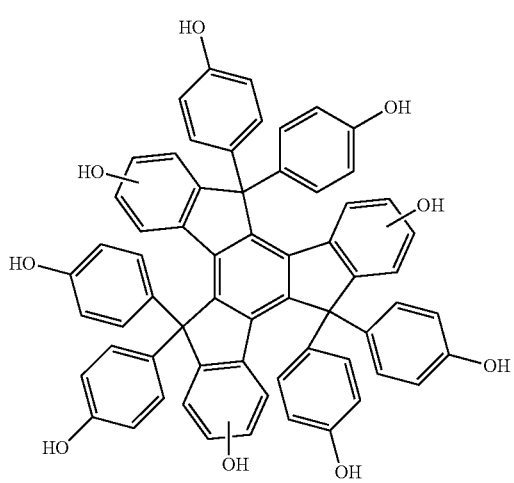

-continued
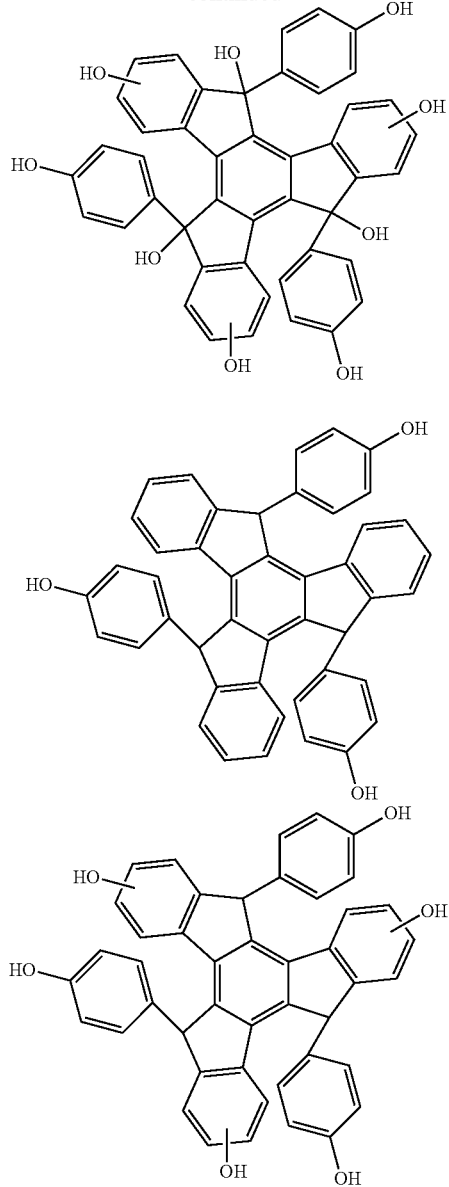
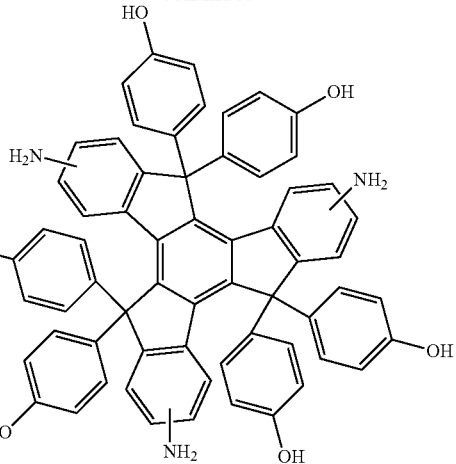
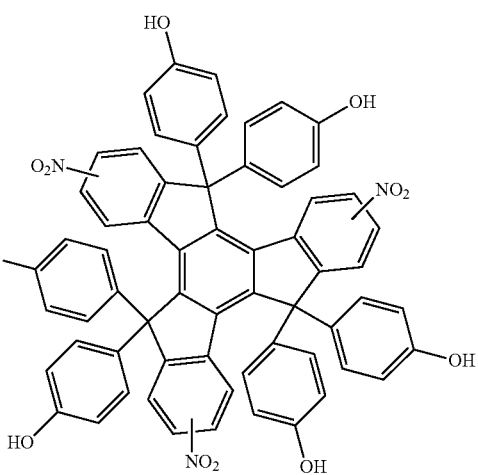
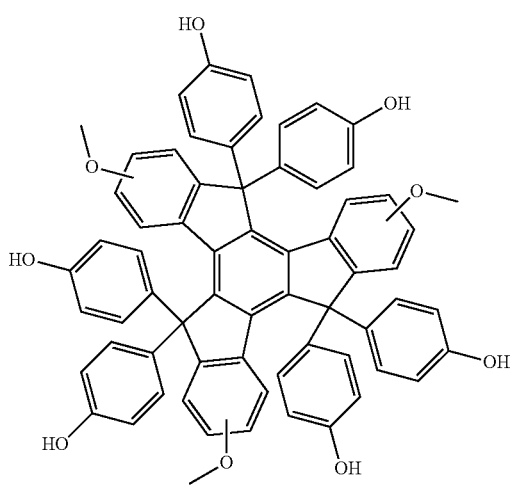
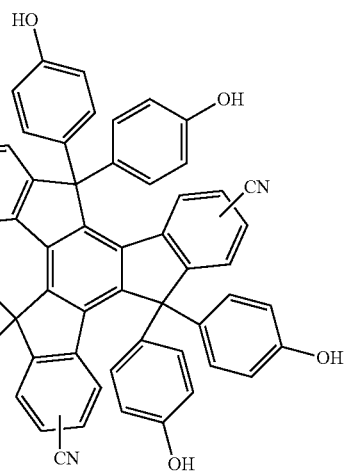

-continued

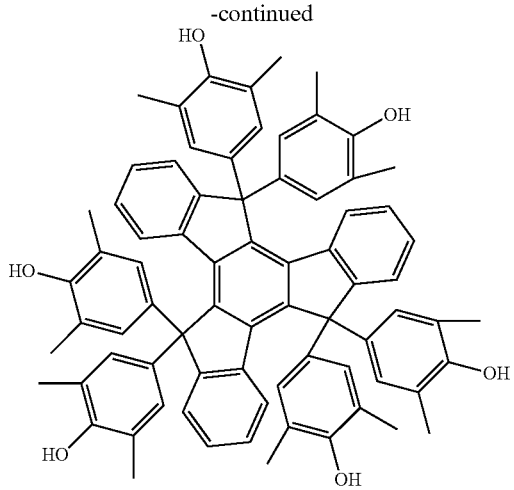

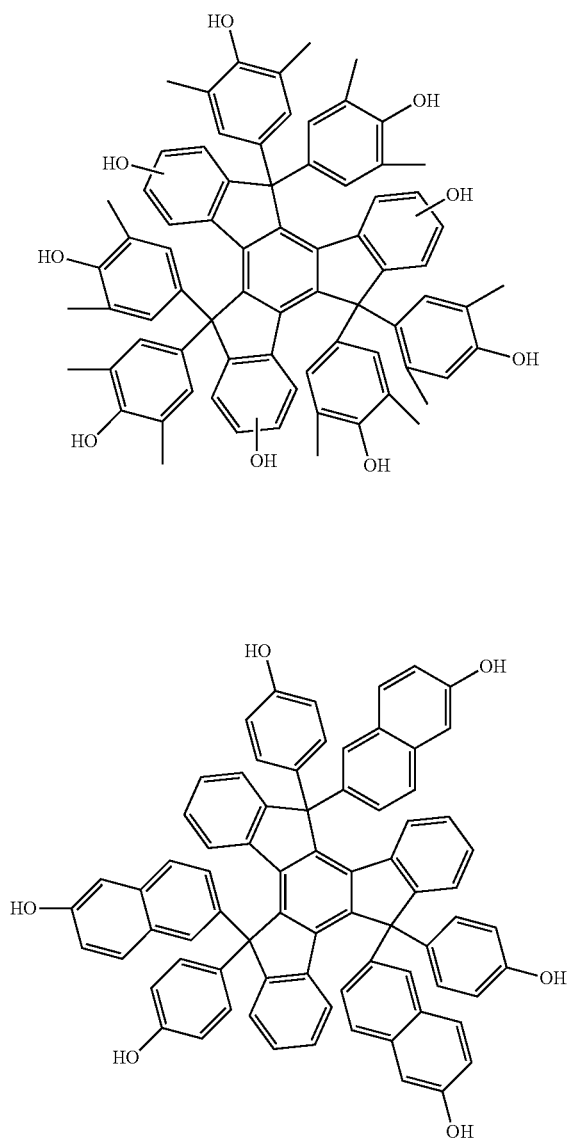

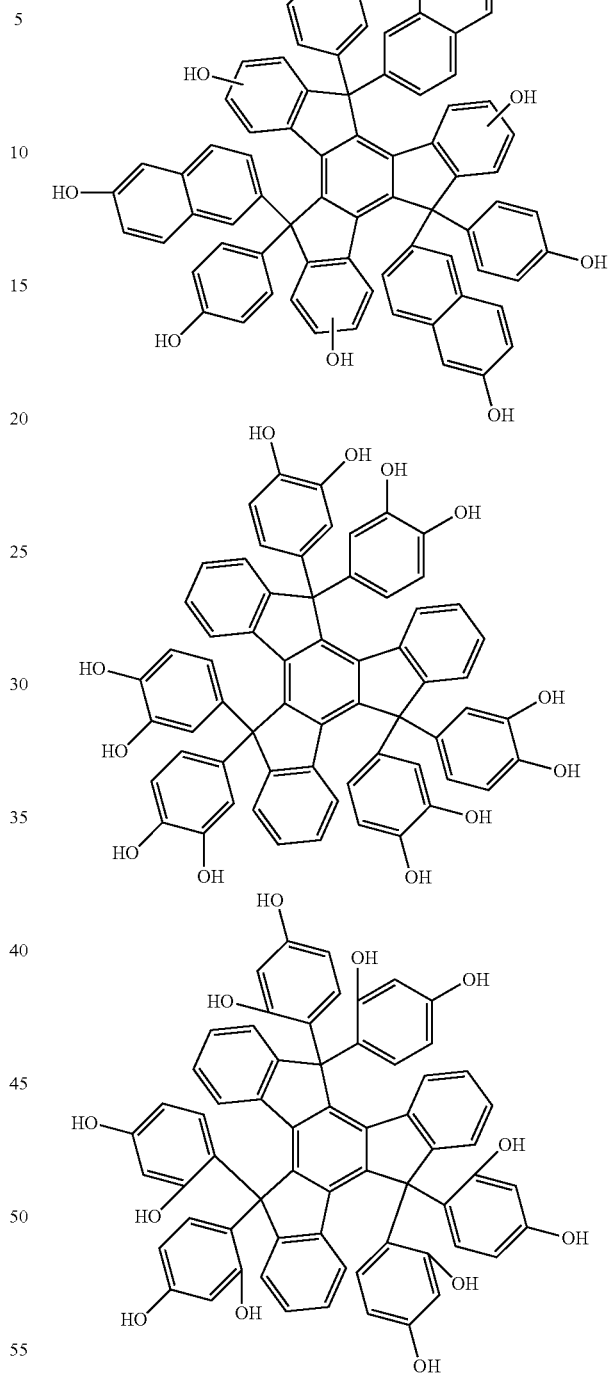

The resist top coat composition of the present invention is preferably soluble in an alkaline developer. If soluble in an alkaline developer, after the exposure, removal of the resist top coat and development of the photoresist film can be performed simultaneously; and thus, removal of the resist top coat can be performed more conveniently without additionally installing a removal equipment to an existing equipment.

By introduction of a phenol group to a truxene, the dissolution rate thereof into an aqueous alkaline developer is enhanced, and solubility thereof into an alcohol solvent having 4 or more carbon atoms is increased. An alcohol solvent having 4 or more carbon atoms has a characteristic that dissolution of the photoresist film thereinto becomes difficult. By using, in the top coat composition, a solvent not to dissolve the photoresist film, intermixing between the top coat and the resist film can be avoided. Because the photoresist film is hardly soluble in an ether solvent and an aromatic solvent; and thus, in view of avoiding the intermixing, these solvents are most preferably used in the top coat composition. However, a polyhydroxy styrene, a novolak resin, a calix resorcin, and so forth are hardly soluble in an ether solvent or an aromatic solvent. These are soluble in an alcohol solvent having 4 or more carbon atoms; but if the top coat is formed by using only the alcohol solvent having 4 or more carbon atoms, film loss occurs in the resist pattern after development.

A truxene bisphenol has high solubility in an ether solvent and an aromatic solvent. It is assumed that this effect comes from the hydroxyl groups facing to outside the molecule. On the other hand, a calixarene whose hydroxyl groups are facing to inside the molecule is not soluble in an ether solvent nor in an aromatic solvent.

Although a solvent to be used therein is not particularly restricted, a solvent not dissolving the photoresist film is preferable. Illustrative example of the solvent which dissolves the photoresist film includes those used for a resist solvent; a ketone such as cyclohexanone and methyl-2-n-amyl ketone; an alcohol such as 3-methoxybutanol, 3-methyl-3-methoxybutanol, 1-methoxy-2-propanol, and 1-ethoxy-2-propanol; an ether such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and an ester such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. However, it is preferable to use the solvents shown below rather than those shown above.

As to the organic solvent which can be contained in the resist top coat composition of the present invention is preferably a mixture of an alcohol solvent with an ether solvent or with an aromatic solvent. A solvent like this does not dissolve the photoresist film, so that the intermixing may be avoided thereby enabling to suppress film loss of the resist pattern further. As to specific example of the solvent like this, following higher alcohols having 4 or more carbon atoms may be mentioned: 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclopentanol, and cyclohexanol. Intermixing with the resist film can be avoided by adding, to the higher alcohol having 4 or more carbon atoms, an ether solvent such as diisopropyl ether, diisobutyl ether, diisopentyl ether, di-n-pentyl ether, methyl cyclopentyl ether, methyl cyclohexyl ether, di-n-butyl ether, di-sec-butyl ether, diisopentyl ether, di-sec-pentyl ether, di-t-amyl ether, and di-n-hexyl ether, or an aromatic solvent such as toluene, xylene, mesitylene, ethyl benzene, propyl benzene, butyl benzene, t-butyl benzene, and anisole. Ratio of the ether solvent or the aromatic solvent is preferably 50% or more, or more preferably 60% or more, relative to totality of the solvent.

The top coat composition used in the patterning process of the present invention may contain an acid generator, for example, a compound generating an acid by sensitization with an active beam or a radiation beam (photo acid generator). As to the photo acid generator, any compound may be used provided that it can generate an acid by exposure to a high energy beam. Illustrative example of the preferable photo acid generator includes an acid generator with a type of a sulfonium salt, an iodonium salt, a sulfonyl diazomethane, an N-sulfonyl oxyimide, and an oxime-O-sulfonate. These may be used singly, or as a mixture of two or more of them, as will be explained later.

Specific examples of the acid generator are described in the paragraphs [0122] to [0142] of the Japanese Patent Laid-Open Publication No. 2008-111103.

By adding the acid generator into the top coat composition, a bridging defect between the resist patterns after development can be reduced.

The top coat composition used in the patterning process of the present invention may contain an amine quencher. Specifically, they are described in the paragraphs of [0146] to [0164] of the Japanese Patent Laid-Open Publication No. 2008-111103. By adding the amine quencher, rectangularity of the resist pattern after development can be improved. By concurrent use of the acid generator and the amine quencher, LWR of the resist pattern can be lowered.

Into the top coat composition of the present invention may be added surfactants described in the paragraphs of [0165] to [0166] of the Japanese Patent Laid-Open Publication No. 2008-111103.

Blending amount of the surfactant is preferably 0.0001 to 10 parts by mass, especially 0.001 to 5 parts by mass, relative to 100 parts by mass of the top coat base material.

As to the photoresist used in the patterning process of the present invention, preferable is a chemically amplified positive resist which contains, as a base resin, a copolymer having the weight-average molecular weight of 1000 to 500000 and comprising a repeating unit a1 or a2 having a hydrogen atom of a carboxyl group or of a hydroxyl group in phenol group thereof substituted with an acid labile group as shown by the general formula (2) and a sulfonium salt-containing repeating unit b1 or b2 as shown by the general formula (3). A resist which contains, as a base, a polymer having an acid generator like this bound to a polymer main chain has a merit that edge roughness (LWR) after development is small.

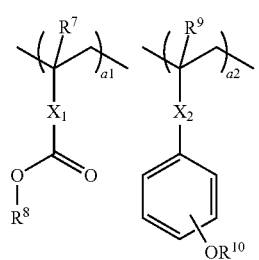

-continued

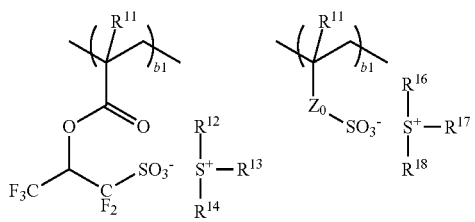
(3)

(In the general formula (2), each $R^7$ and $R^9$ independently represents a hydrogen atom or a methyl group; and $R^8$ and $R^{10}$ represent an acid labile group. $X_1$ represents a connecting group having 1 to 14 carbon atoms and having any one, or two or more of a single bond, an ester group, a lactone ring, a phenylene group, and a naphthylene group. $X_2$ represents a single bond, an ester group, or an amide group. In the general formula (3), each $R^{11}$ and $R^{15}$ independently represents a hydrogen atom, a fluorine atom, a methyl group, or a trifluoromethyl group; $R^{12}$, $R^{13}$, $R^{14}$, $R^{16}$, $R^{17}$, and $R^{18}$ represent the same or different linear, branched, or cyclic alkyl group having 1 to 12 carbon atoms and optionally containing a carbonyl group, an ester group, or an ether group, or an aryl group having 6 to 12 carbon atoms, an aralkyl group having 7 to 20 carbon atoms, or a thiophenyl group. $Z_0$ represents a single bond, a methylene group, an ethylene group, a phenylene group, a fluorinated phenylene group, —O—$R^{19}$—, or —C(=O)—$Z_1$—$R^{19}$—. $Z_1$ represents an oxygen atom or NH; and $R^{19}$ represents a linear, a branched, or a cyclic alkylene group, a phenylene group, or an alkenylene group having 1 to 13 carbon atoms wherein these groups may optionally contain a carbonyl group, an ester group, an ether group, or a hydroxyl group, or may optionally be fluorine-substituted. Each repeating unit satisfies; $0 \le a1 \le 0.9$, $0 \le a2 \le 0.9$, $0 < a1+a2 < 1$, $0 \le b1 \le 0.3$, $0 \le b2 \le 0.3$, $0 < b1+b2 \le 0.3$, and $0 < a1+a2+b1+b2 \le 1$.)

In the general formula (2), each $R^7$ and $R^9$ independently represents a hydrogen atom or a methyl group; and $R^8$ and $R^{10}$ represent an acid labile group mentioned below.

$X_1$ represents a connecting group having 1 to 14 carbon atoms and having any one, or two or more of a single bond, an ester group, a lactone ring, a phenylene group, and a naphthylene group. $X_2$ represents a single bond, an ester group, or an amide group.

In the general formula (3), each $R^{11}$ and $R^{15}$ independently represents a hydrogen atom, a fluorine atom, a methyl group, or a trifluoromethyl group. $R^{12}$, $R^{13}$, $R^{14}$, $R^{16}$, $R^{17}$, and $R^{18}$ represent the same or different linear, branched, or cyclic alkyl group having 1 to 12 carbon atoms and optionally containing a carbonyl group, an ester group, or an ether group, or an aryl group having 6 to 12 carbon atoms, an aralkyl group having 7 to 20 carbon atoms, or a thiophenyl group.

$Z_0$ represents a single bond, a methylene group, an ethylene group, a phenylene group, a fluorinated phenylene group, a group represented by —O—$R^{19}$—, or a group represented by —C(=O)—$Z_1$—$R^{19}$—. $Z_1$ represents an oxygen atom or NH; and $R^{19}$ represents a linear, a branched, or a cyclic alkylene group, a phenylene group, or an alkenylene group having 1 to 13 carbon atoms wherein these groups may optionally contain a carbonyl group, an ester group, an ether group, or a hydroxyl group, or may optionally be fluorine-substituted.

Among the repeating units contained in the polymer used in the present invention, the repeating unit a1 having an acid labile group shown by the general formula (2) is the repeating unit having a hydrogen atom of a carboxyl group, especially a hydrogen atom of a hydroxyl group of a (meth)acrylate, substituted with the acid labile group; and illustrative example of the monomer to obtain these units includes those monomers shown below,

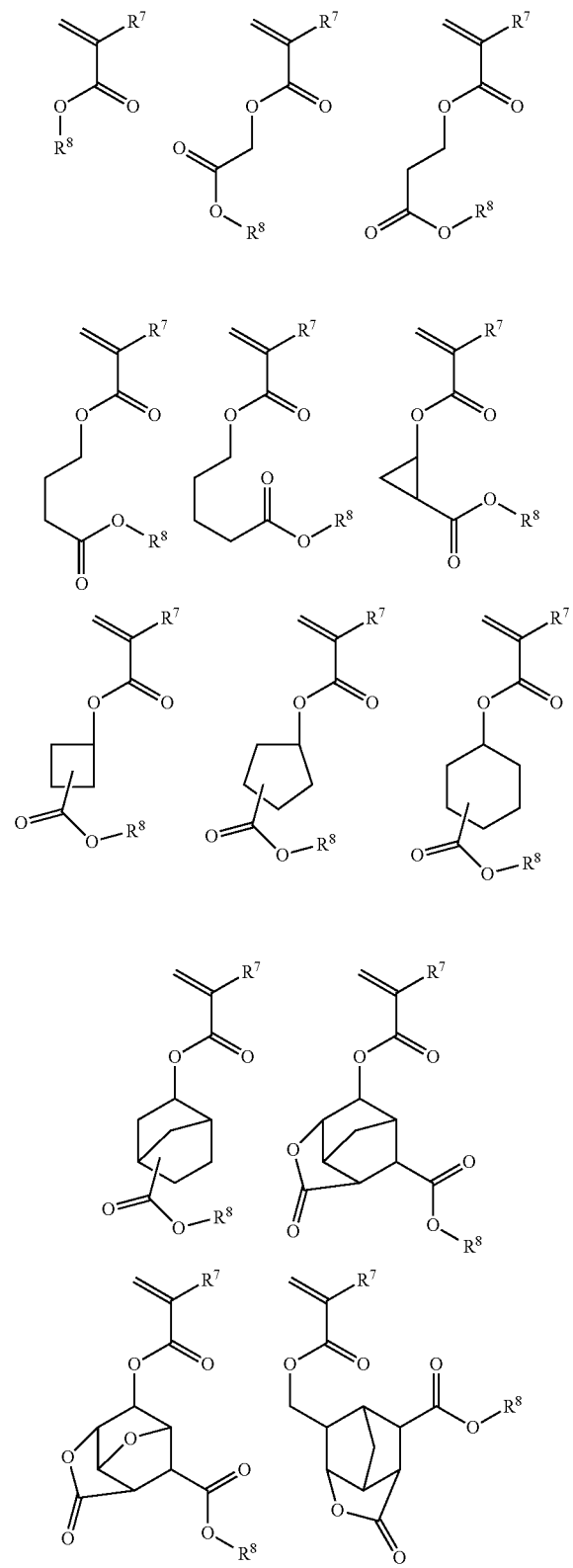

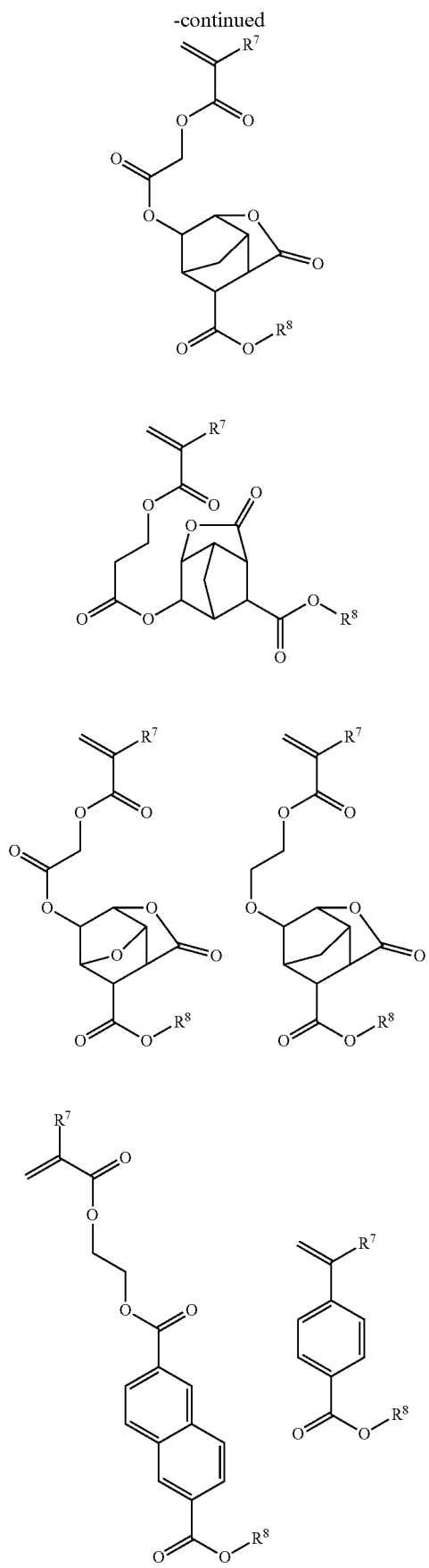

wherein $R^7$ and $R^8$ represent the same meanings as before.

The repeating unit a2 having an acid labile group shown by the general formula (2) is the repeating unit having a hydrogen atom of a phenolic hydroxyl group, preferably a hydroxyl group of a hydroxystyrene or a hydroxyphenyl (meth)acrylate, substituted with the acid labile group; and illustrative example of the monomer to obtain these units includes those monomers shown below,

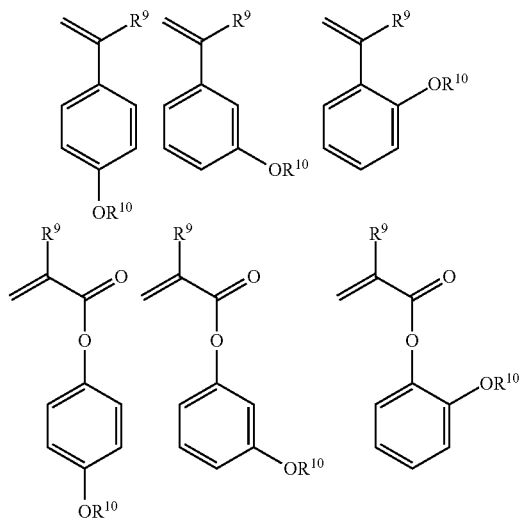

wherein $R^9$ and $R^{10}$ represent the same meanings as before.

Acid labile groups shown by $R^8$ and $R^{10}$ may be the same or different with each other and selected from many; especially, the groups substituted with following formulae (A-1) to (A-3) may be mentioned as the examples thereof.

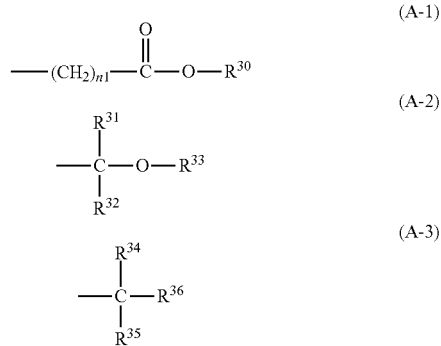

In the formula (A-1), $R^{30}$ represents a tertiary alkyl group having 4 to 20, or preferably 4 to 15 carbon atoms, a trialkylsilyl group with each alkyl group thereof having 1 to 6 carbon atoms, an oxoalkyl group having 4 to 20 carbon atoms, or a group shown by the general formula (A-3), wherein specific example of the tertiary alkyl group includes a tert-butyl group, a tert-amyl group, a 1,1-diethylpropyl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, and a 2-methyl-2-adamantyl group; specific example of the trialkylsilyl group includes a trimethylsilyl group, a triethylsilyl group, and a dimethyl tert-butylsilyl group; and specific example of the oxoalkyl group includes a 3-oxocyclohexyl group, a 4-methyl-2-oxooxane-4-yl group, and a 5-methyl-2-oxooxolane-5-yl group. n1 represents an integer of 0 to 6.

In the formula (A-2), $R^{31}$ and $R^{32}$ represent a hydrogen atom, or a linear, a branched, or a cyclic alkyl group having 1 to 18 or preferably 1 to 10 carbon atoms; and specific example thereof includes a methyl group, an ethyl group, a propyl group, an isopropyl group, a n-butyl group, a sec-butyl group, a tert-butyl group, a cyclopentyl group, a cyclohexyl group, a 2-ethylhexyl group, and a n-octyl group. $R^{33}$ represents a monovalent hydrocarbon group having 1 to 18, or preferably 1 to 10 carbon atoms and optionally having a heteroatom such as an oxygen atom, wherein illustrative example thereof includes a linear, a branched, or a cyclic alkyl group, or these groups whose hydrogen atoms are partially substituted with a group such as a hydroxyl group, an alkoxy group, an oxo group, an amino group, and an alkylamino group. Specific example thereof includes substituted alkyl groups and so on shown below.

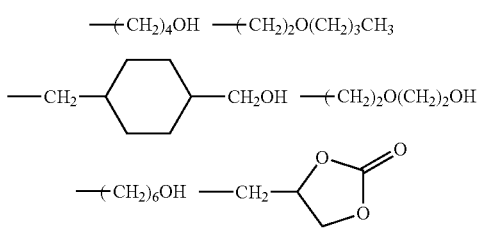

$R^{31}$ and $R^{32}$, $R^{31}$ and $R^{33}$, and $R^{32}$ and $R^{33}$ may be bonded with each other to form a ring together with the carbon atom to which these groups are bonded; and in the case of forming the ring, each of $R^{31}$, $R^{32}$ and $R^{33}$ which involve in ring-formation represents a linear or a branched alkylene group having 1 to 18 or preferably 1 to 10 carbon atoms with the number of carbons to form the ring being preferably 3 to 10 or especially 4 to 10.

Specific example of the acid labile group shown by the general formula (A-1) includes a tert-butoxycarbonyl group, a tert-butoxycarbonylmethyl group, a tert-amyloxycarbonyl group, a tert-amyloxycarbonylmethyl group, a 1,1-diethylpropyloxycarbonyl group, a 1,1-diethylpropyloxycarbonylmethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonylmethyl group, a 2-tetrahydropyranyloxycarbonylmethyl group, and a 2-tetrahydrofuranyloxycarbonylmethyl group.

In addition, substituent groups shown by the following formulae (A-1)-1 to (A-1)-10 may be mentioned.

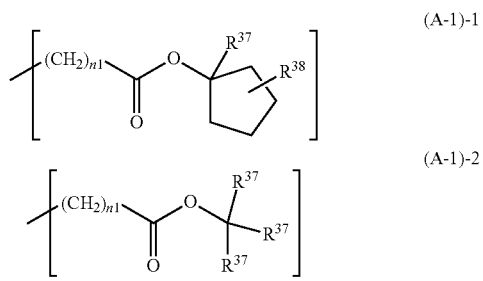

-continued

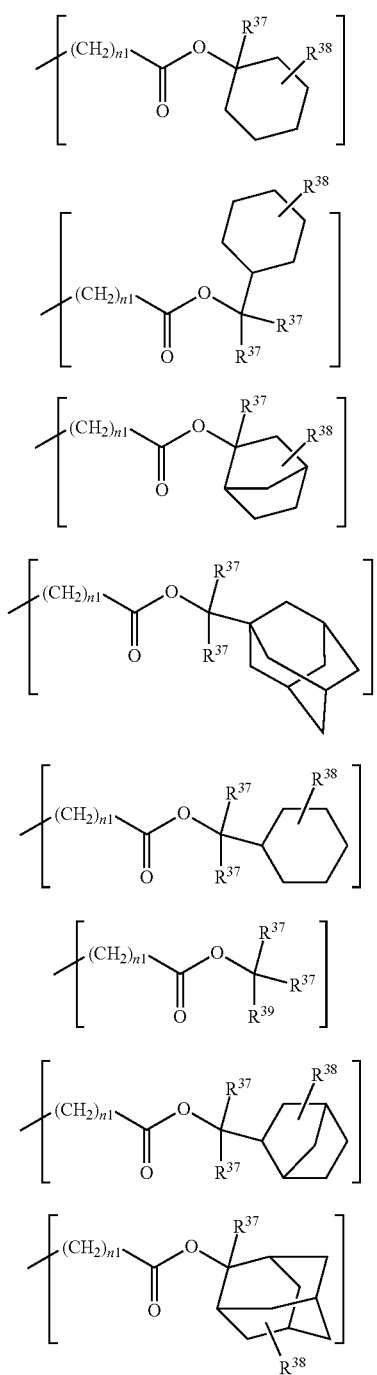

Here, each $R^{37}$ represents the same or different linear, branched, or cyclic alkyl group having 1 to 10 carbon atoms, or an aryl group having 6 to 20 carbon atoms; $R^{38}$ represents a hydrogen atom, or a liner, a branched, or a cyclic alkyl group having 1 to 10 carbon atoms. Each $R^{39}$ represents the same or different linear, branched, or cyclic alkyl group having 2 to 10 carbon atoms, or an aryl group having 6 to 20 carbon atoms. n1 represents the same as before.

Among the acid labile groups shown by the formula (A-2), illustrative example of the linear or the branched groups includes the following formulae (A-2)-1 to (A-2)-69.

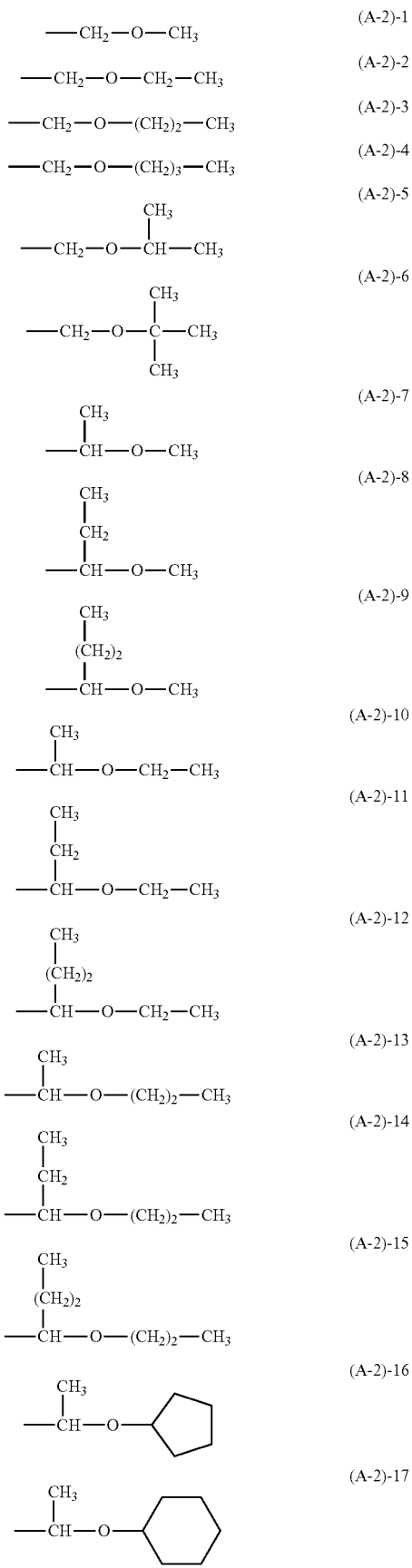

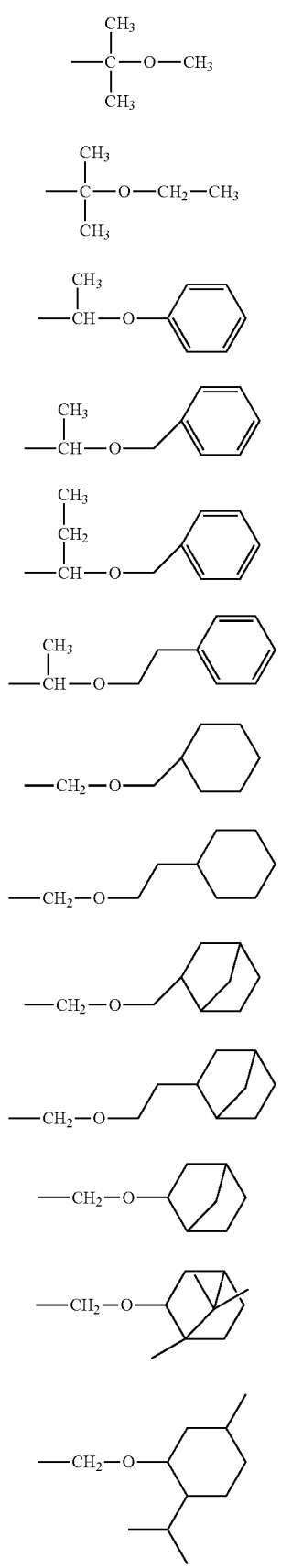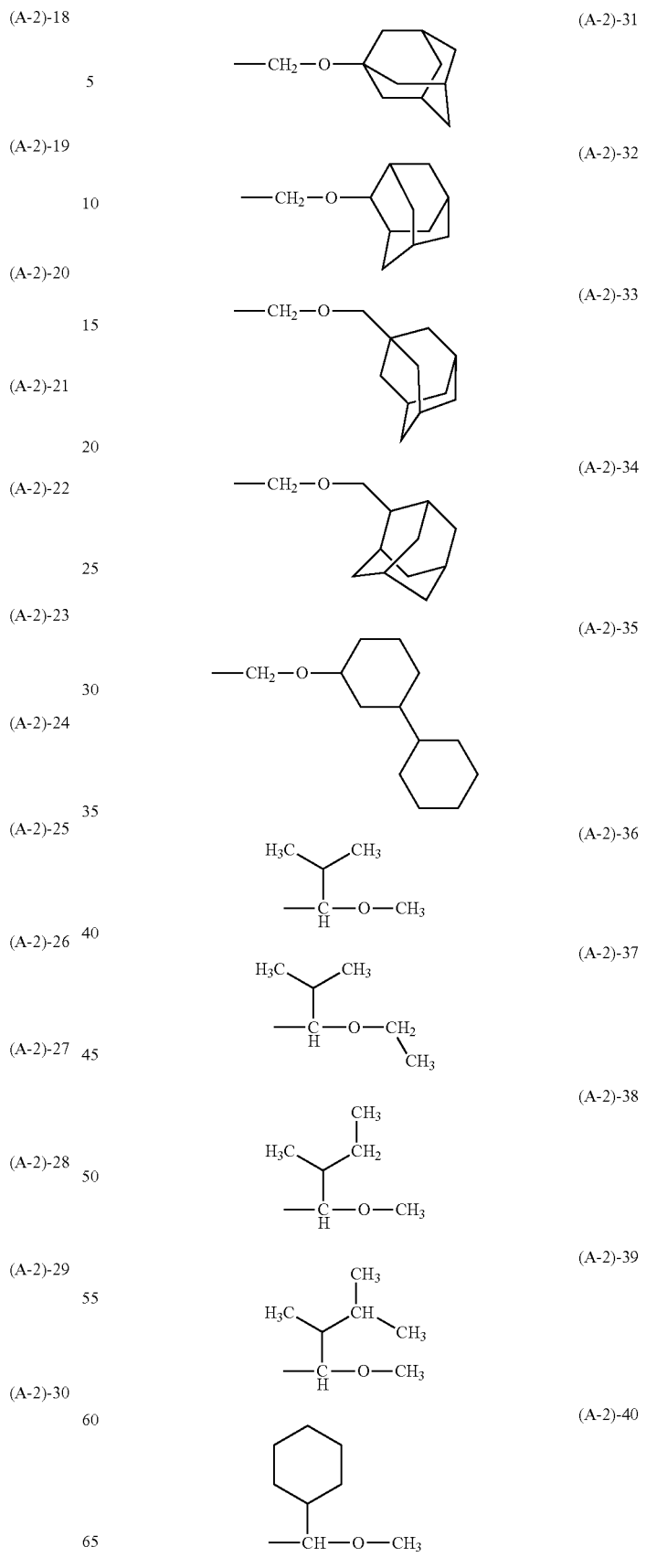

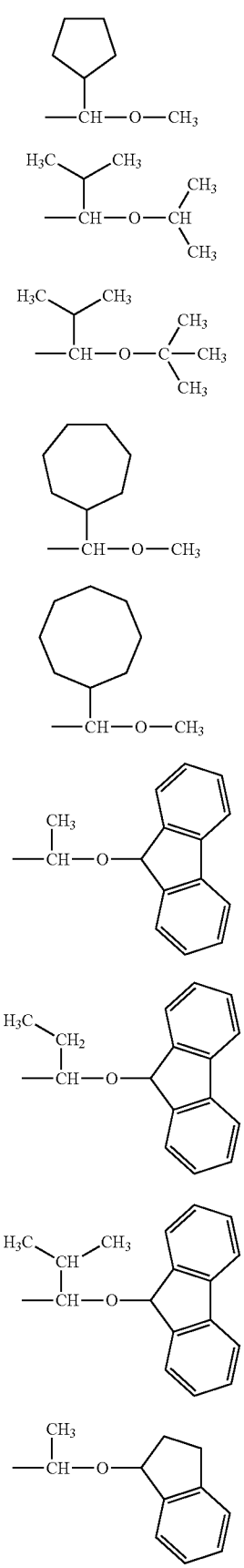
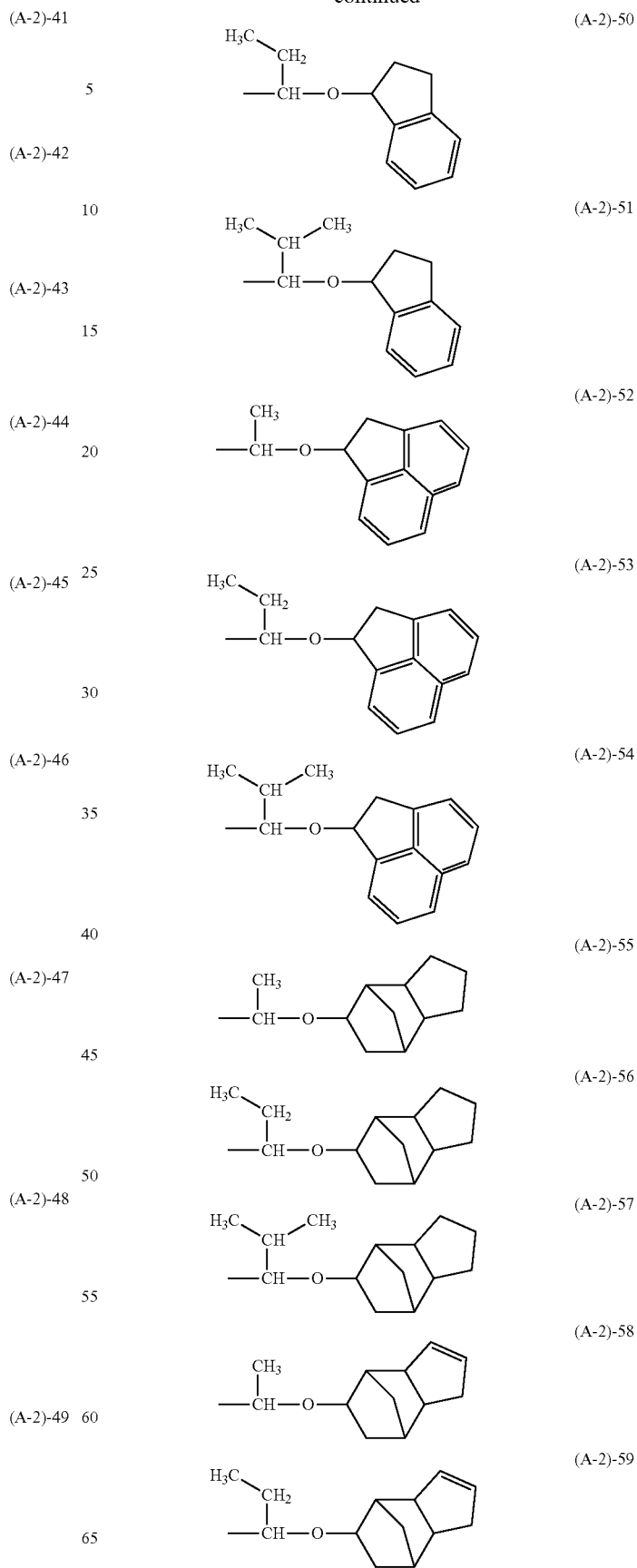

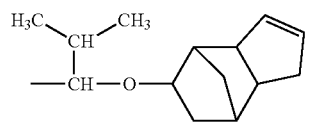
(A-2)-60

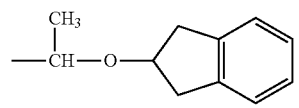
(A-2)-61

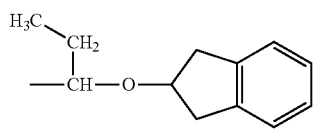
(A-2)-62

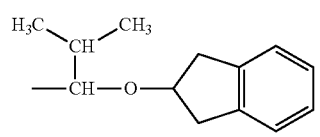
(A-2)-63

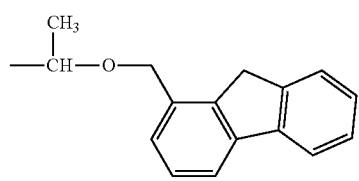
(A-2)-64

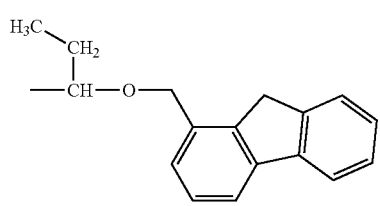
(A-2)-65

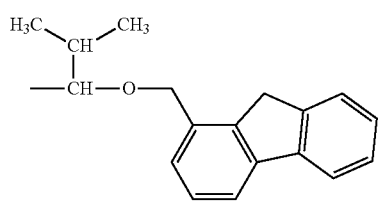
(A-2)-66

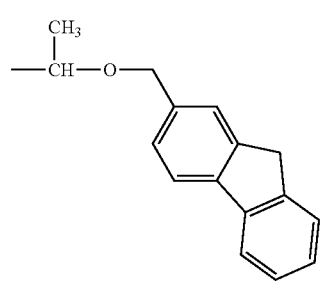
(A-2)-67

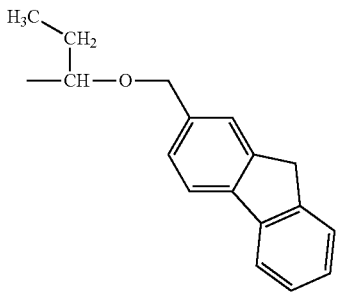
(A-2)-68

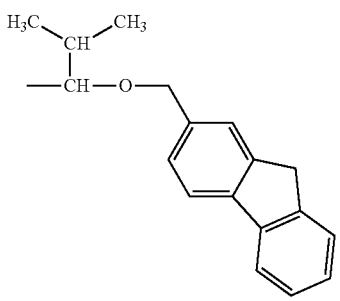
(A-2)-69

As to the cyclic group among the acid labile groups shown by the formula (A-2), a tetrahydrofuran-2-yl group, a 2-methyltetrahydrofuran-2-yl group, a tetrahydropyran-2-yl group, a 2-methyltetrahydropyran-2-yl group, and so on may be mentioned.

The polymer comprising repeating units a1, a2, b1, and b2, as the base resin, may be crosslinked intermolecularly or intramolecularly by the acid labile group shown by the following general formula (A-2a) or (A-2b).

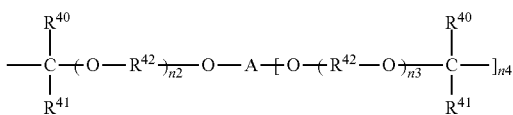
(A-2a)

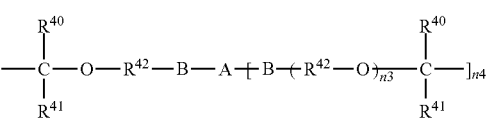
(A-2b)

Wherein $R^{40}$ and $R^{41}$ represent a hydrogen atom, or a linear, a branched, or a cyclic alkyl group having 1 to 8 carbon atoms. Alternatively, $R^{40}$ and $R^{41}$ may be bonded with each other to form a ring together with the carbon atom to which these groups are bonded; and in the case of forming the ring, $R^{40}$ and $R^{41}$ represent a linear or a branched alkylene group having 1 to 8 carbon atoms. $R^{42}$ represents a linear, a branched, or a cyclic alkylene group having 1 to 10 carbon atoms; n2 and n4 represent 0 or an integer of 1 to 10 or preferably 0 or an integer of 1 to 5; and n3 represents an integer of 1 to 7. A represents an aliphatic or an alicyclic saturated hydrocarbon group having 1 to 50 carbon atoms and the valency of (n3+1), or an aromatic hydrocarbon group, or a heterocyclic group, wherein these groups may be intervened with a heteroatom, or a part of hydrogen atoms bonded to the carbon group thereof may be substituted with a hydroxyl group, a carboxyl group, a carbonyl group, or a fluorine atom. B represents —CO—O—, —NHCO—O—, or —NH-CONH—.

In this case, A represents a linear, a branched, or a cyclic alkylene group, an alkyl triyl group, an alkyl tetrayl group having 1 to 20 carbon atoms with valency of preferably 2 to 4, or a arylene group having 6 to 30 carbon atoms, wherein these groups may be intervened with a heteroatom, and a part of hydrogen atoms bonded to the carbon atom thereof may be substituted with a hydroxyl group, a carboxyl group, an acyl group, or a halogen group. n3 represents an integer of preferably 1 to 3.

As to the crosslinking acetal group shown by the general formula (A-2a), following formulae (A-2a)-1 to (A-2a)-7 may be mentioned specifically.

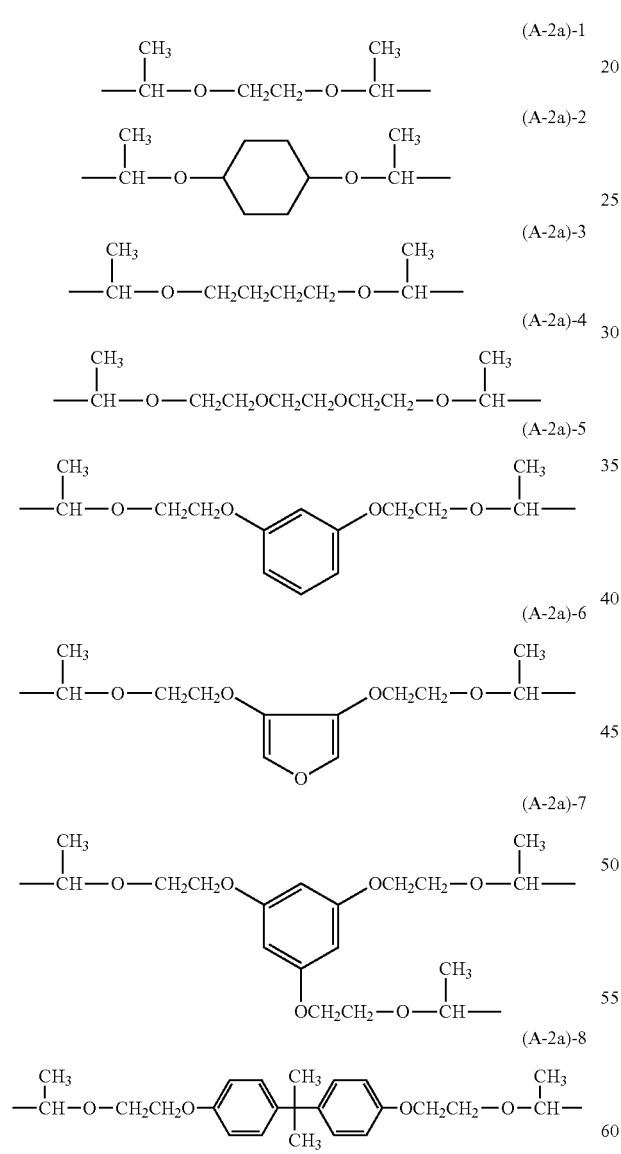

Then, $R^{34}$, $R^{35}$, and $R^{36}$ of the acid labile group shown by the formula (A-3) represent a linear, a branched, or a cyclic monovalent hydrocarbon group having 1 to 20 carbon atoms, or a linear, a branched, or a cyclic alkenyl group having 2 to 20 carbon atoms, wherein these groups may optionally contain a heteroatom such as an oxygen atom, a sulfur atom, a nitrogen atom, and a fluorine atom; and $R^{34}$ and $R^{35}$, $R^{34}$ and $R^{36}$, and $R^{35}$ and $R^{36}$ may be bonded with each other to form an alicyclic ring having 3 to 20 carbon atoms together with the carbon atom to which these groups are bonded.

As to the tertiary alkyl group of the acid labile group shown by the formula (A-3), a tert-butyl group, a triethylcarbyl group, a 1-ethylnorbornyl group, a 1-methylcyclohexyl group, a 1-ethylcyclopentyl group, a 2-(2-methyl)adamantly group, a 2-(2-ethyl)adamantly group, a tert-amyl group, and so on may be mentioned.

As to the tertiary alkyl group of the acid labile group shown by the formula (A-3), following formulae (A-3)-1 to (A-3)-18 may also be mentioned specifically.

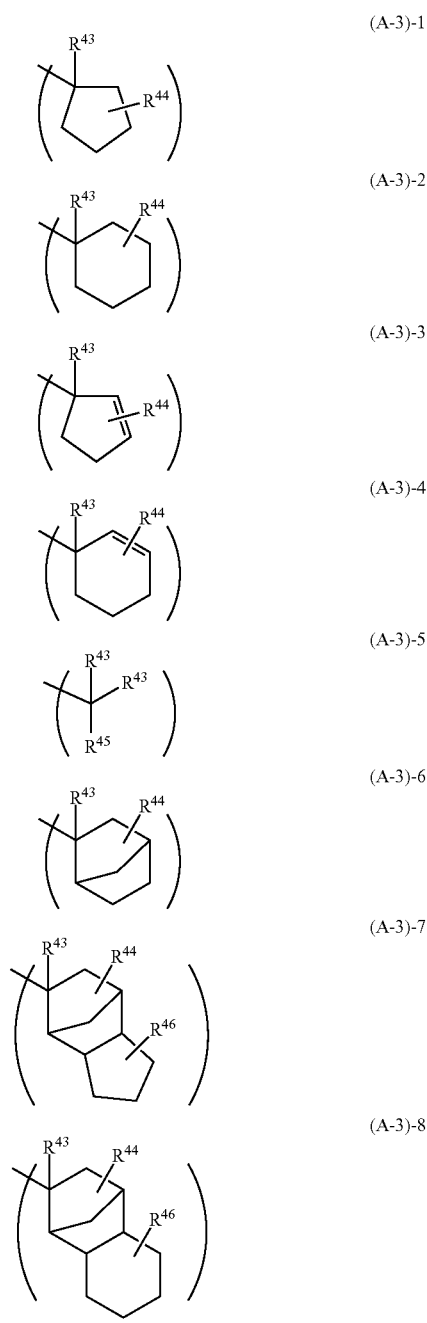

(A-3)-9 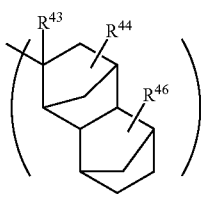

(A-3)-10 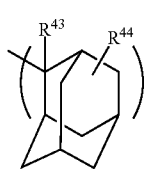

(A-3)-11 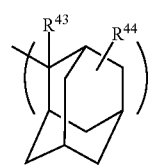

(A-3)-12 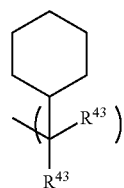

(A-3)-13 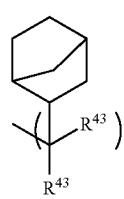

(A-3)-14 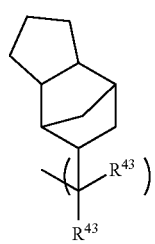

(A-3)-15 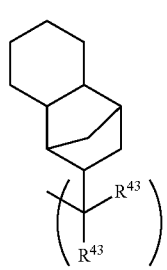

(A-3)-16 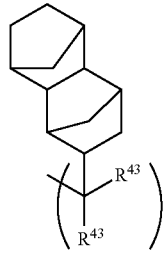

(A-3)-17 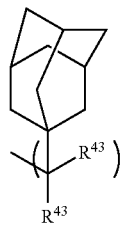

(A-3)-18 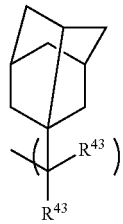

In the formulae (A-3)-1 to (A-3)-18, $R^{43}$ represents the same or different linear, branched, or cyclic alkyl group having 1 to 8 carbon atoms, or an aryl group having 6 to 20 carbon atoms such as a phenyl group. $R^{44}$ and $R^{46}$ represent a hydrogen atom, or a linear, a branched, or a cyclic alkyl group having 1 to 20 carbon atoms. $R^{45}$ represents an aryl group having 6 to 20 carbon atoms such as a phenyl group.

Further, the polymer comprising the repeating units of a1, a2, b1, and b2 may contain $R^{47}$ which is an alkylene group having valency of two or more or an arylene group, as shown by the formulae (A-3)-19 and (A-3)-20, whereby the polymer may be crosslinked intramolecularly or intermolecularly.

(A-3)-19 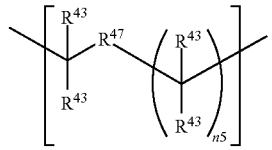

(A-3)-20 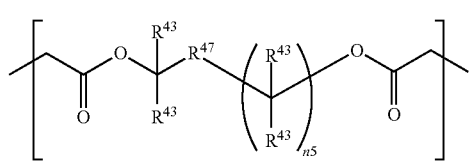

In the formulae (A-3)-19 and (A-3)-20, $R^{43}$ represents the same meaning as before; and $R^{47}$ represents a linear, a branched, or a cyclic alkylene group or an arylene group such as a phenylene group having 1 to 20 carbon atoms, wherein these groups may optionally contain a heteroatom such as an oxygen atom, a sulfur atom, and a nitrogen atom. n5 represents an integer of 1 to 3.

As to the repeating unit a1 having the acid labile group especially shown by the formula (A-3), a repeating unit of a (meth)acrylate ester shown by the following formula (A-3)-21 having an exo-structure may be mentioned preferentially.

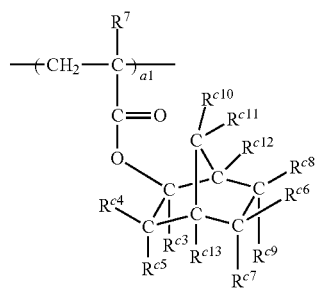

(A-3)-21 wherein $R^7$ represents the same meaning as before. $R^{c3}$ represents a linear, a branched, or a cyclic alkyl group having 1 to 8 carbon atoms, or an optionally substituted aryl group having 6 to 20 carbon atoms. Each $R^{c4}$ to $R^{c3}$, $R^{c12}$, and $R^{c13}$ independently represents a hydrogen atom, or a monovalent hydrocarbon group having 1 to 15 carbon atoms and optionally containing a heteroatom; and $R^{c10}$ and $R^{c11}$ represent a hydrogen atom, or a monovalent hydrocarbon group having 1 to 3 carbon atoms and optionally containing a heteroatom. Alternatively, $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$ may form a ring with each other, and in this case, they represent a divalent hydrocarbon group having 1 to 15 carbon atoms and optionally containing a heteroatom. In addition, $R^{c4}$ and $R^{c13}$, $R^{c10}$ and $R^{c13}$, or $R^{c6}$ and $R^{c8}$ may form a double bond by directly bonding with each other which are bonded to neighboring carbon atoms. Meanwhile, this formula also represents enantiomers thereof.

Meanwhile, an ester monomer to obtain a repeating unit a1 having the exo structure shown by the general formula (A-3)-21 is described in the Japanese Patent Laid-Open Publication No. 2000-327633. Specific example thereof includes the followings though not limited to them.

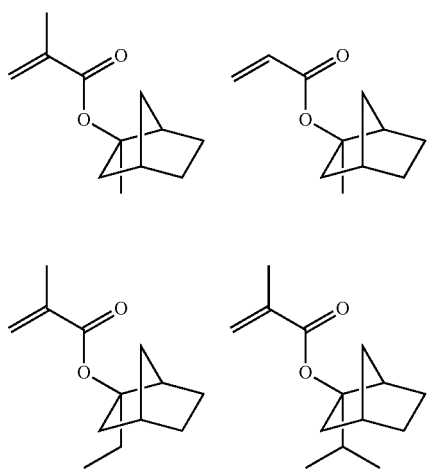

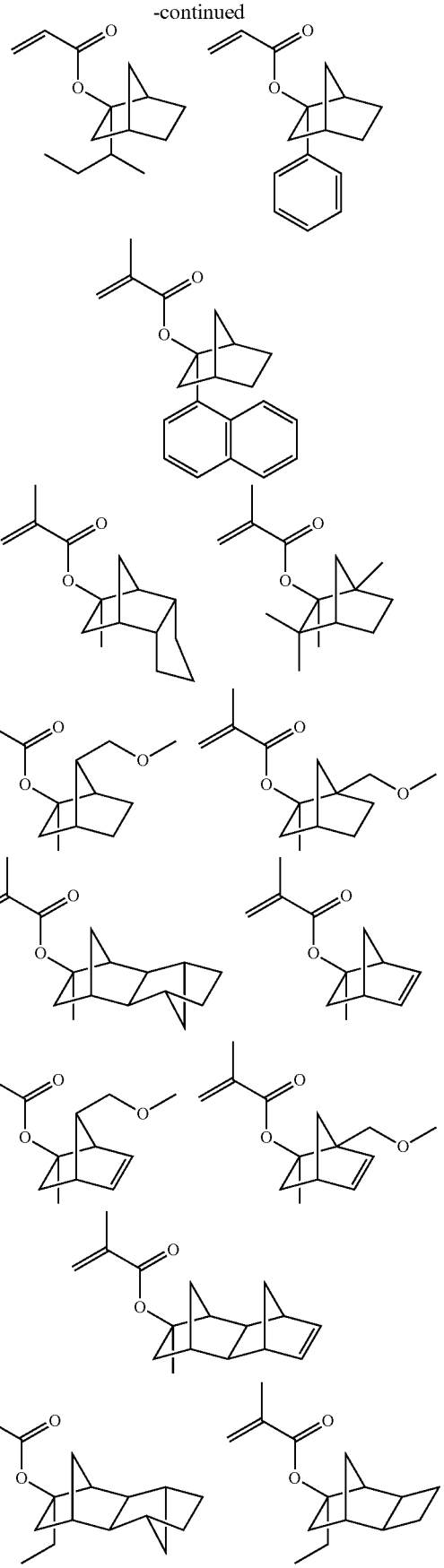

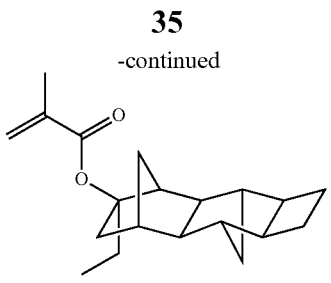

As to the repeating unit a1 having an acid labile group shown by the formula (A-3), an acid labile group of a (meth) acrylate ester having a furan diyl group, a tetrahydrofuran diyl group, or an oxanorbornane diyl group, shown by the following general formula (A-3)-22, may be mentioned.

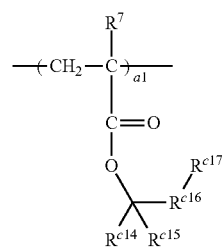

(A-3)-22 wherein $R^7$ represents the same meaning as before. Each of $R^{c14}$ and $R^{c15}$ independently represents a linear, a branched, or a cyclic monovalent hydrocarbon group having 1 to 10 carbon atoms. Alternatively, $R^{c14}$ and $R^{c15}$ may be bonded with each other to form an aliphatic hydrocarbon ring together with the carbon atom to which these groups are bonded. $R^{c16}$ represents a divalent group selected from a furan diyl group, a tetrahydrofuran diyl group, and an oxanorbornane diyl group. $R^{c17}$ represents a hydrogen atom, or a linear, a branched, or a cyclic monovalent hydrocarbon group having 1 to 10 carbon atoms and optionally containing a heteroatom.

Illustrative example of the monomer to obtain a repeating unit a1 which is substituted with an acid labile group having a furan diyl group, a tetrahydrofuran diyl group, or an oxanorbornane diyl group includes the followings. Here, Ac means an acetyl group and Me means a methyl group.

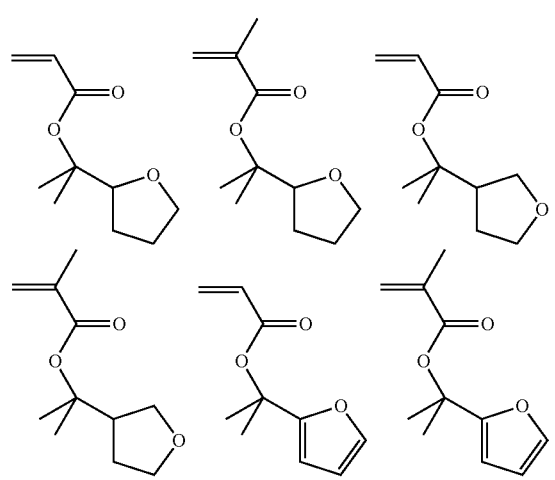

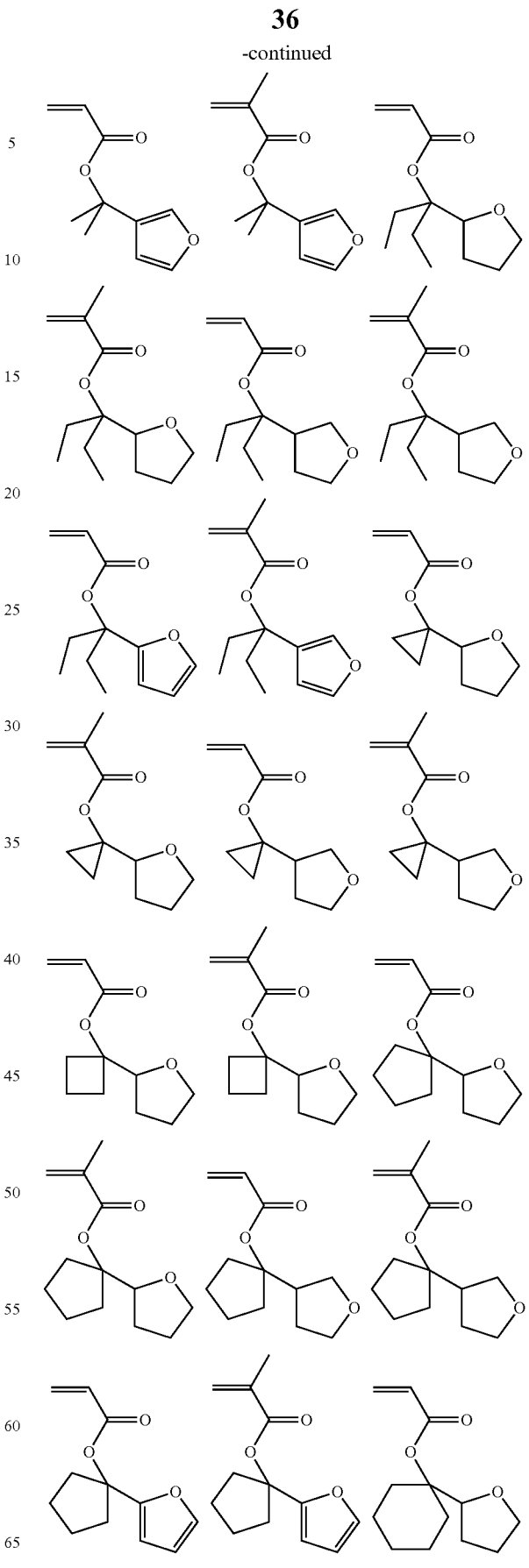

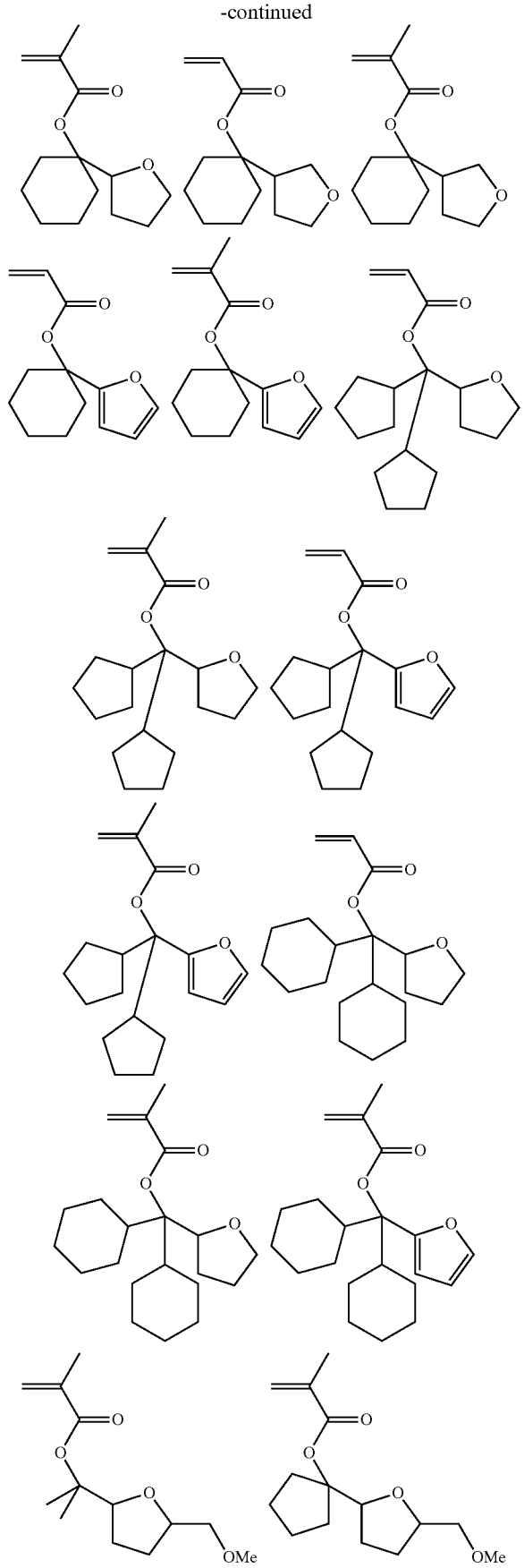
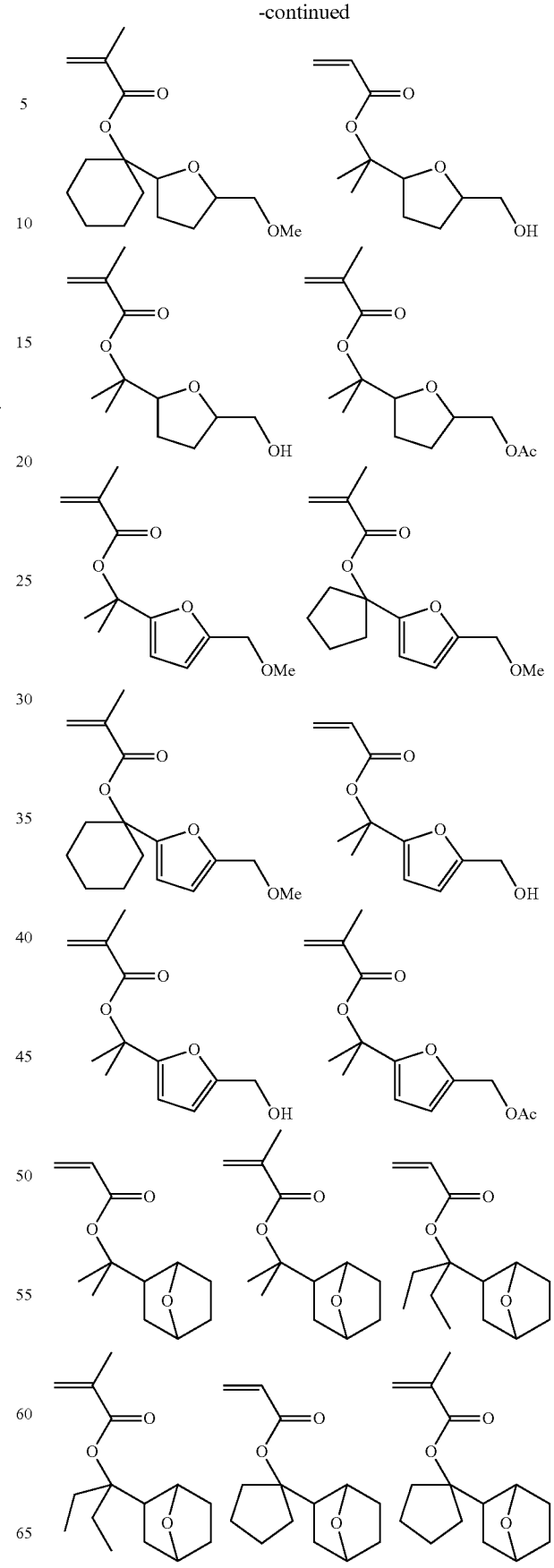

-continued
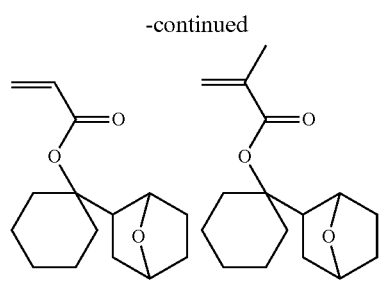
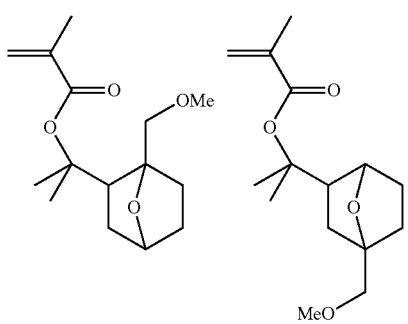
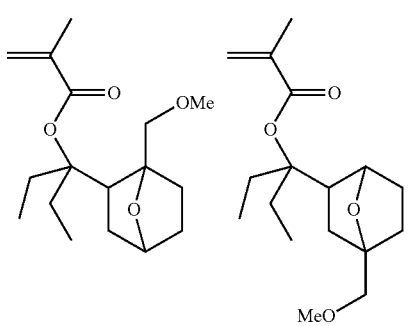
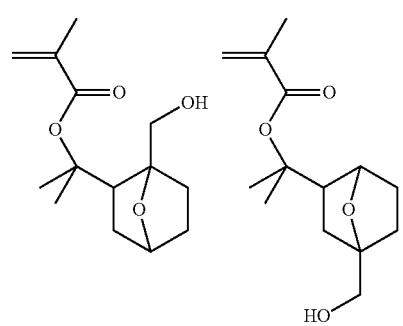
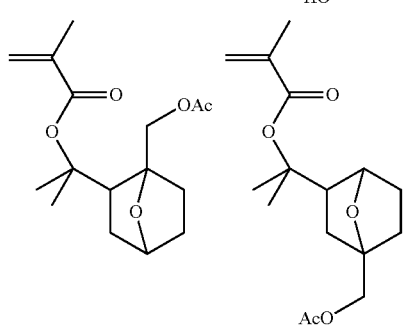
-continued
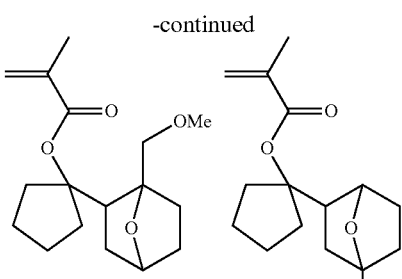
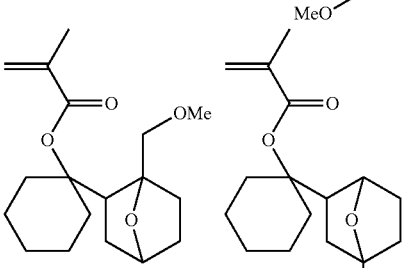
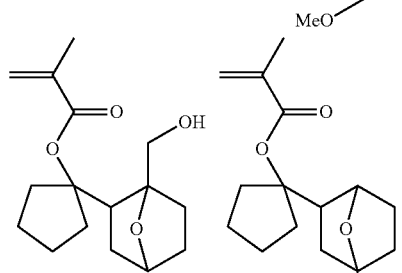
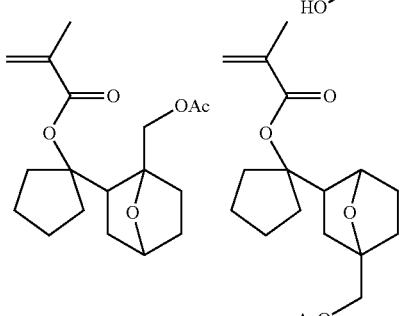
A hydrogen atom of the carboxyl group in the repeating unit a1 may be substituted with an acid labile group shown by the following general formula (A-4)-23,
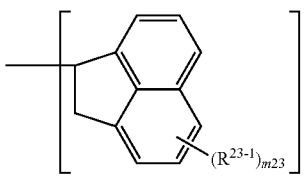
(A-4)-23
wherein $R^{23-1}$ represents a hydrogen atom, or an alkyl group having 1 to 4 carbon atoms, an alkoxy group, an alkanoyl group, or an alkoxycarbonyl group, an aryl group having 6 to 10 carbon atoms, a halogen atom, or a cyano group. m23 represents an integer of 1 to 4.
Specific example of the monomer having a carboxyl group thereof substituted with an acid labile group shown by the formula (A-4)-23 includes the followings.
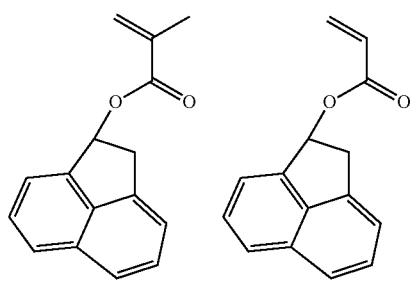
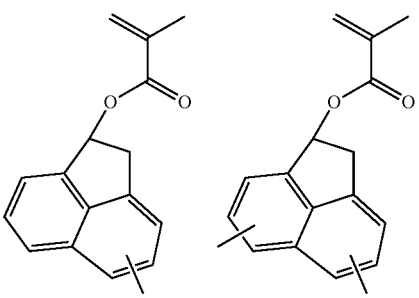
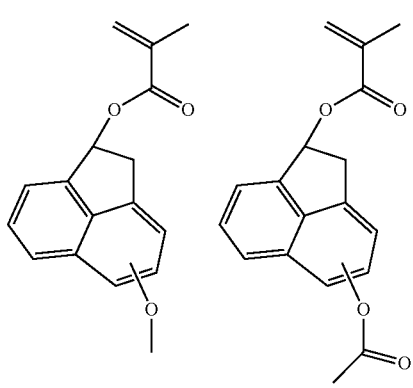
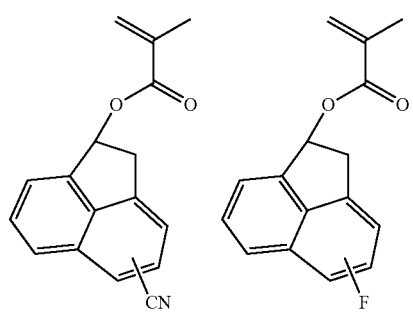
-continued
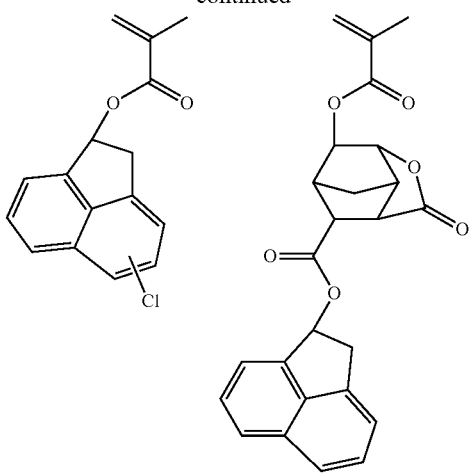
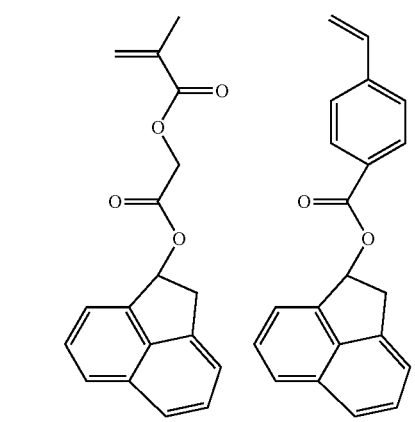
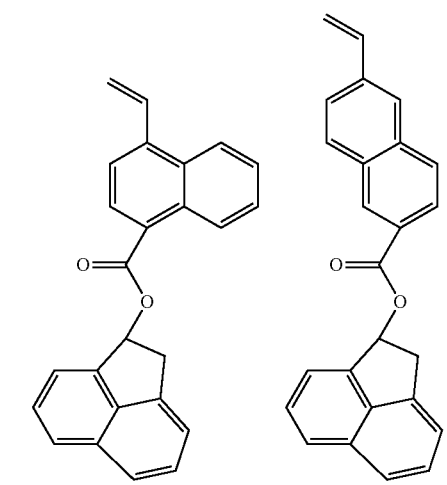

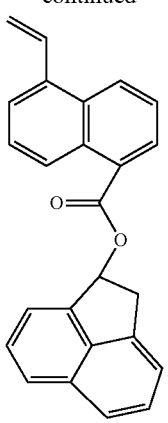

Alternatively, a hydrogen atom of the carboxyl group in the repeating unit a1 may be substituted with an acid labile group shown by the following general formula (A-4)-24,

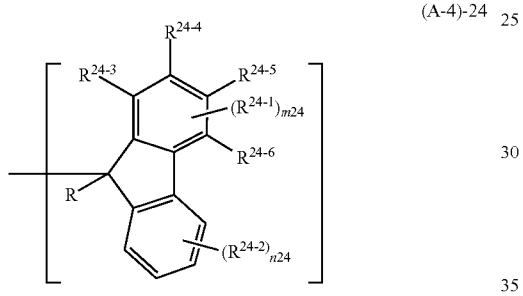

(A-4)-24 wherein $R^{24-1}$ and $R^{24-2}$ represent a hydrogen atom, an alkyl group having 1 to 7 carbon atoms, an alkoxy group, an alkanoyl group, an alkoxycarbonyl group, a hydroxyl group, an aryl group having 6 to 10 carbon atoms, a halogen atom, or a cyano group. R represents a hydrogen atom, a linear, a branched, or a cyclic alkyl group having 1 to 12 carbon atoms, an alkenyl group having 2 to 12 carbon atoms, an alkynyl group having 2 to 12 carbon atoms, or an aryl group having 6 to 10 carbon atoms, wherein these groups may optionally contain an oxygen atom or a sulfur atom. $R^{24-3}$, $R^{24-4}$, $R^{24-5}$, and $R^{24-6}$ represent a hydrogen atom, or alternatively, $R^{24-3}$ and $R^{24-4}$, $R^{24-4}$ and $R^{24-5}$, and $R^{24-5}$ and $R^{24-6}$ may be bonded to form a benzene ring. m24 and n24 represent an integer of 1 to 4.

Specific example of the monomer having a carboxyl group thereof substituted with an acid labile group shown by the formula (A-4)-24 includes the followings.

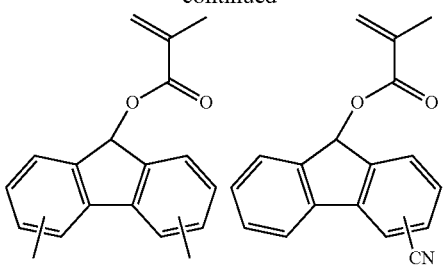

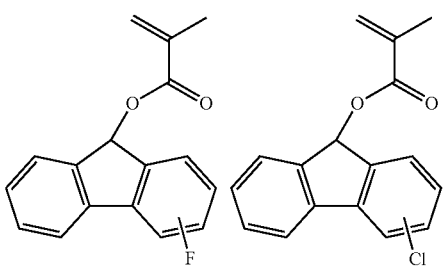

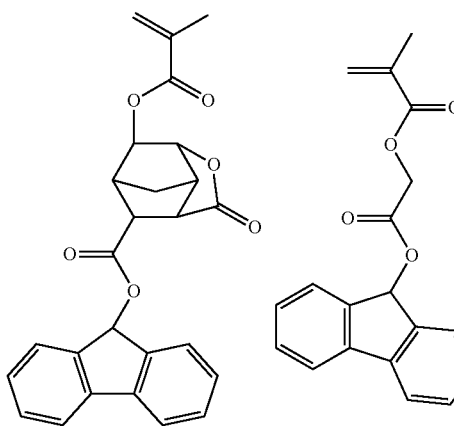

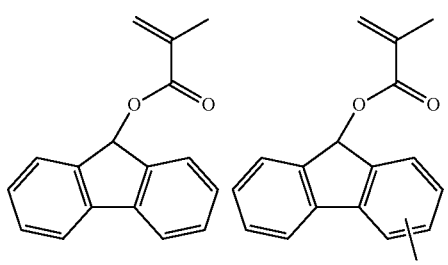

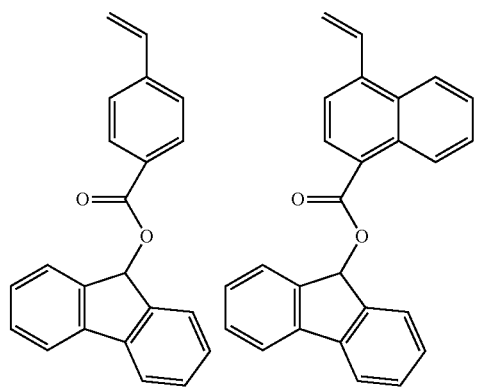

45
-continued
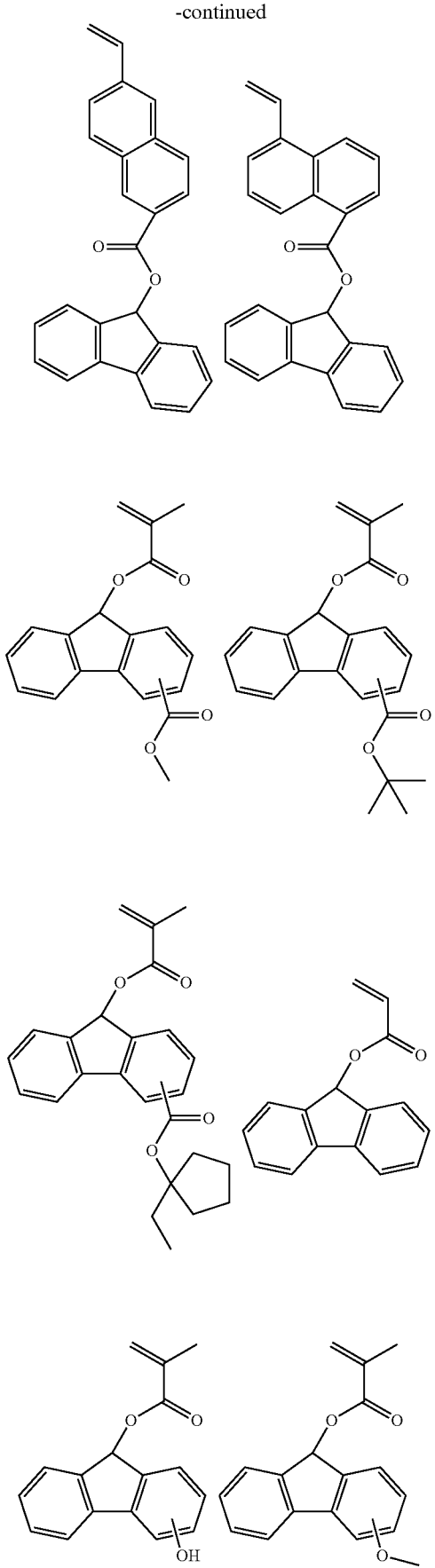
46
-continued
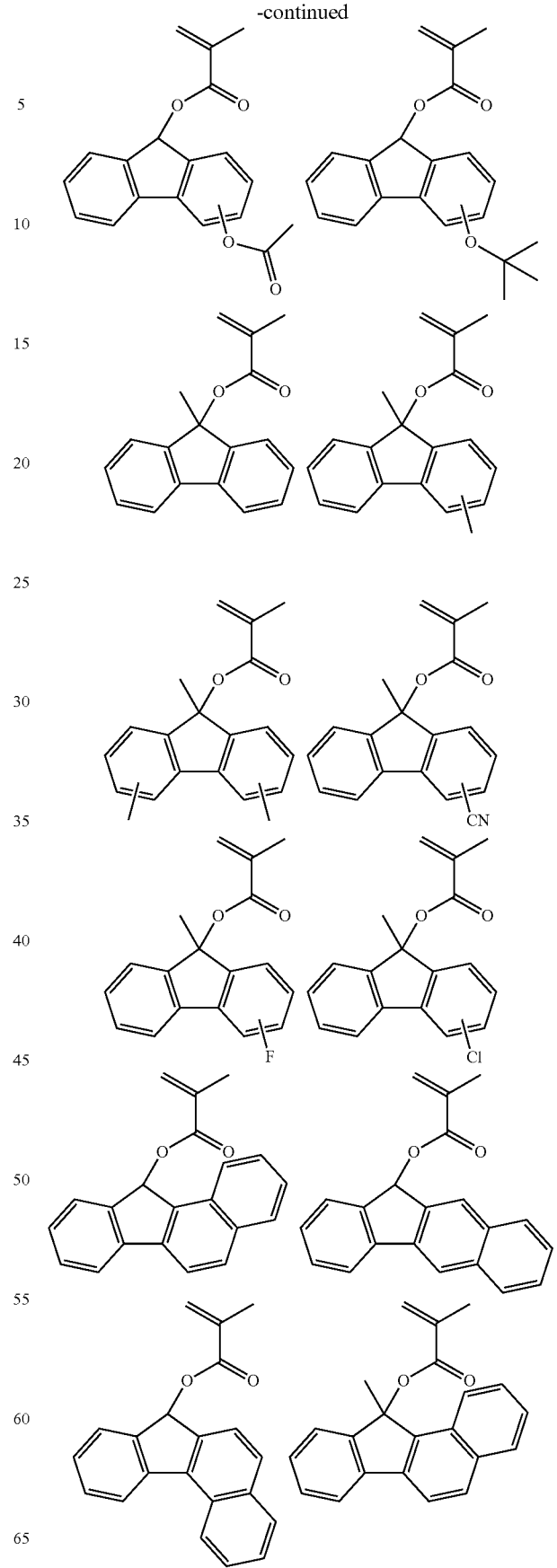

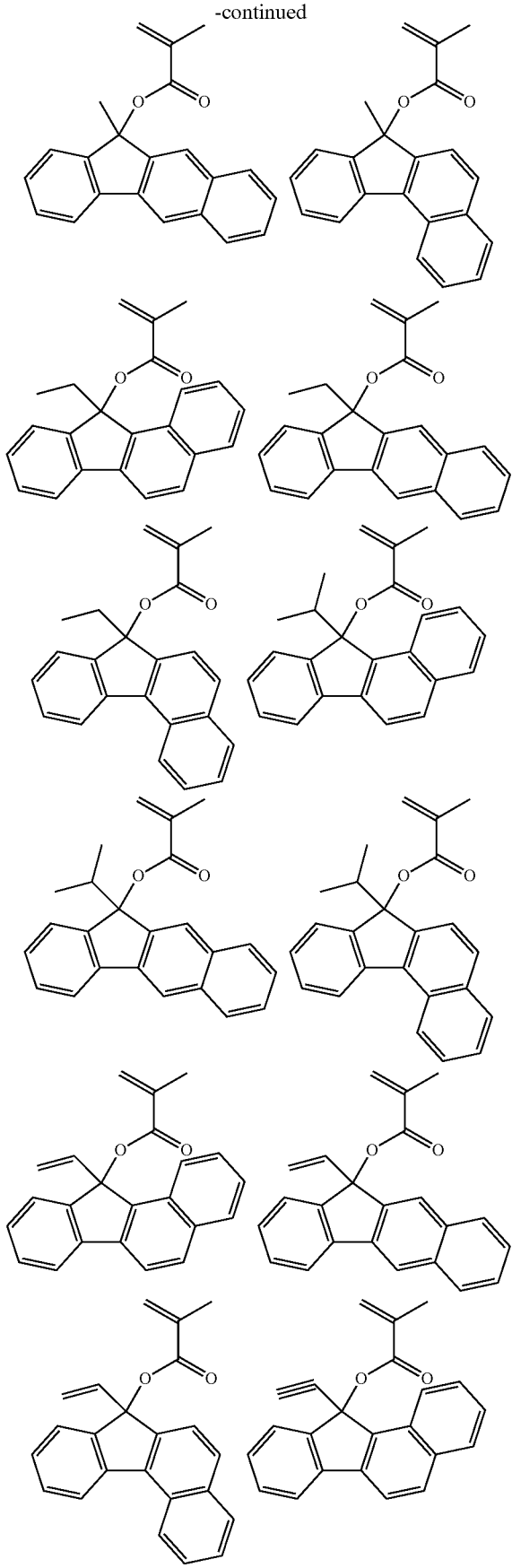
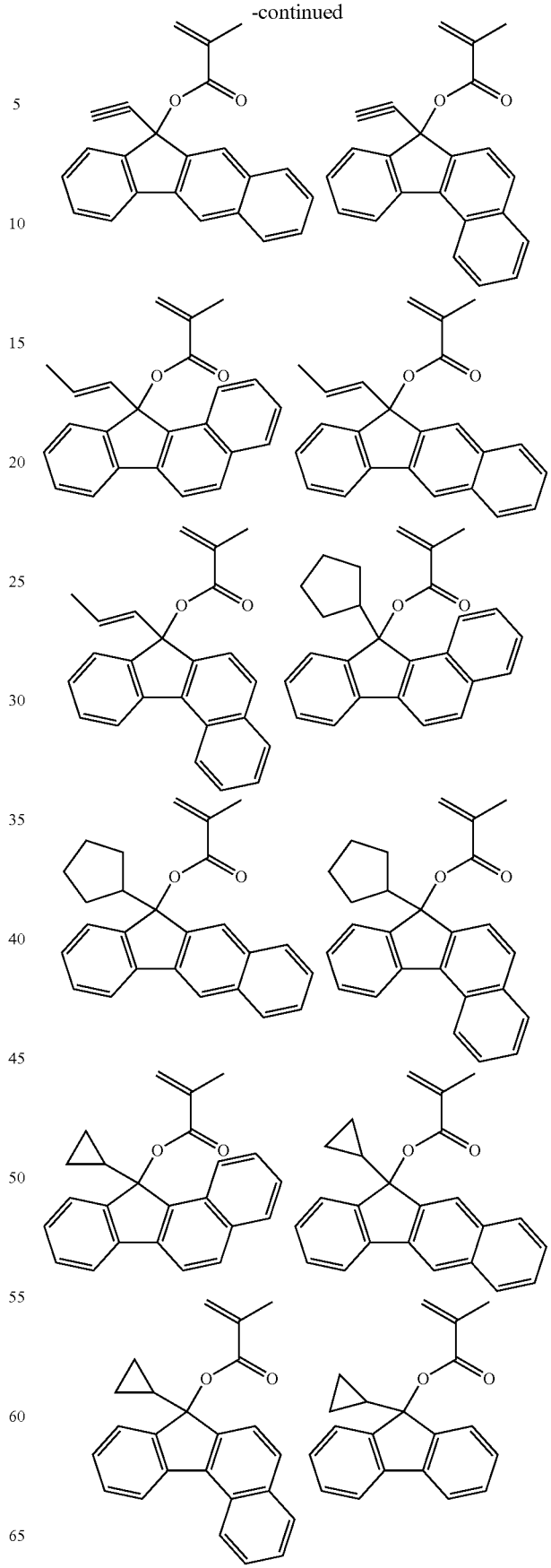

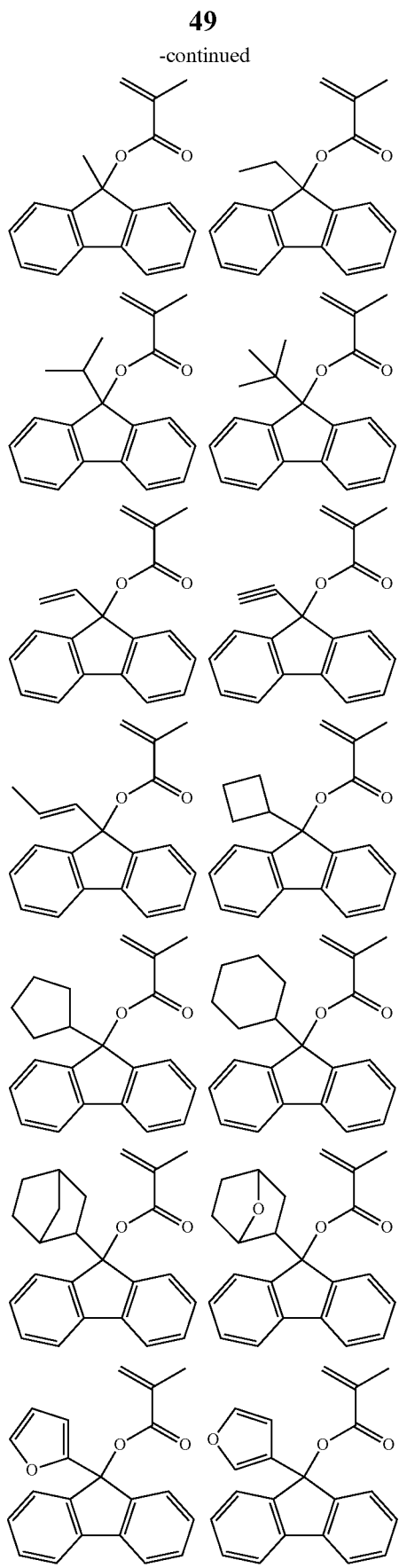
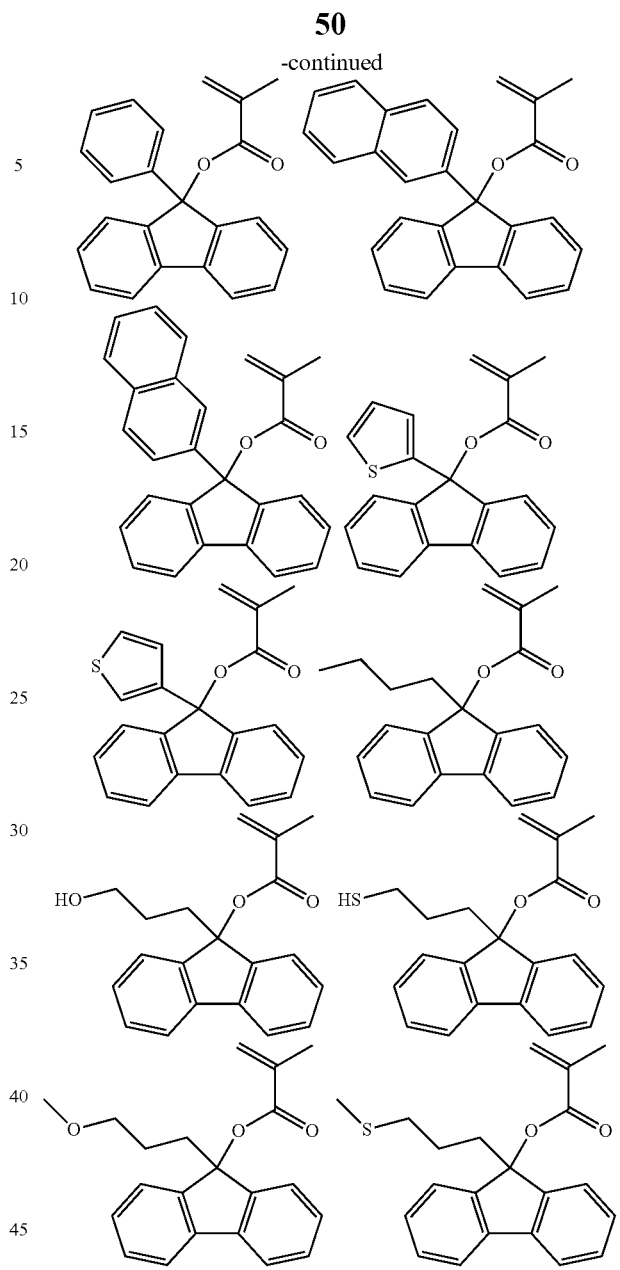
Further, a hydrogen atom of the carboxyl group in the repeating unit a1 may be substituted with an acid labile group shown by the following general formula (A-4)-25,
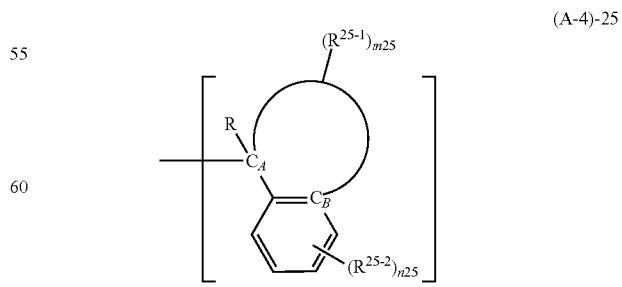
wherein $R^{25-1}$ represents the same or different hydrogen atom, linear, branched, or cyclic alkyl group having 1 to 6 carbon atoms; when m25 is 2 or more, R$^{25-1}$ may be bonded by themselves to form a ring of 2 to 8 carbon atoms; the circle represents a bonding of the carbons C$_A$ and C$_B$ selected from an ethylene group, a propylene group, a butylene group, and a pentalene group. R$^{25-2}$ represents an alkyl group having 1 to 4 carbon atoms, an alkoxy group, an alkanoyl group, an alkoxycarbonyl group, a hydroxyl group, a nitro group, an aryl group having 6 to 10 carbon atoms, a halogen atom, or a cyano group. R represents the same meaning as before. When the circle is an ethylene group or a propylene group, R$^{25-1}$ is not a hydrogen atom. m25 and n25 represent an integer of 1 to 4.

Specific example of the monomer having a carboxyl group thereof substituted with an acid labile group shown by the formula (A-4)-25 includes the followings.

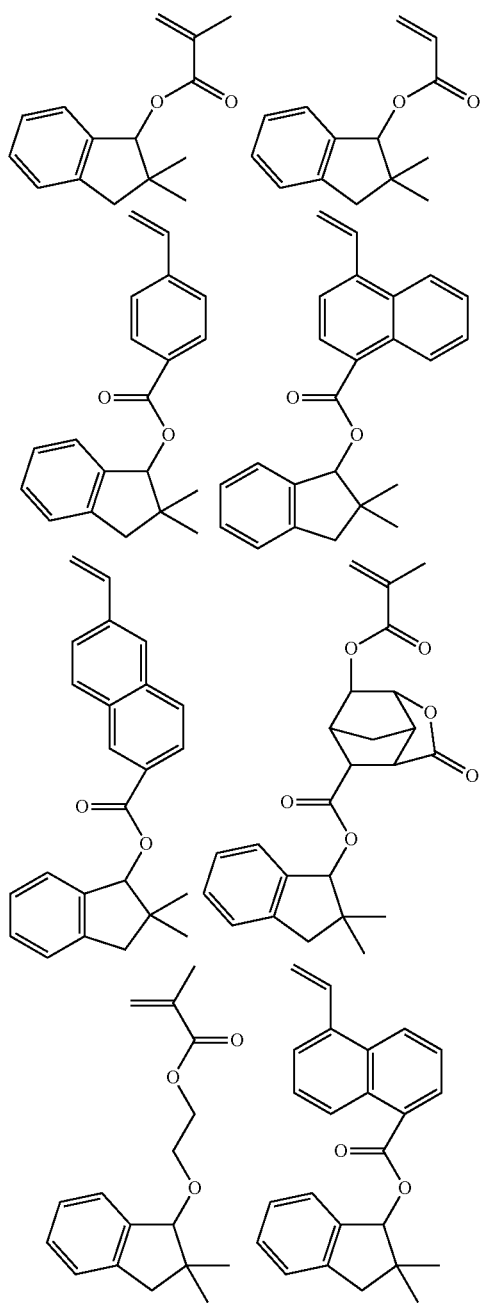

-continued

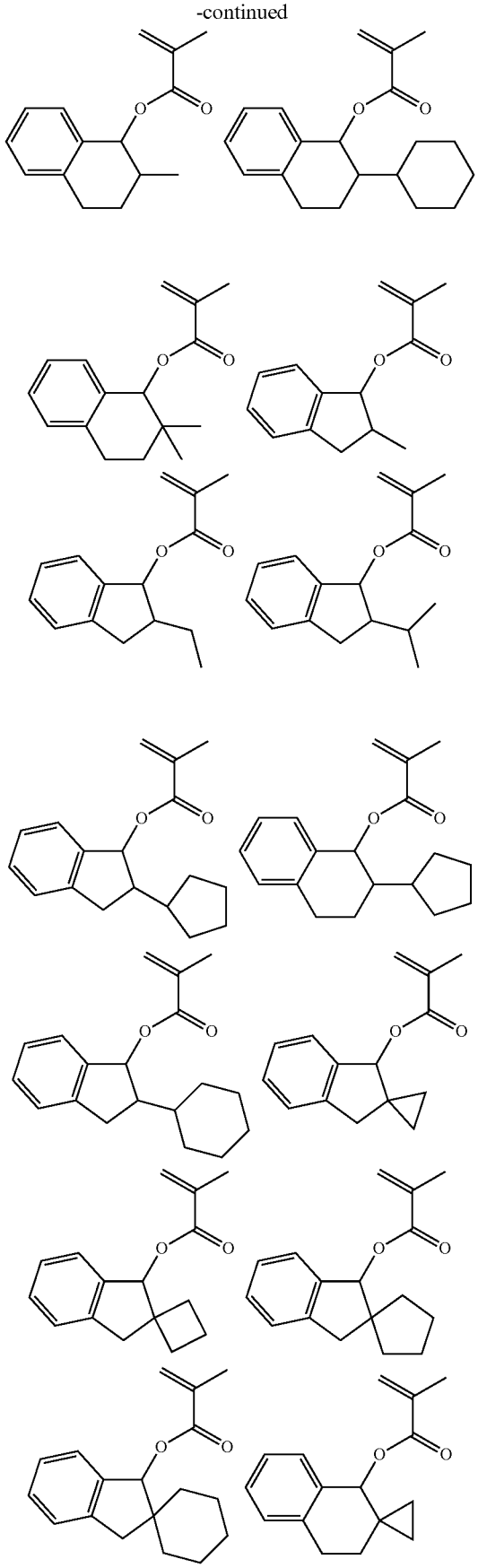

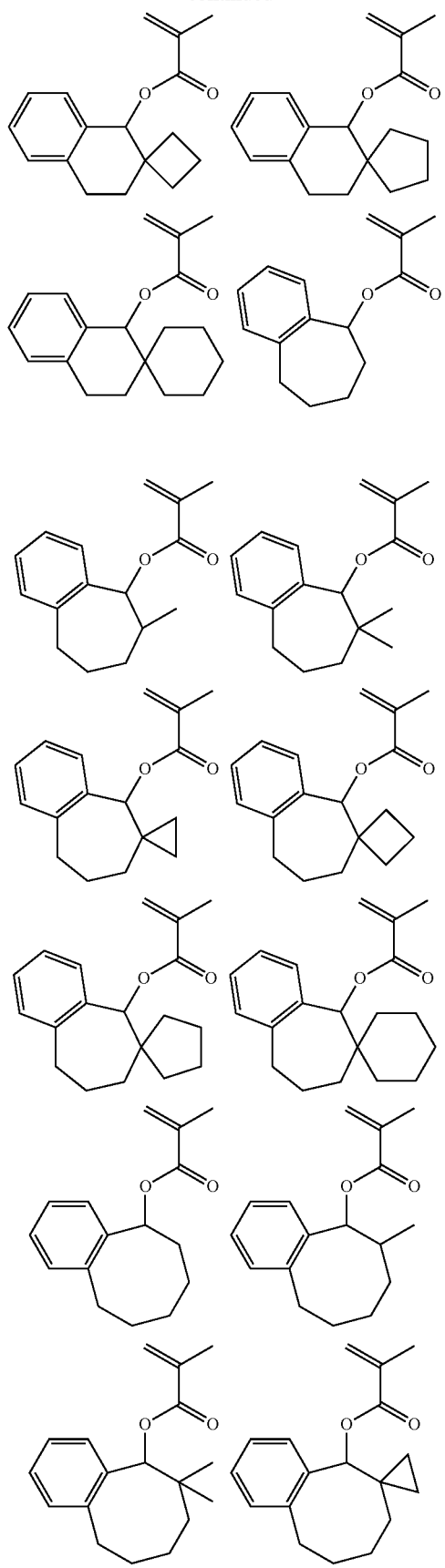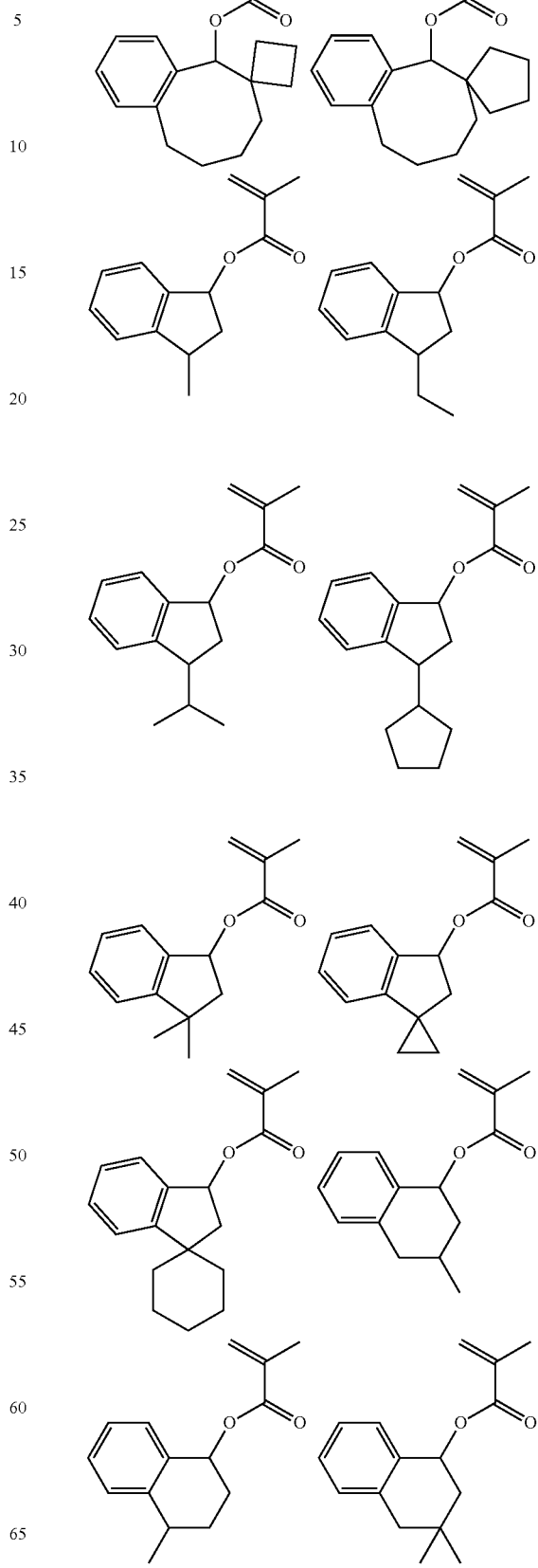

55
-continued
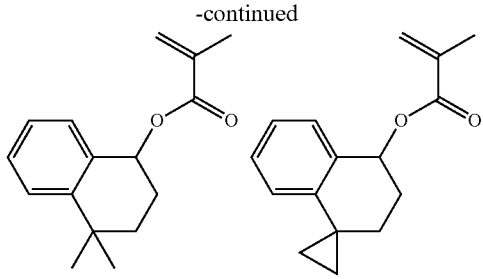
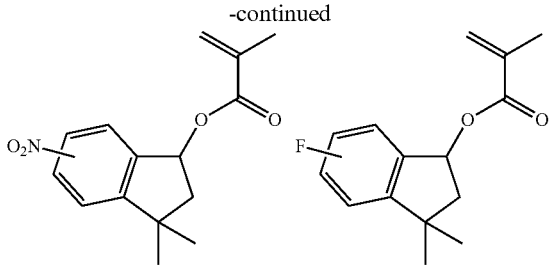
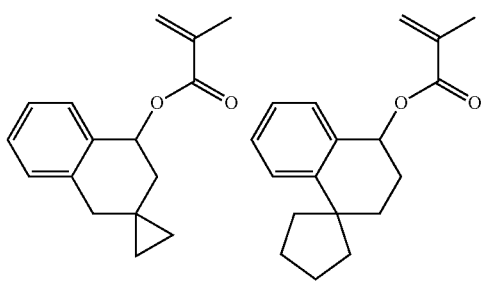
56
-continued
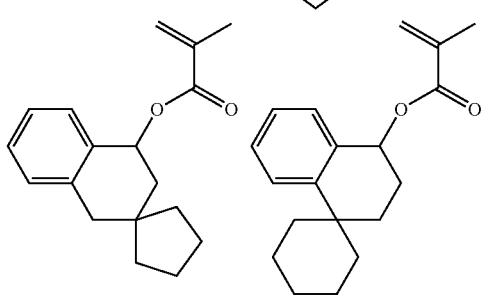
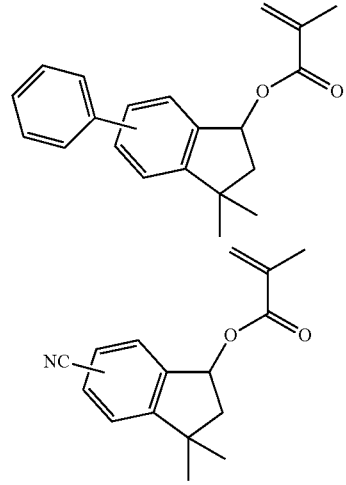
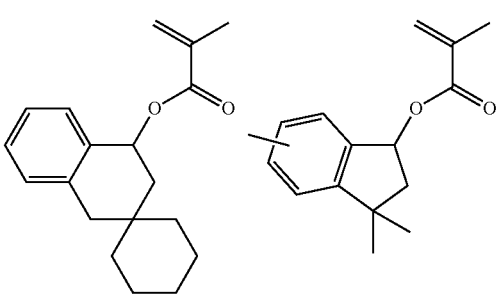
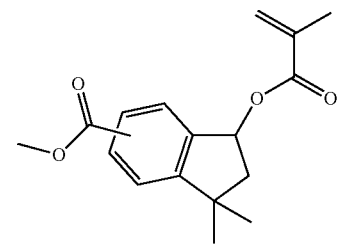
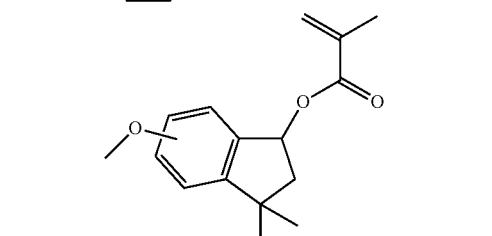
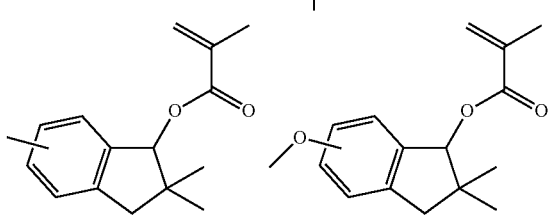
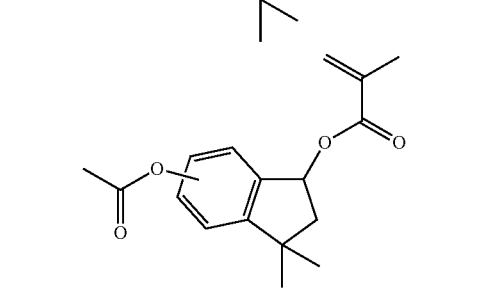
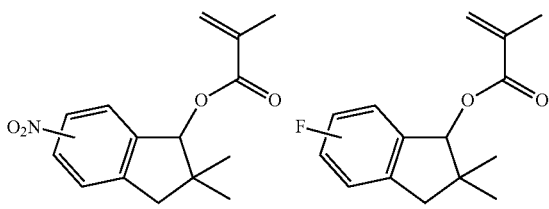

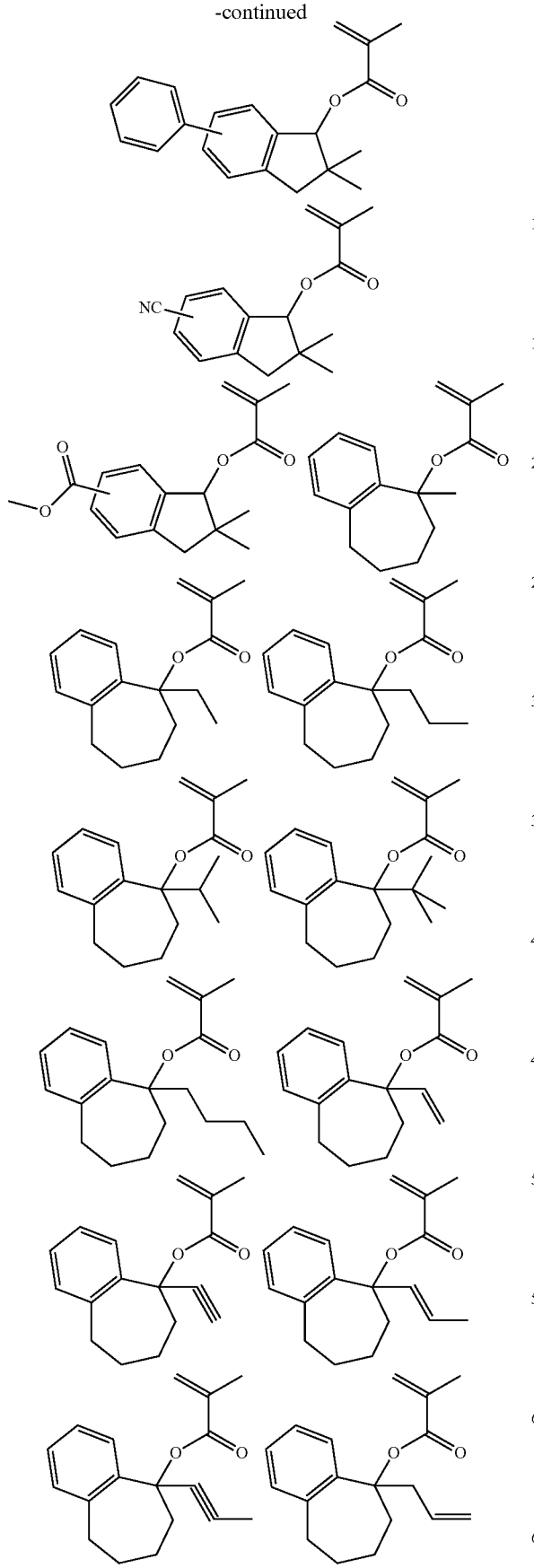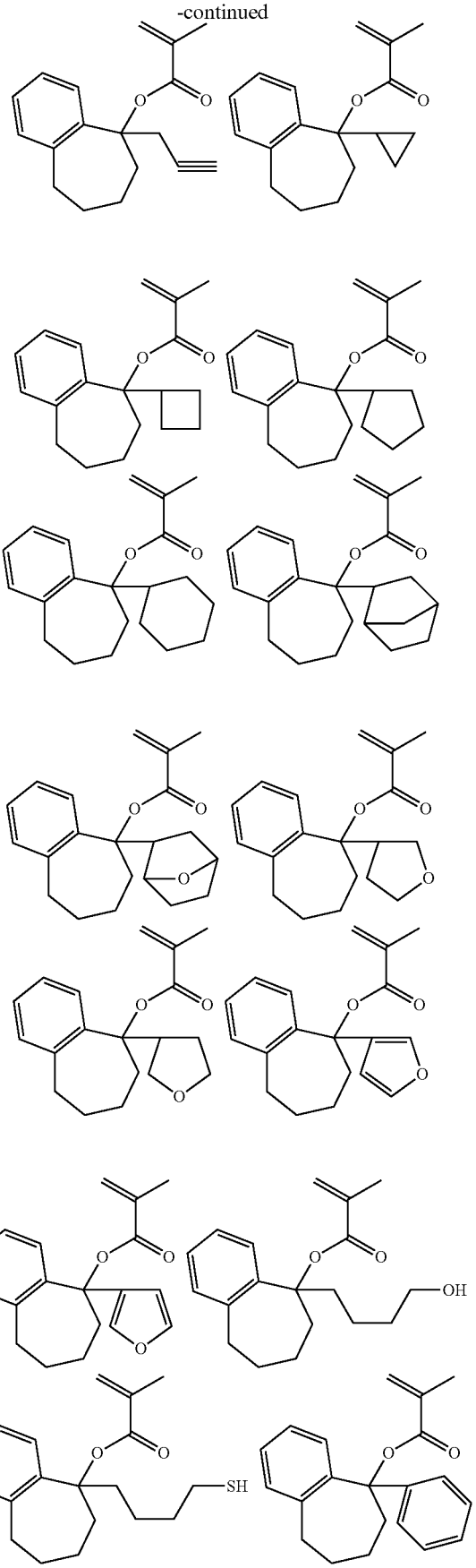

-continued
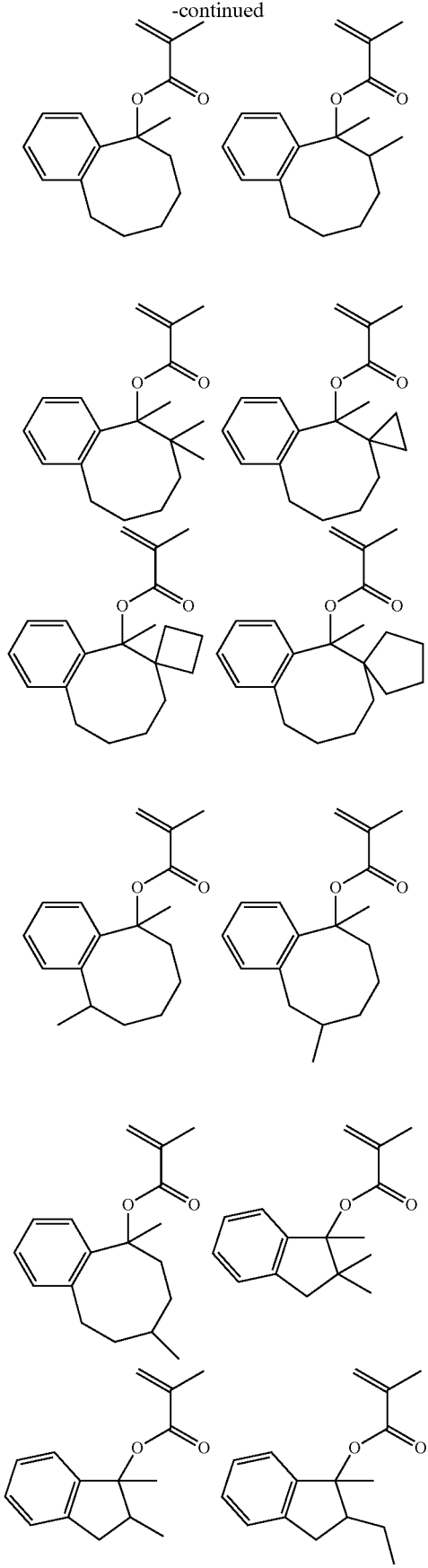
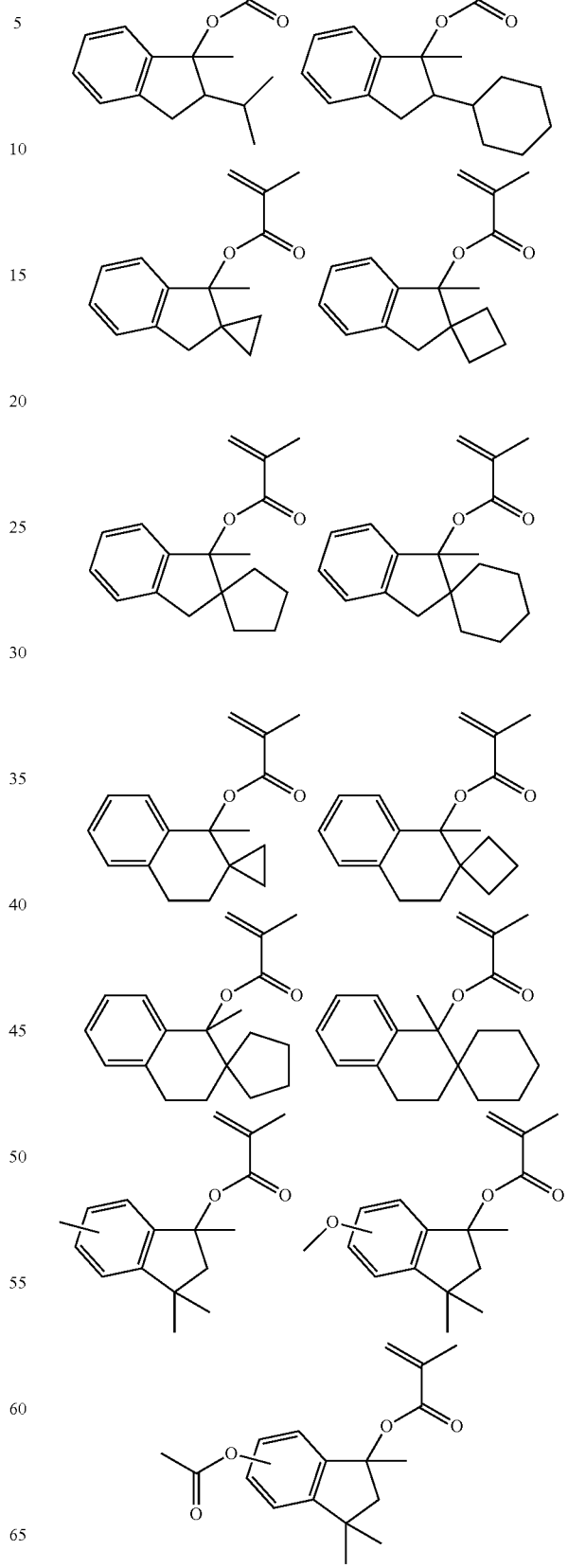

-continued

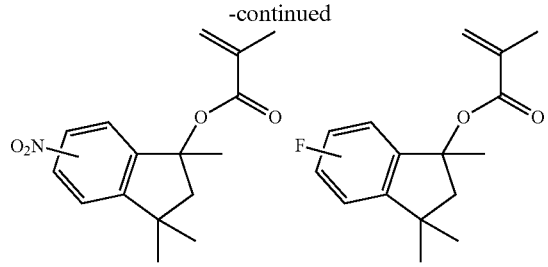
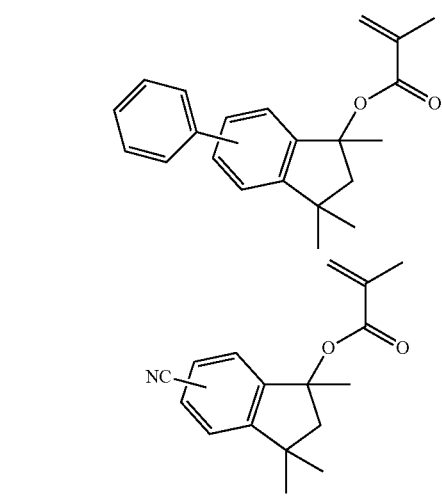
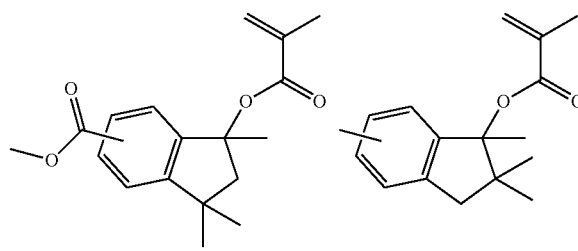
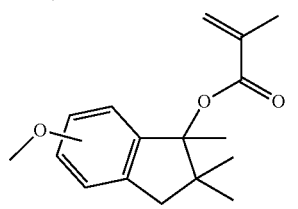
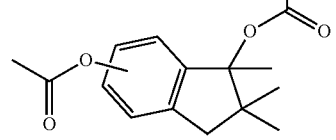
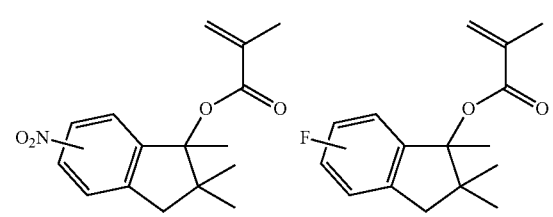

-continued

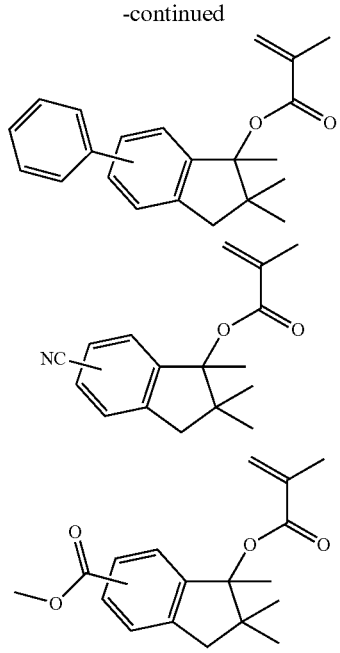

Alternatively, a hydrogen atom of the carboxyl group in the repeating unit a1 may be substituted with an acid labile group shown by the following general formula (A-4)-26,

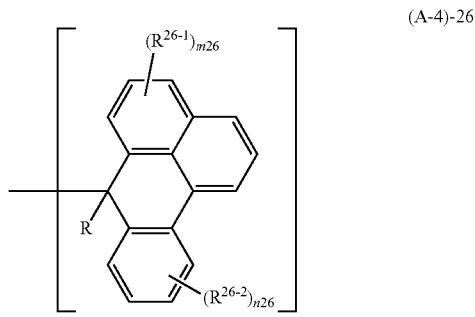

(A-4)-26 wherein $R^{26-1}$ and $R^{26-2}$ represent a hydrogen atom, an alkyl group having 1 to 4 carbon atoms, an alkoxy group, an alkanoyl group, an alkoxycarbonyl group, a hydroxyl group, a nitro group, an aryl group having 6 to 10 carbon atoms, a halogen atom, or a cyano group. R represents the same meaning as before. m26 and n26 represent an integer of 1 to 4.

Specific example of the monomer having a carboxyl group thereof substituted with an acid labile group shown by the formula (A-4)-26 includes the followings.

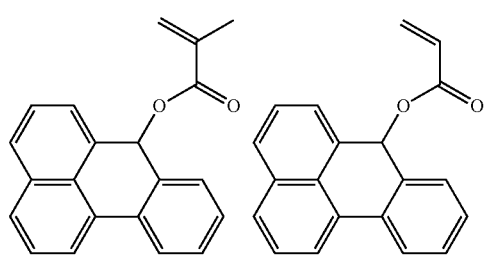

63
-continued
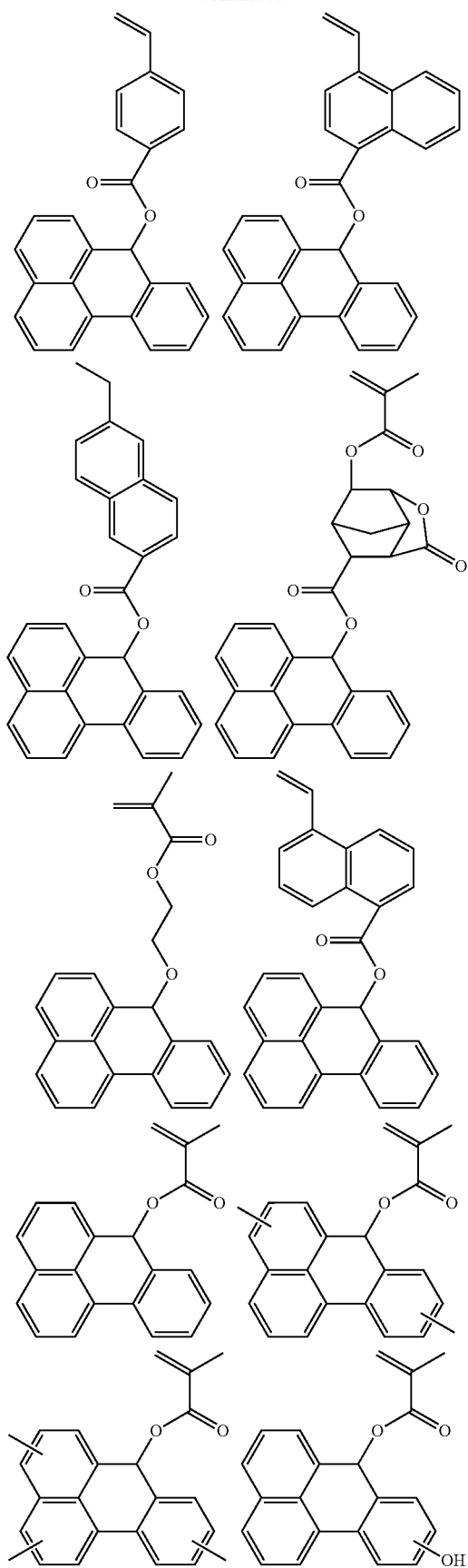
64
-continued
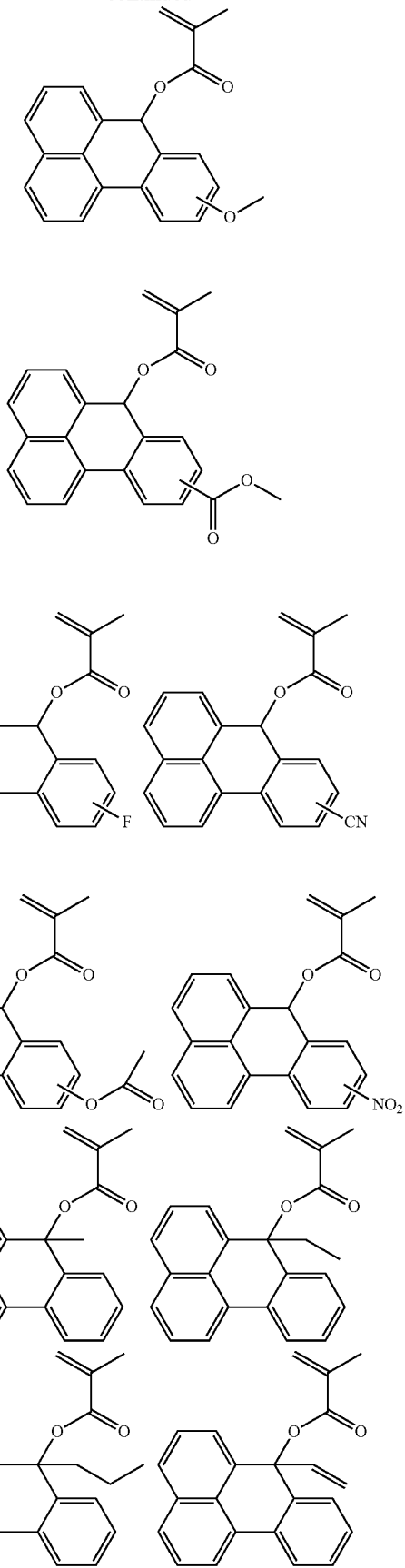

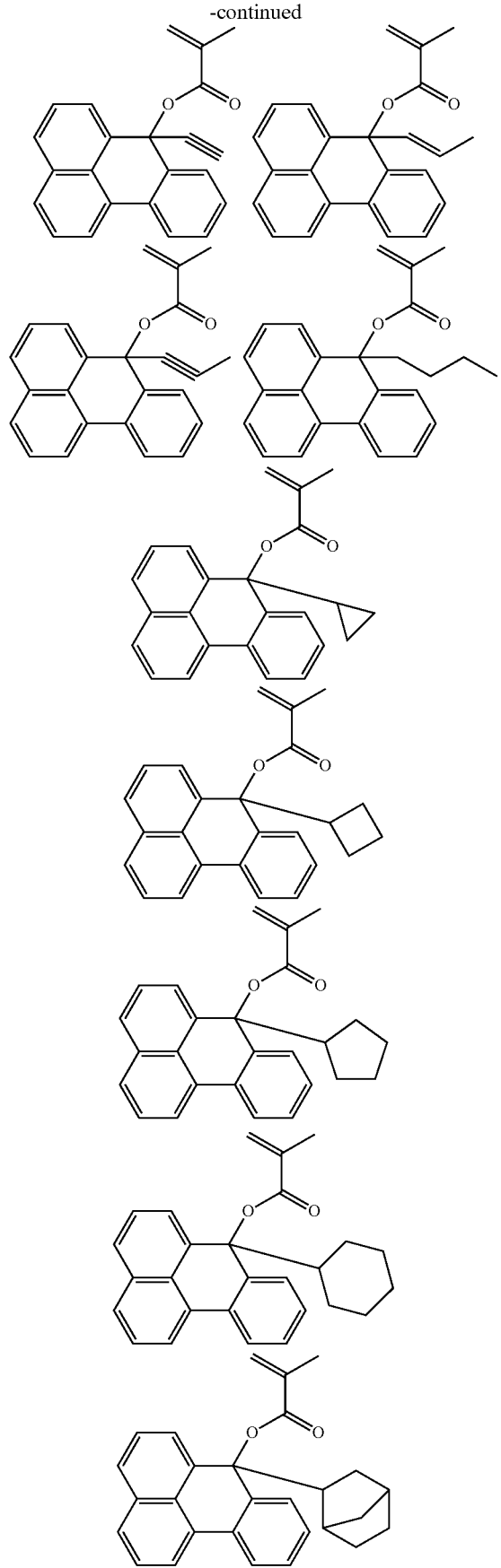
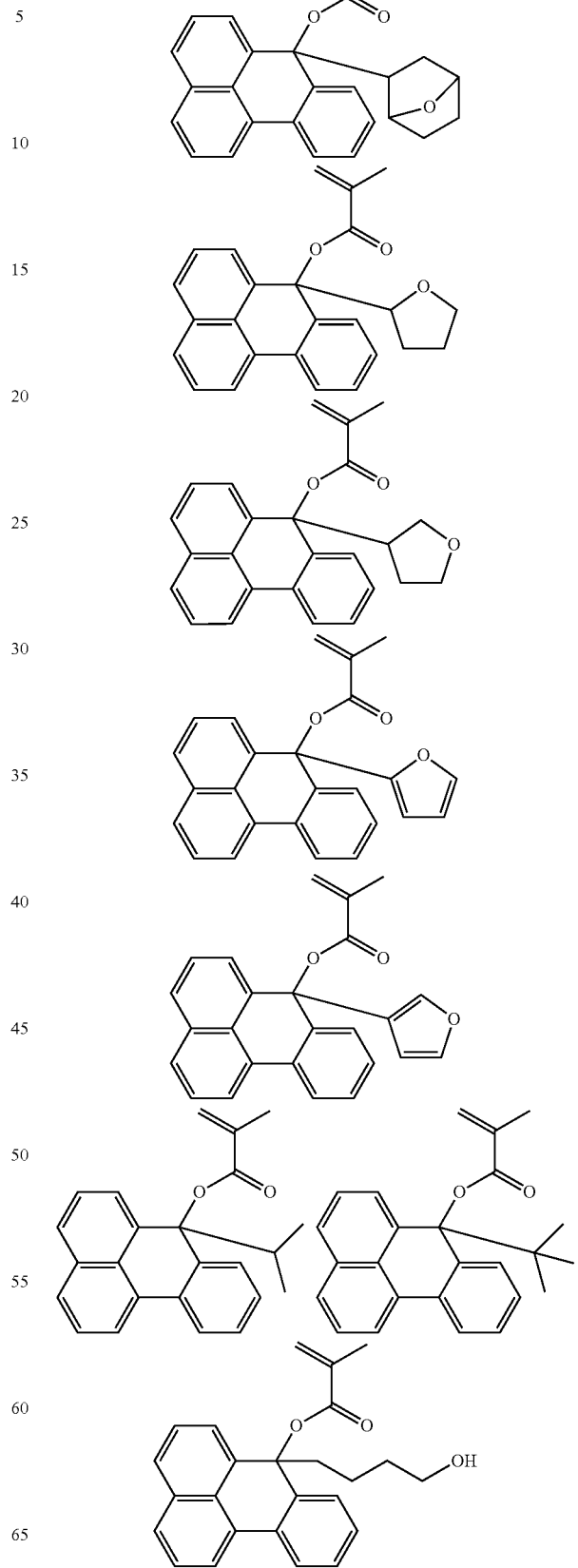

-continued

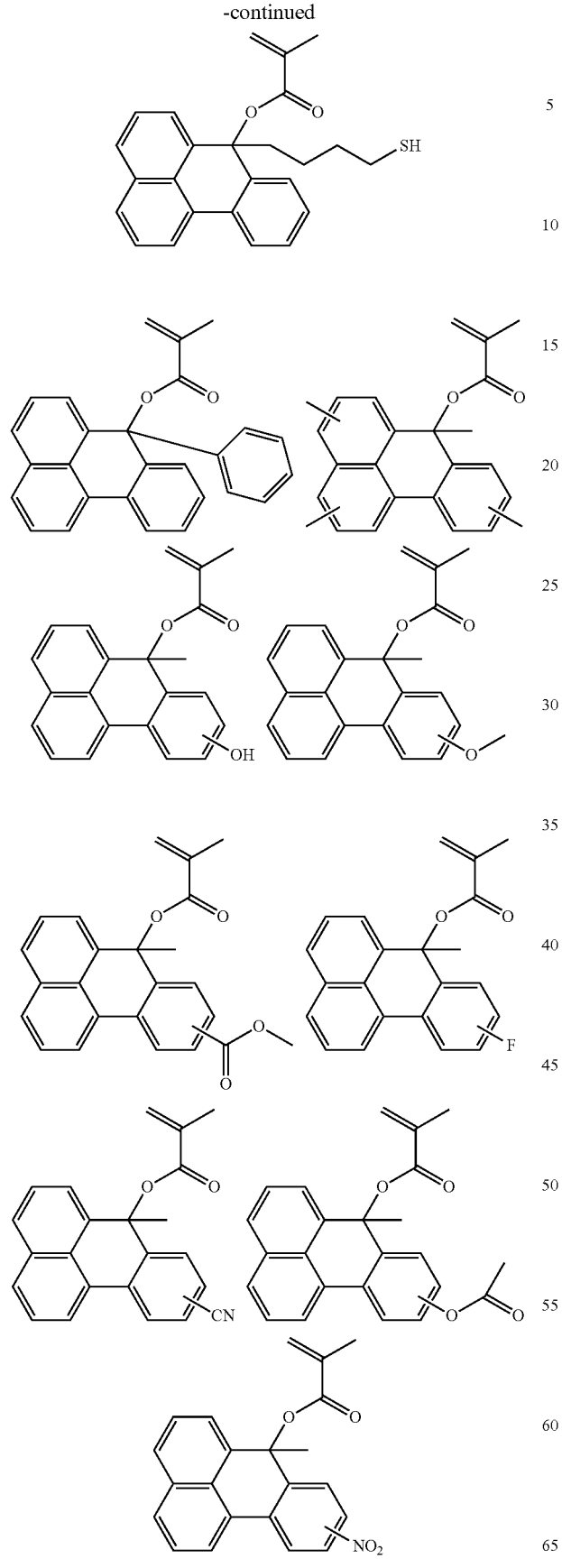

Alternatively, a hydrogen atom of the carboxyl group in the repeating unit a1 may be substituted with an acid labile group shown by the following general formula (A-4)-27,

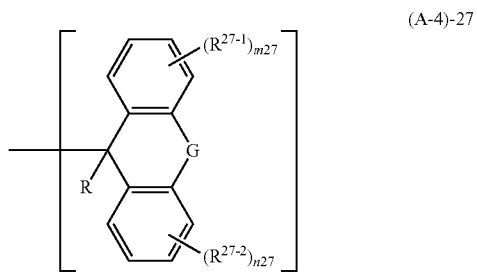

wherein $R^{27-1}$ and $R^{27-2}$ represent a hydrogen atom, an alkyl group having 1 to 4 carbon atoms, an alkoxy group, an alkanoyl group, an alkoxycarbonyl group, a hydroxyl group, an aryl group having 6 to 10 carbon atoms, a halogen atom, or a cyano group. m27 and n27 represent an integer of 1 to 4. R represents the same meaning as before. G represents a methylene group, an ethylene group, a vinylene group, or —CH$_2$—S—.

Specific example of the monomer having a carboxyl group thereof substituted with an acid labile group shown by the formula (A-4)-27 includes the followings.

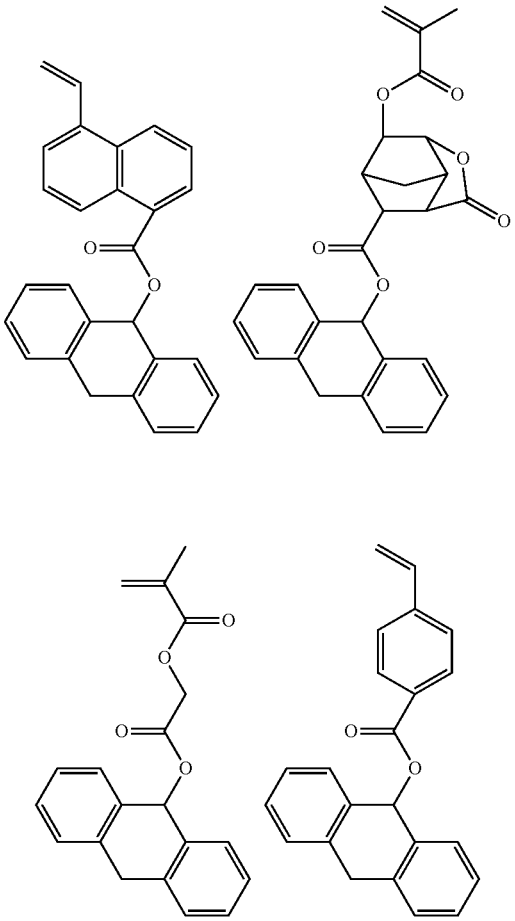

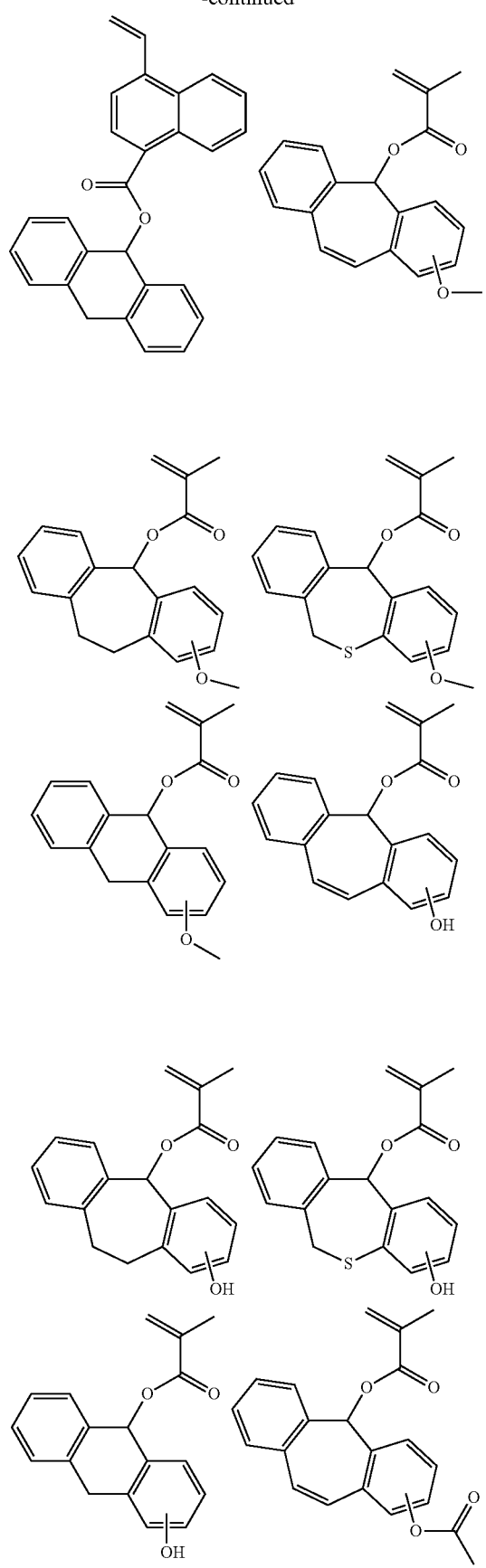
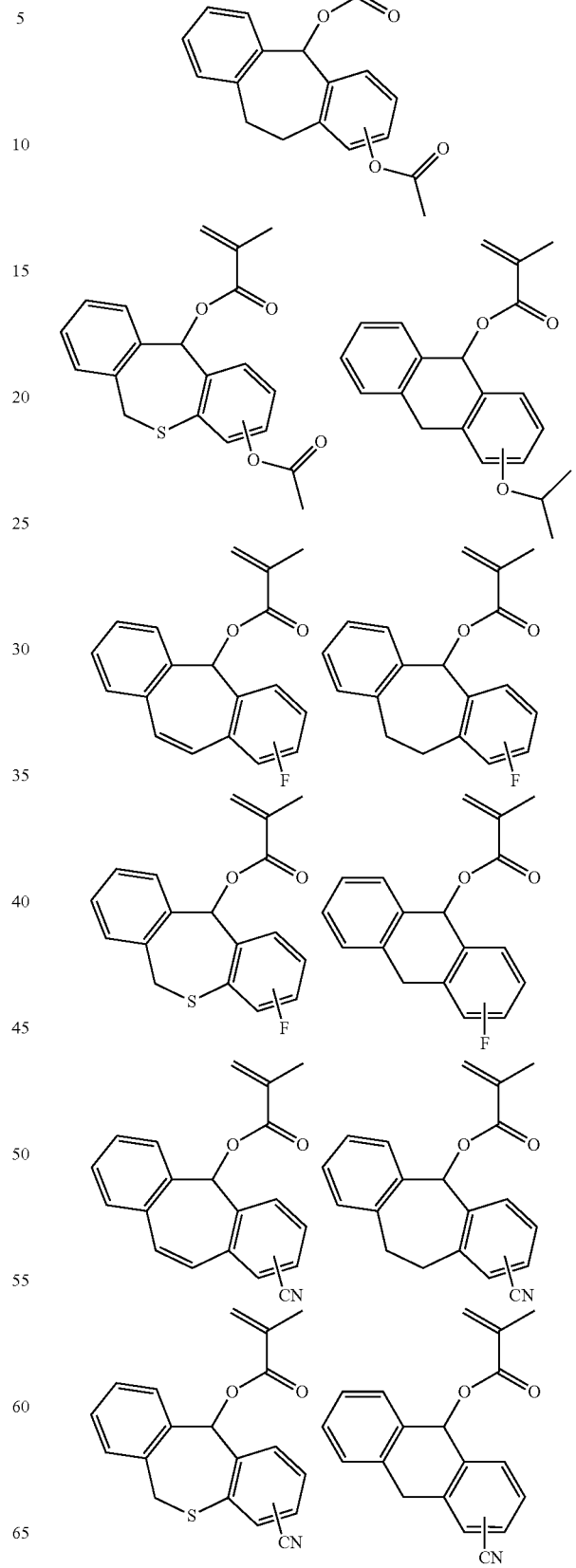

71
-continued
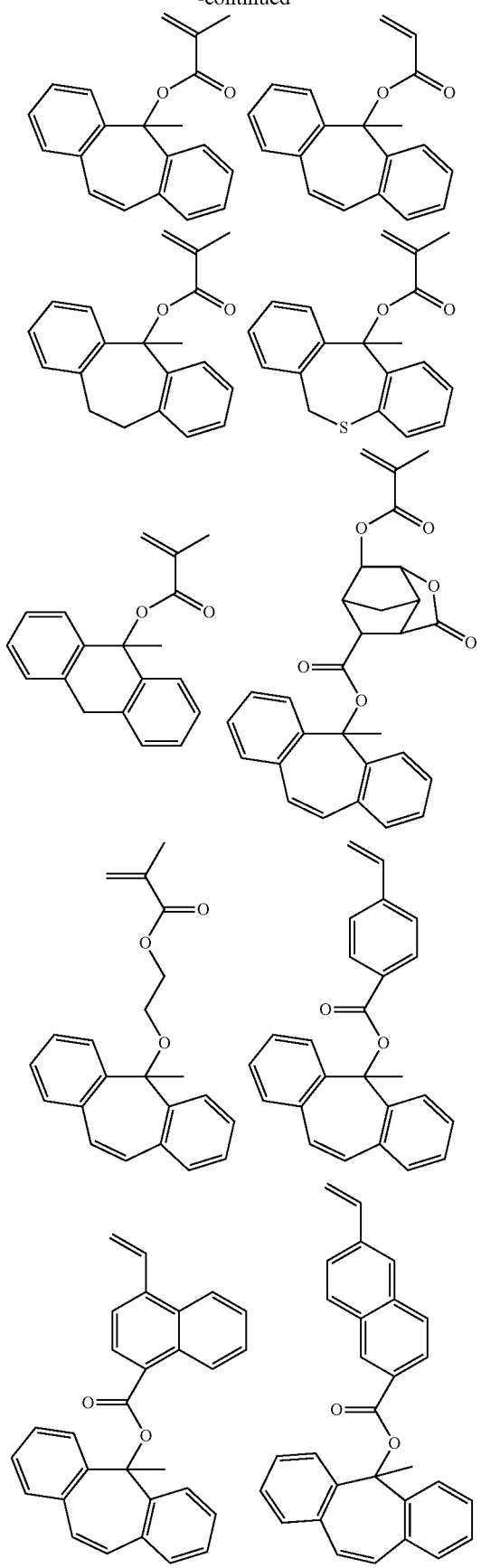
72
-continued
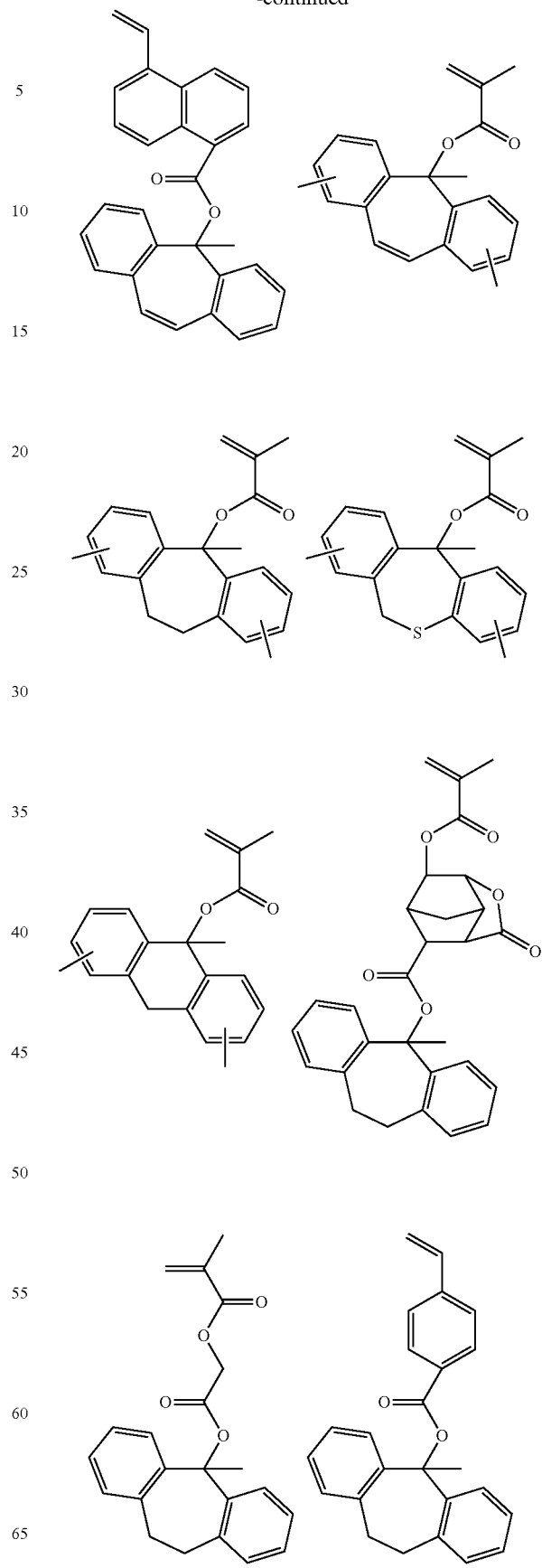

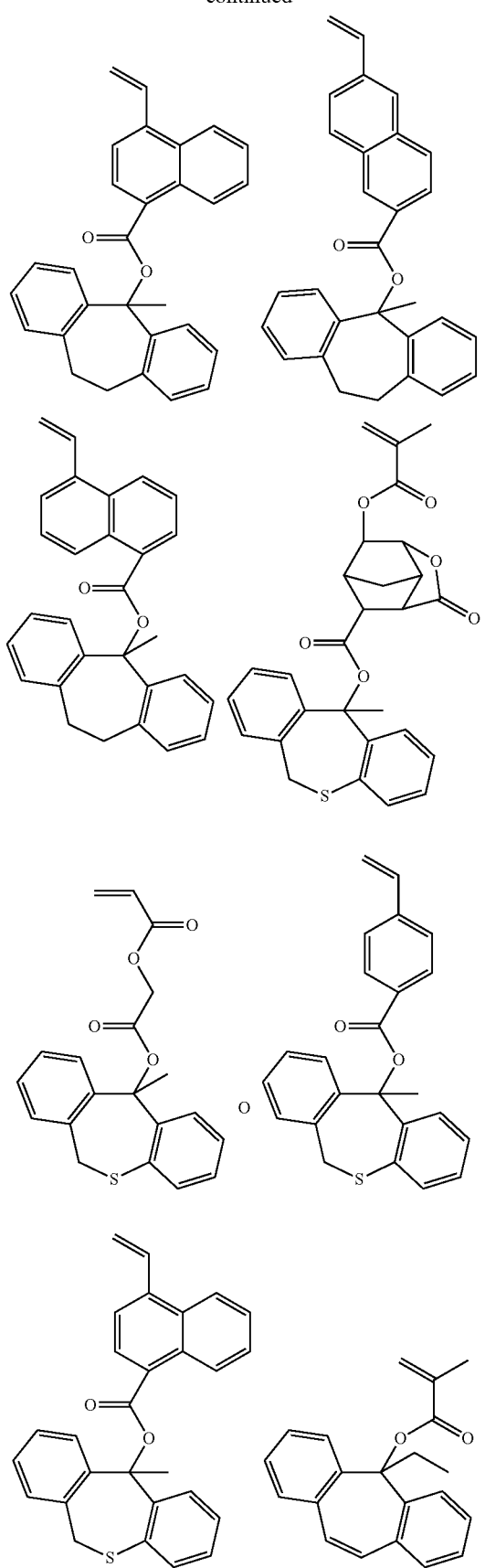
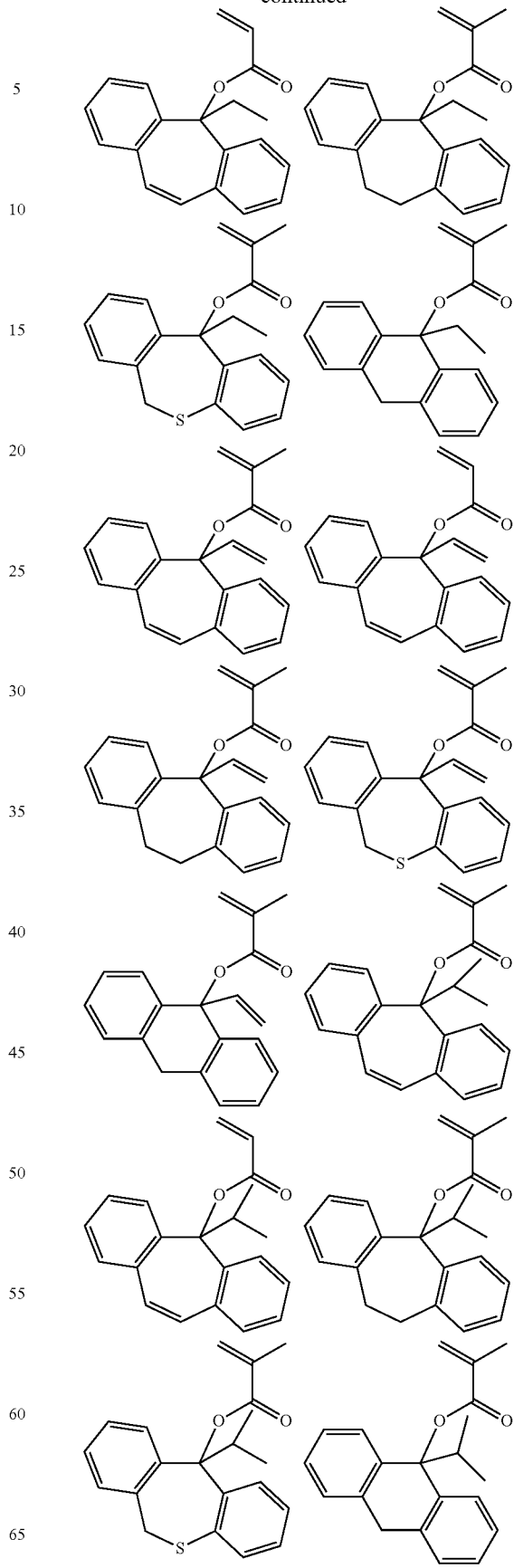

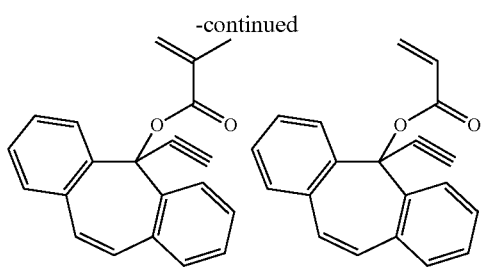

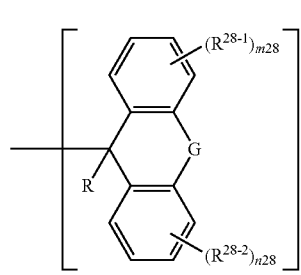

Alternatively, a hydrogen atom of the carboxyl group in the repeating unit a1 may be substituted with an acid labile group shown by the following general formula (A-4)-28.

(A-4)-28

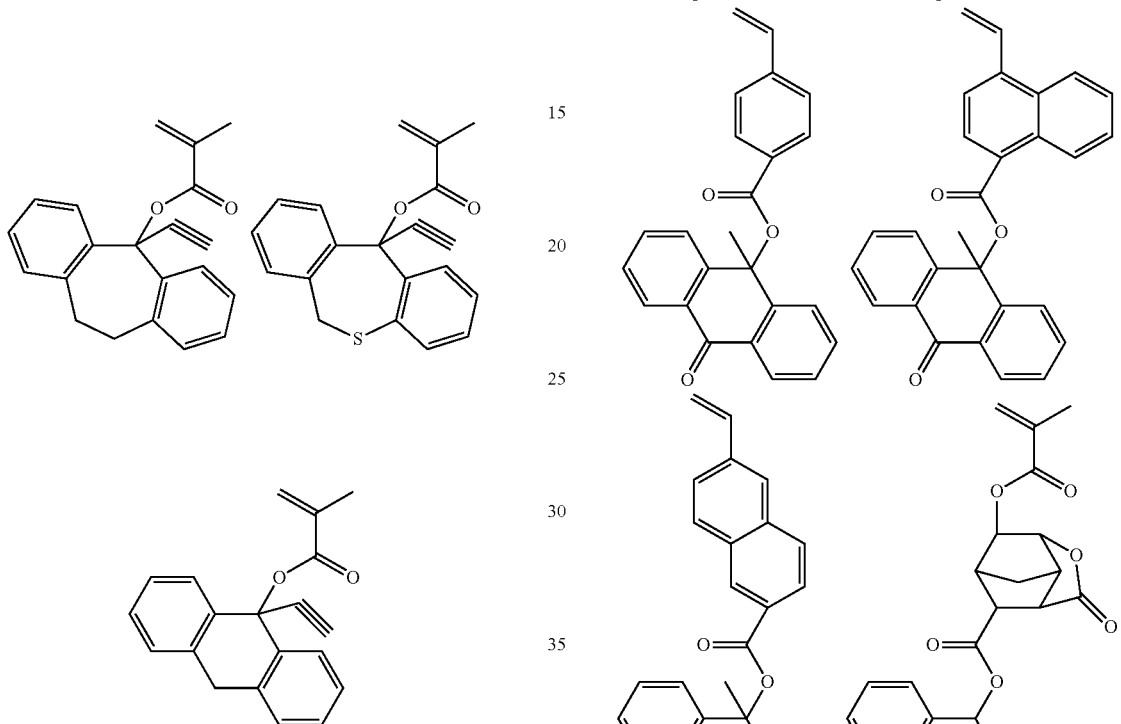

wherein $R^{28-1}$ and $R^{28-2}$ represent a hydrogen atom, an alkyl group having 1 to 4 carbon atoms, an alkoxy group, an alkanoyl group, an alkoxycarbonyl group, a hydroxyl group, an aryl group having 6 to 10 carbon atoms, a halogen atom, or a cyano group. R represents the same meaning as before. m28 and n28 represent an integer of 1 to 4. G represents a carbonyl group, an ether group, a sulfide group, —S(=O)—, or —S(=O)$_2$—.

Specific example of the monomer having a carboxyl group thereof substituted with an acid labile group shown by the formula (A-4)-28 includes the followings.

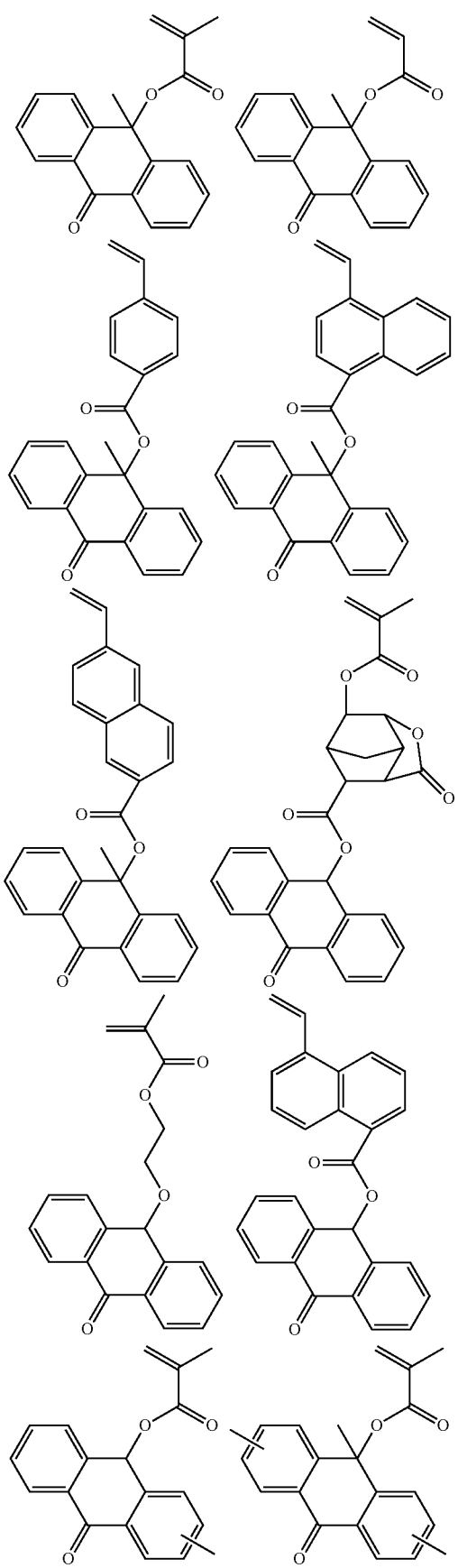

77
-continued
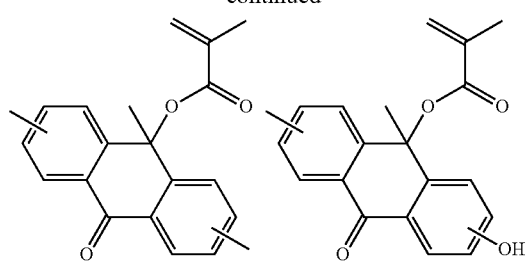
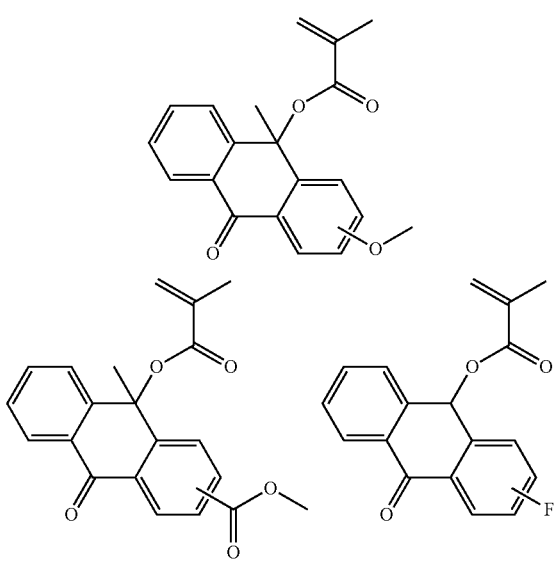
78
-continued
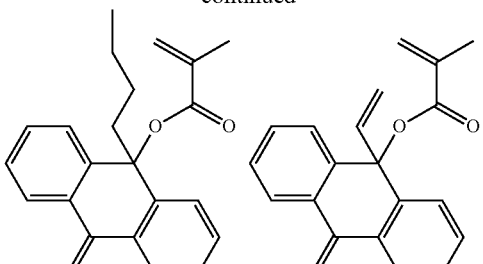
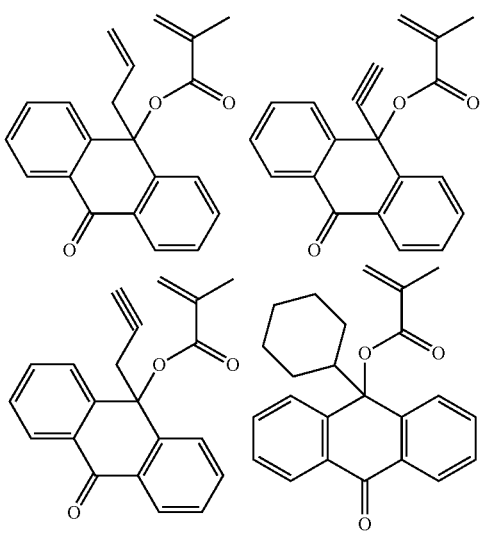
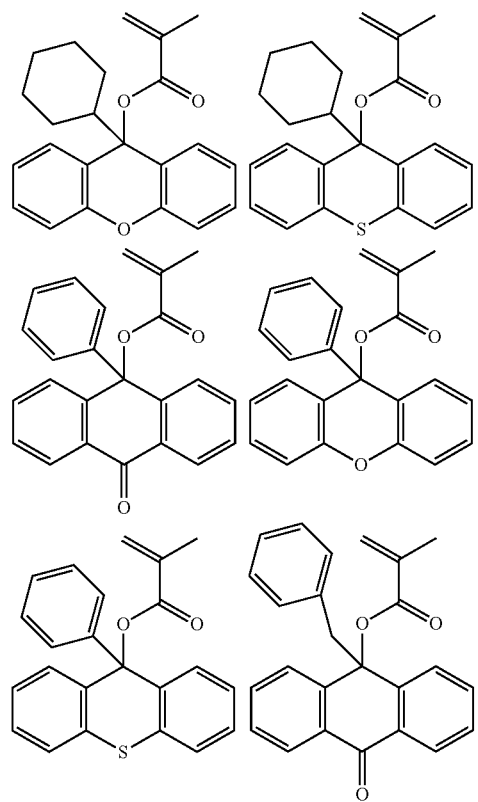

-continued
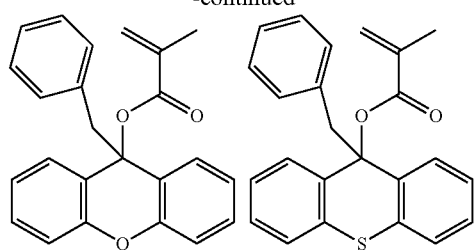
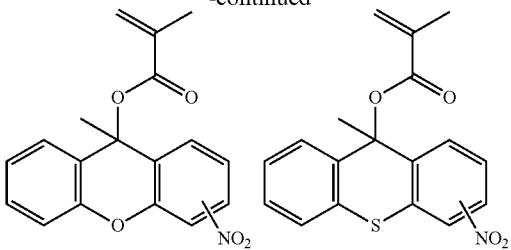
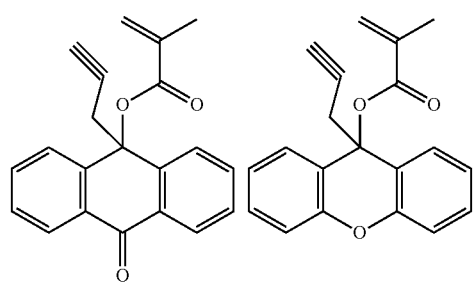
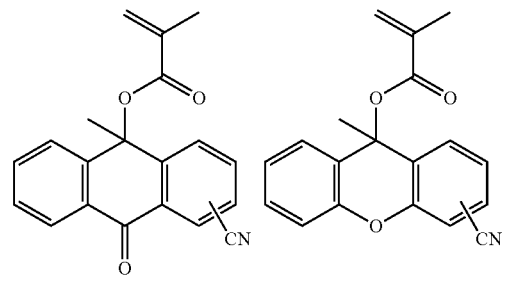
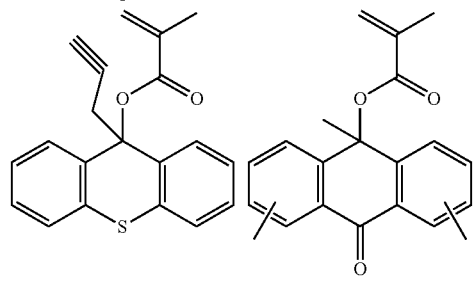
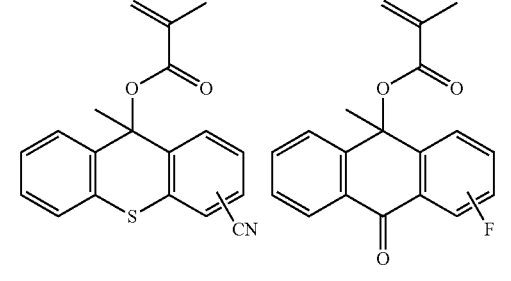
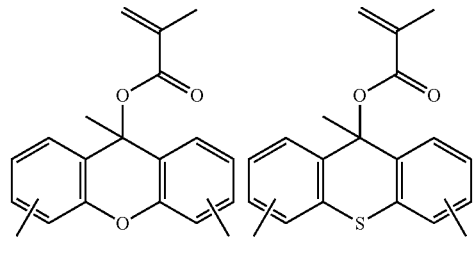
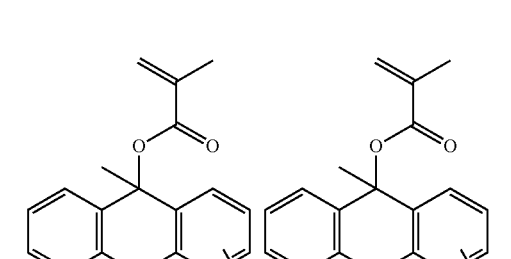
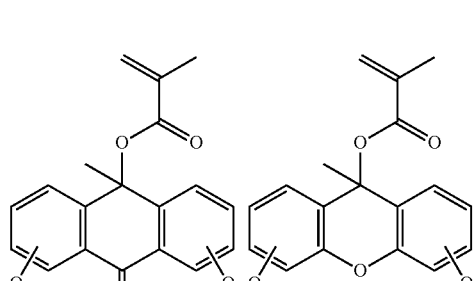
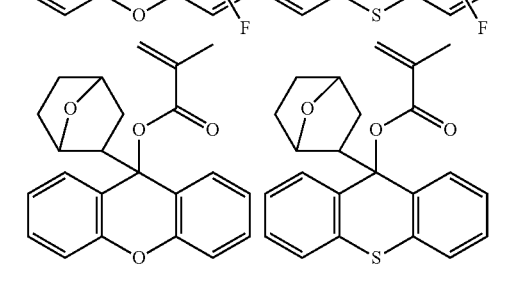
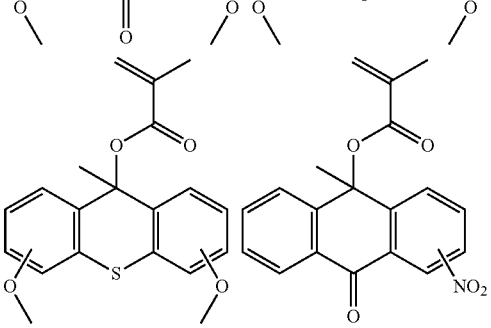
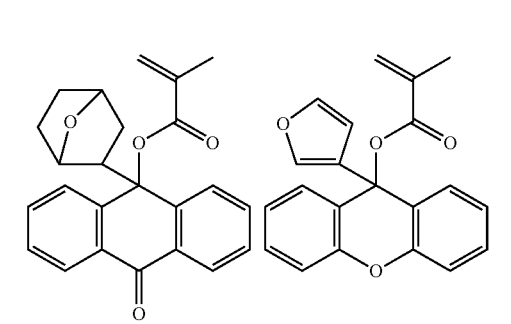

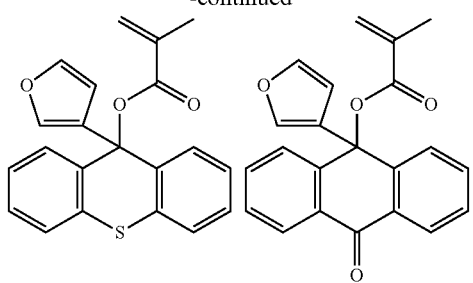
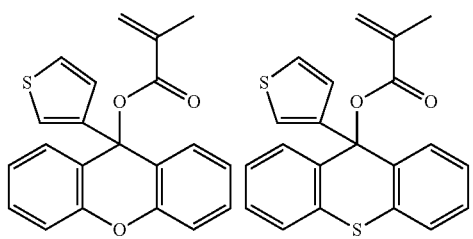
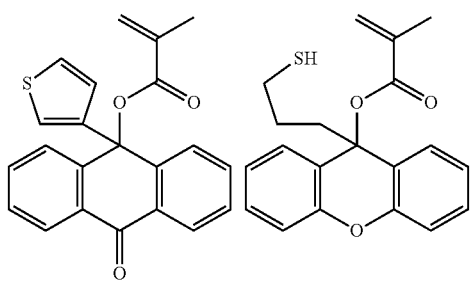
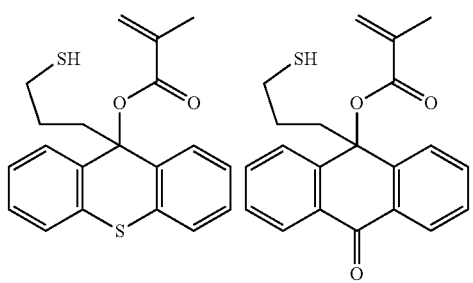
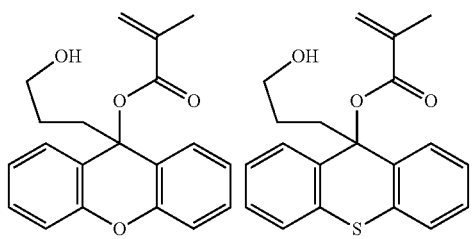
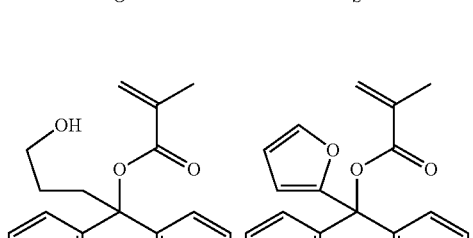
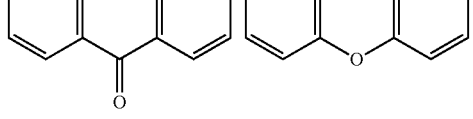
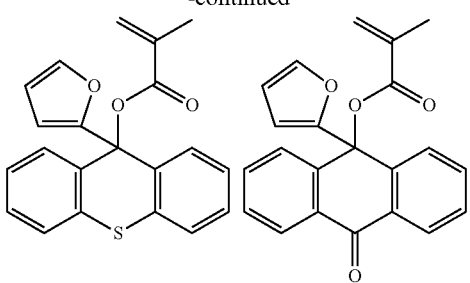
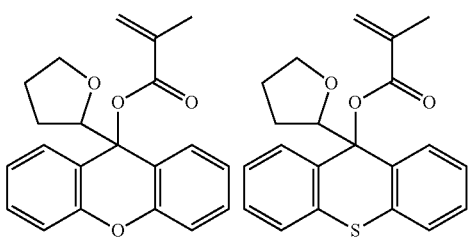
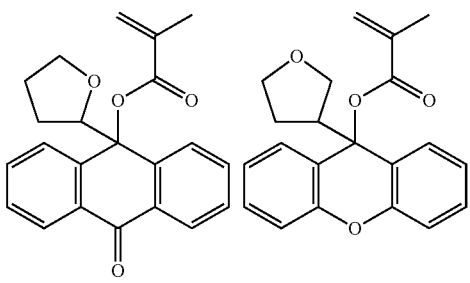
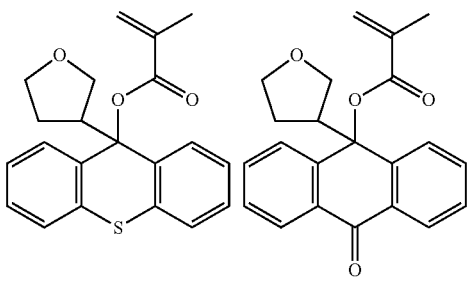
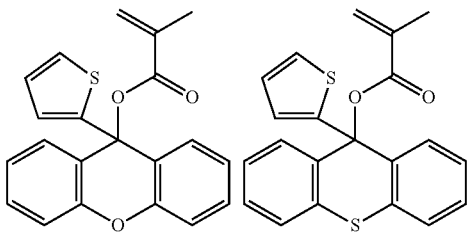
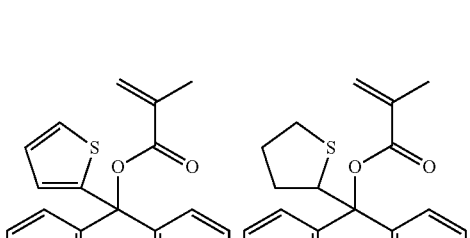
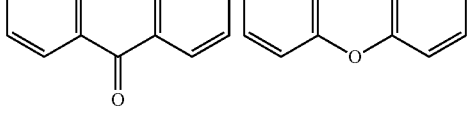

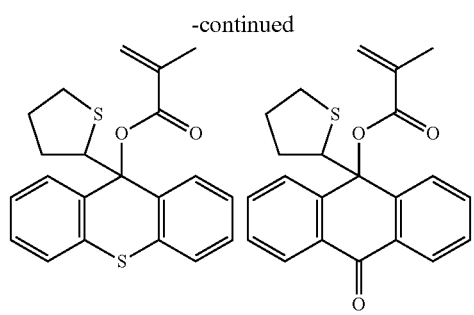
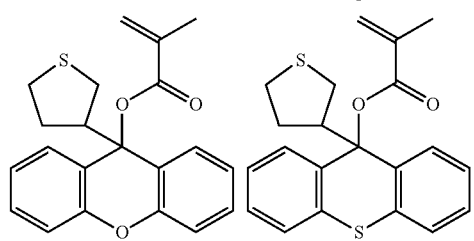
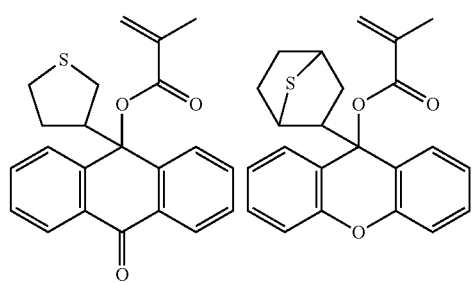
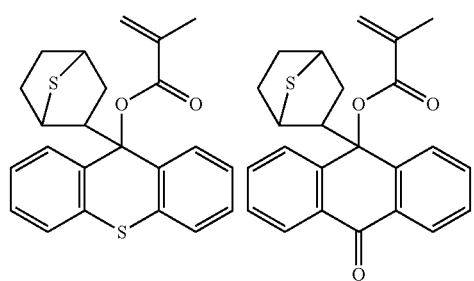
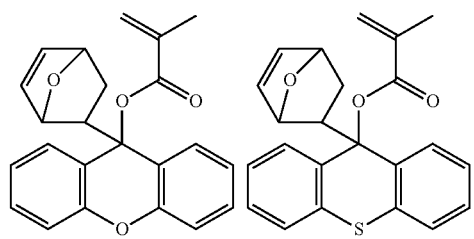
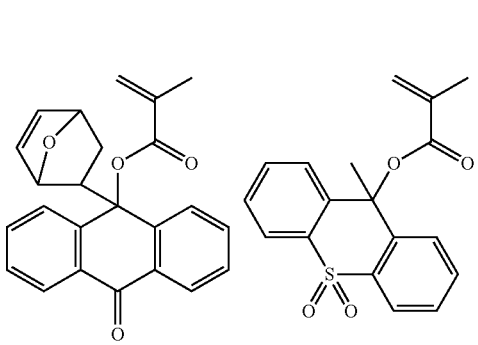
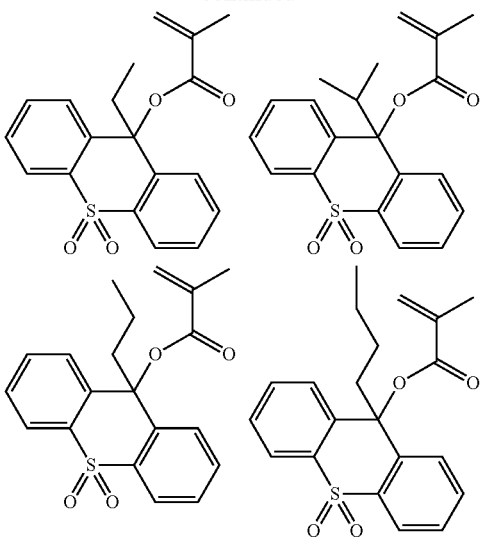
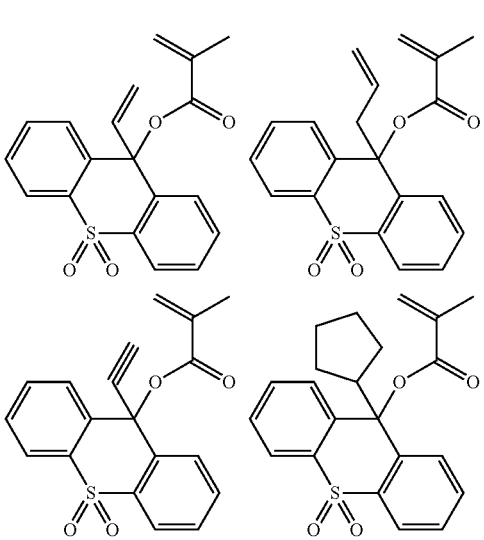
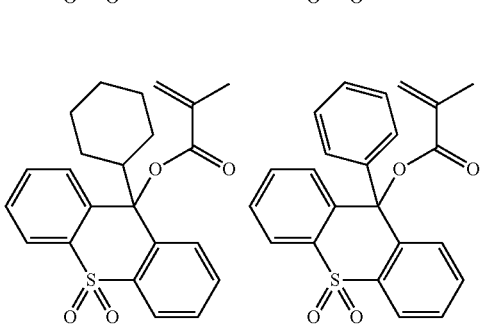
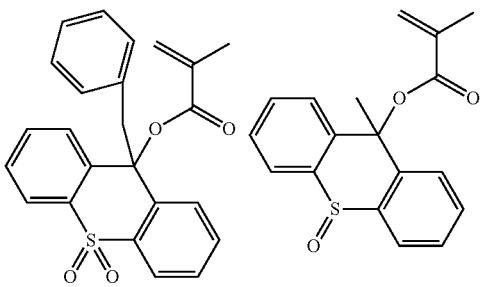

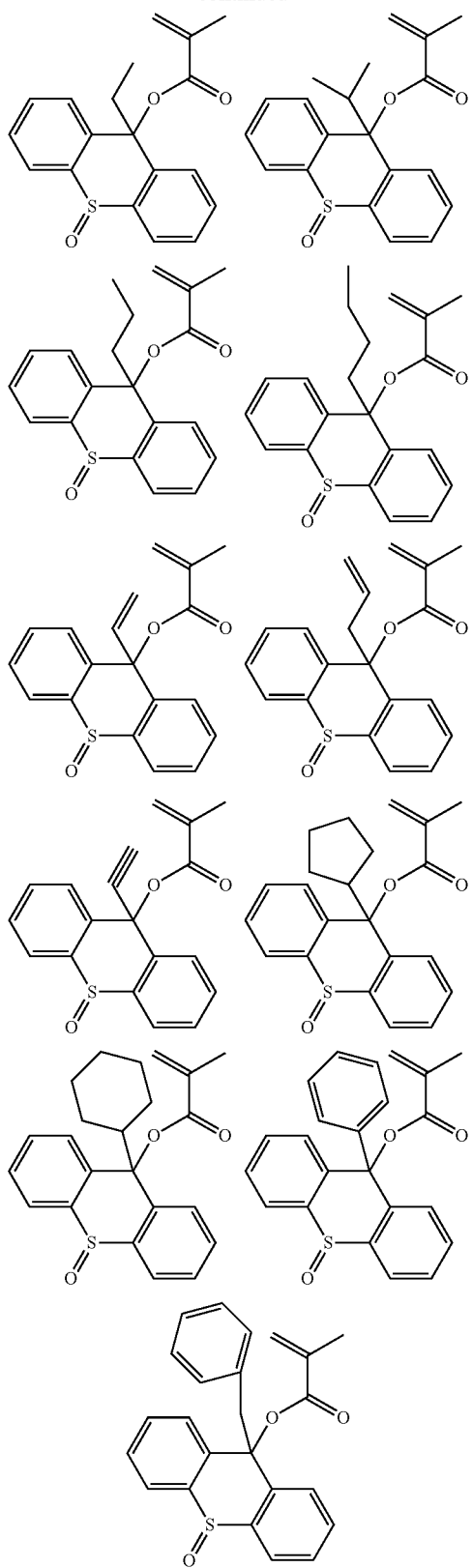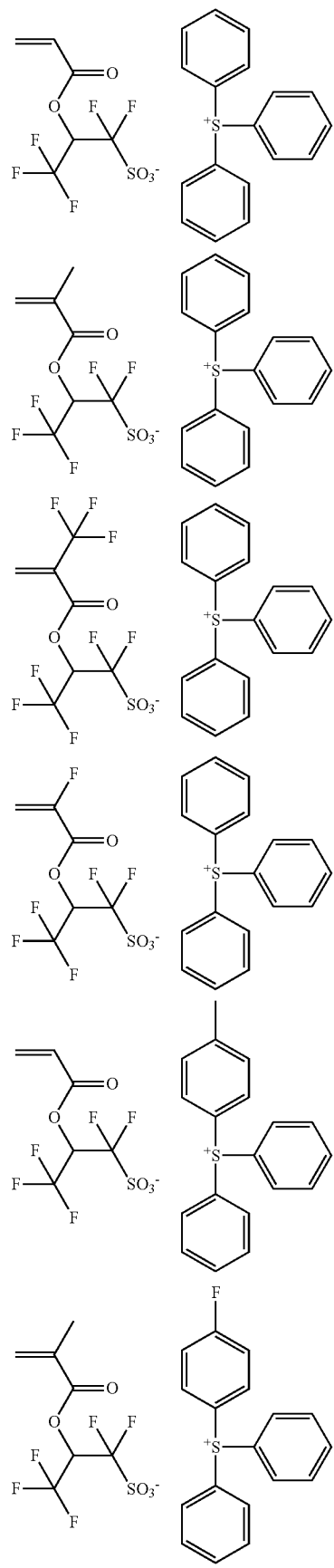
Specific example of the monomer to obtain the repeating unit b1 having a sulfonium salt in the general formula (3) includes the followings.

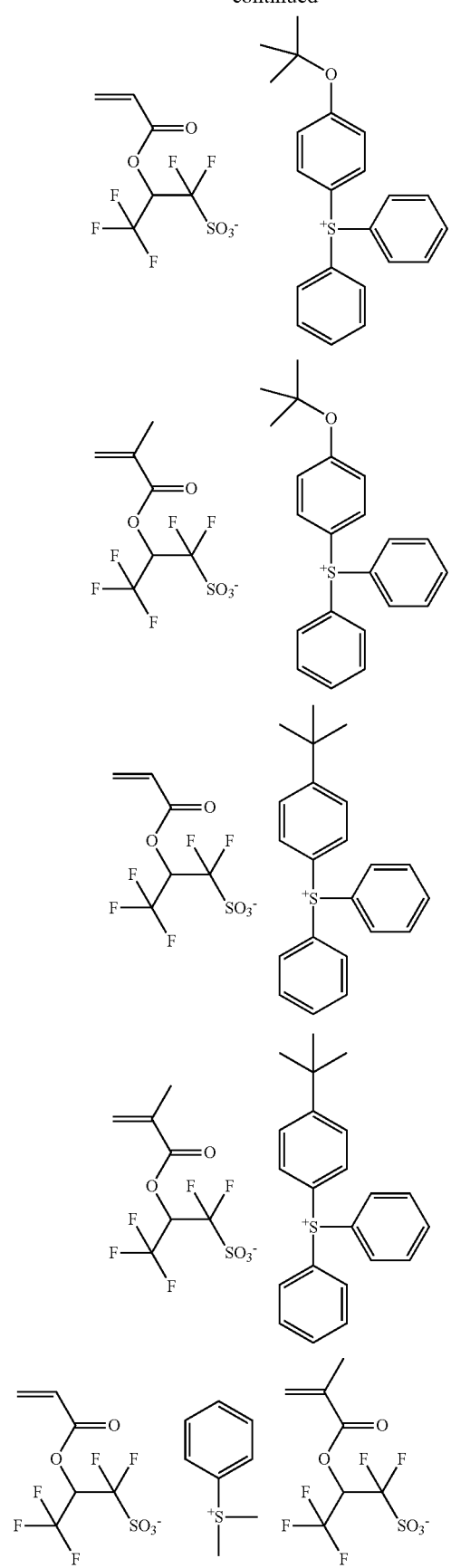
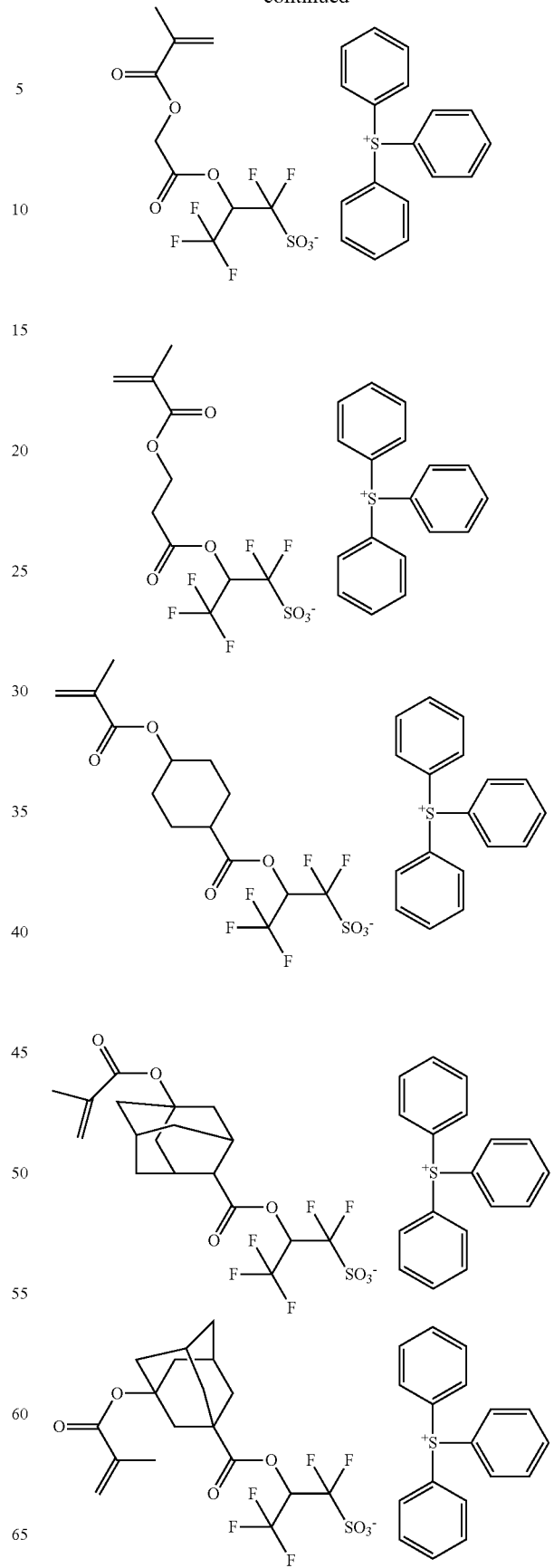

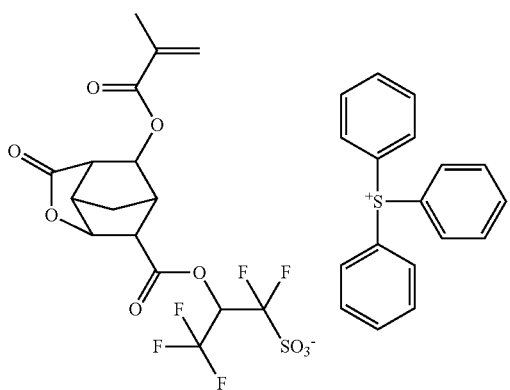
Specific example of the monomer to obtain the repeating unit b2 having a sulfonium salt in the general formula (3) includes the followings.
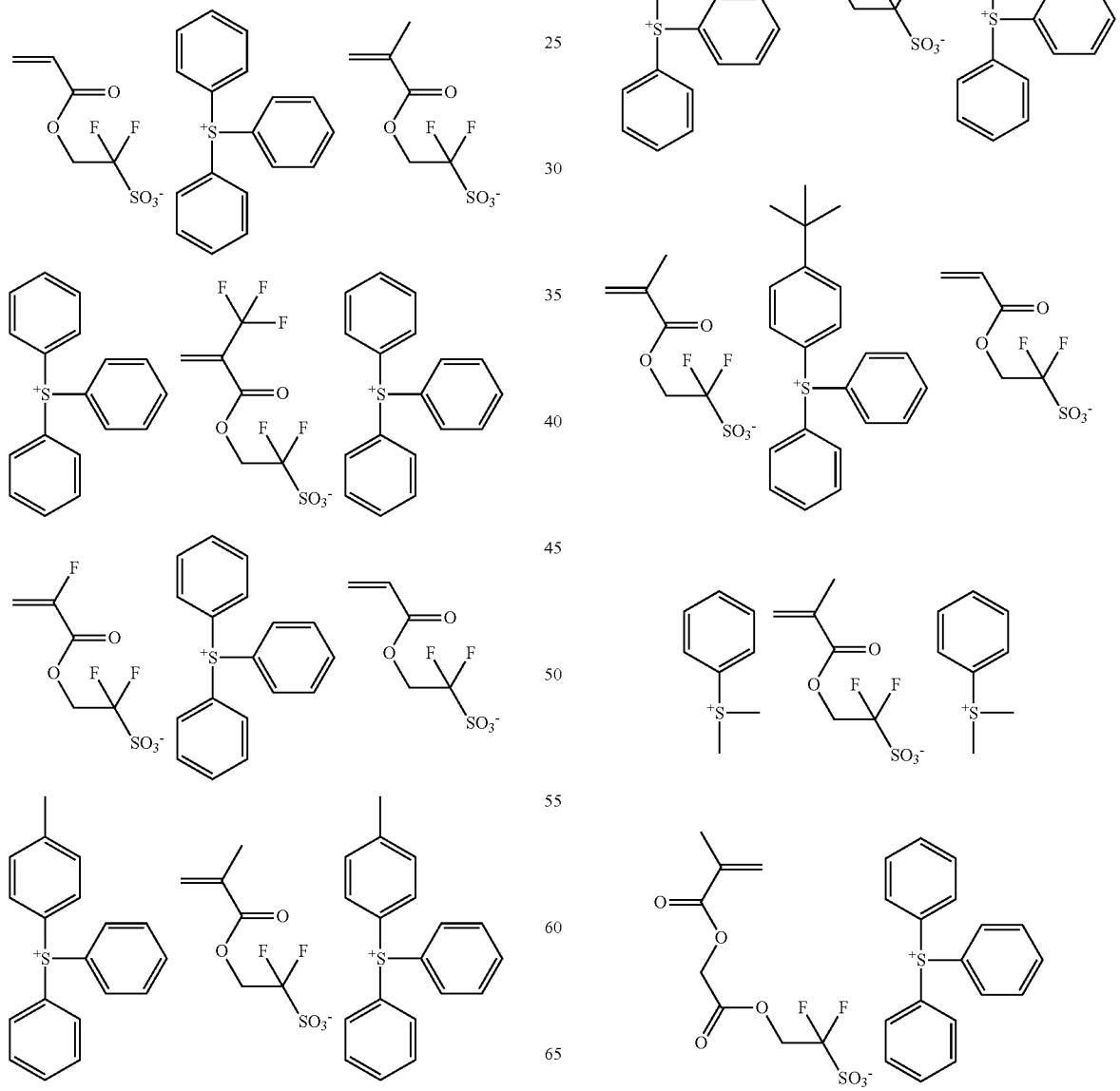

91
-continued
92
-continued
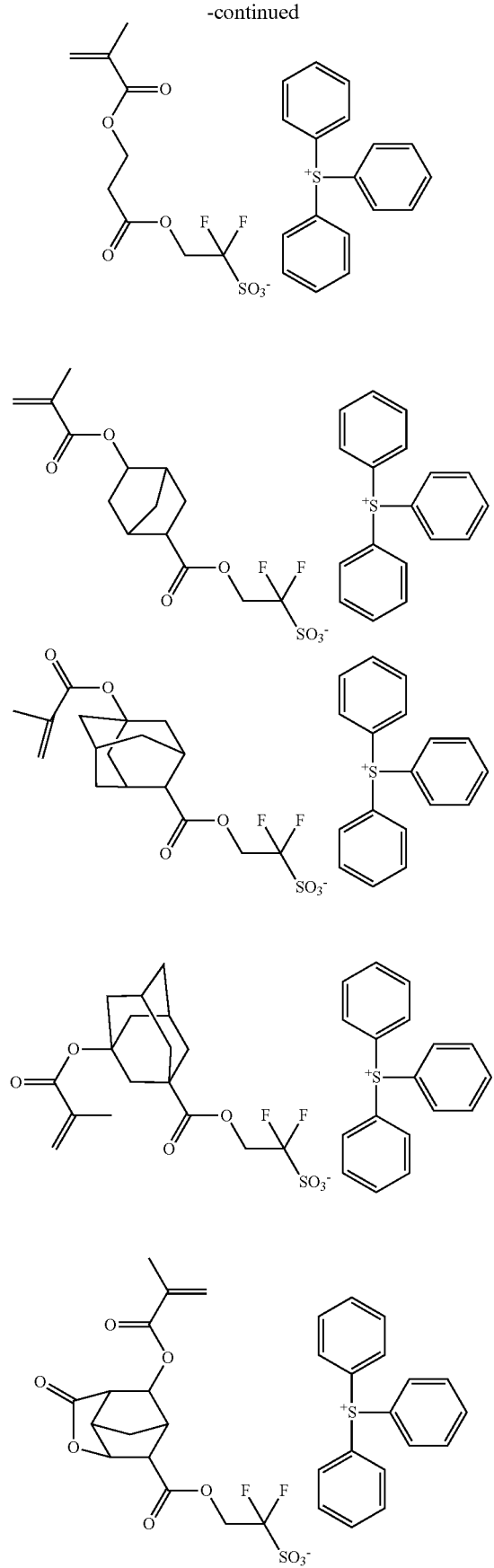
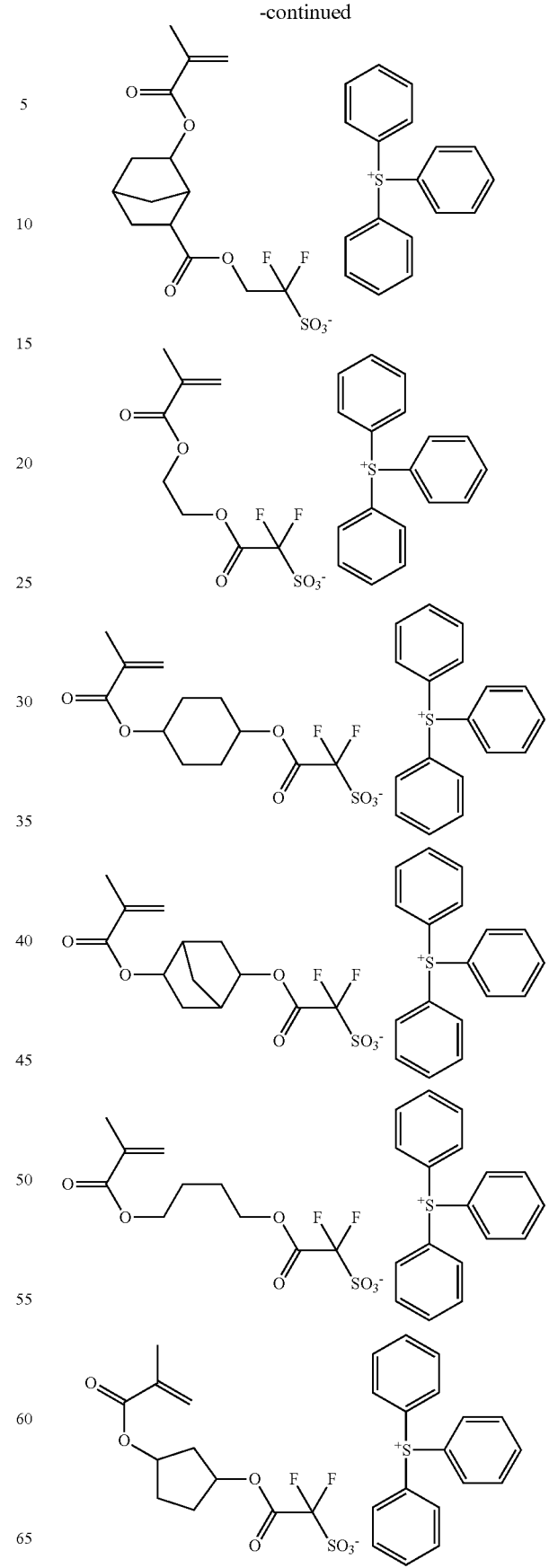

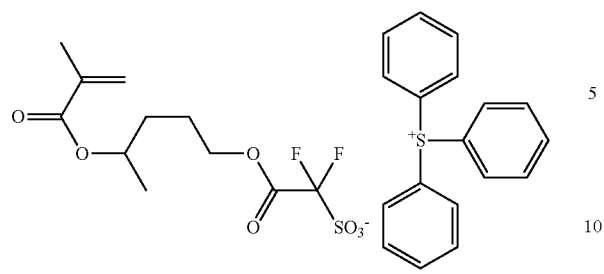
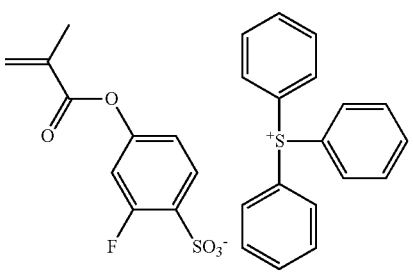
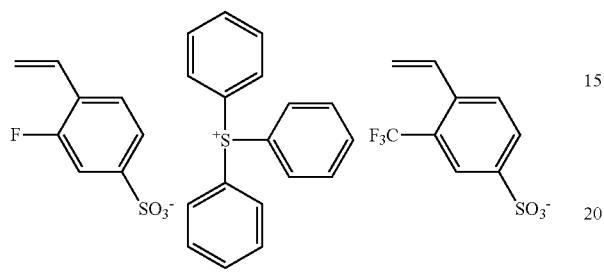
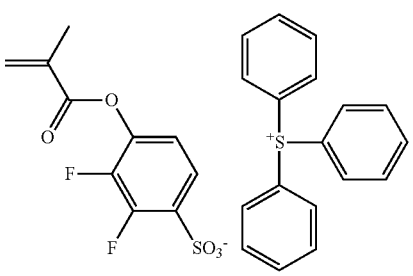
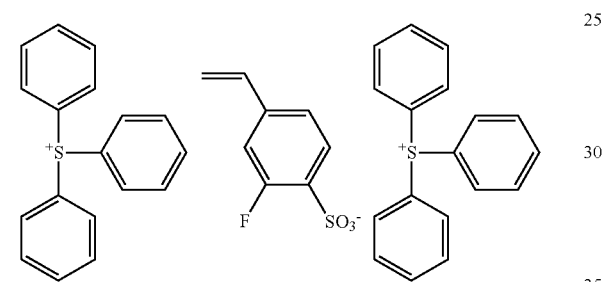
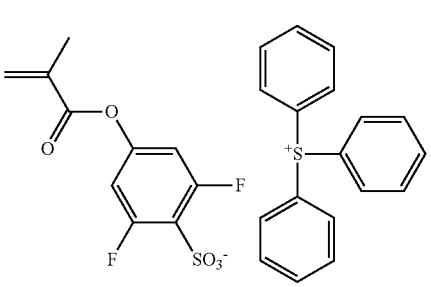
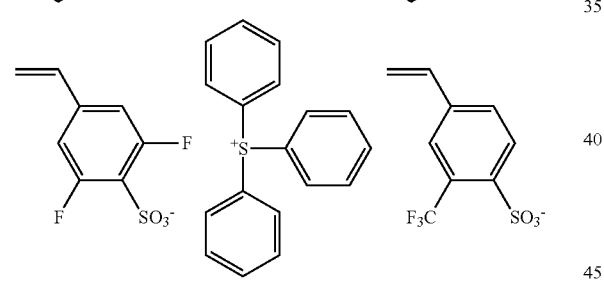
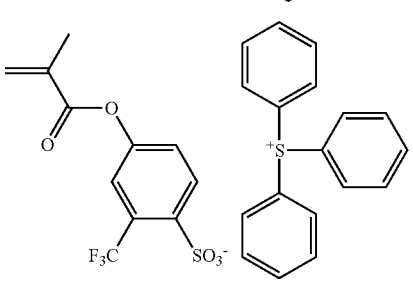
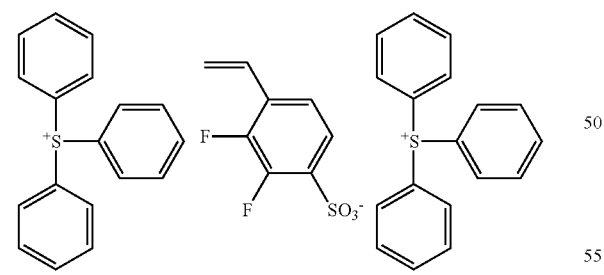
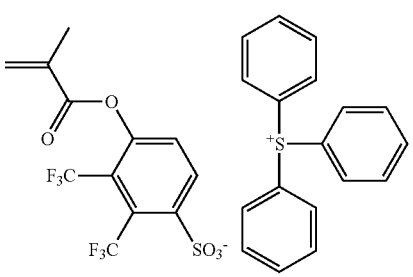
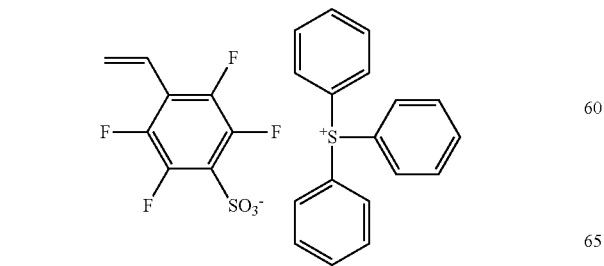
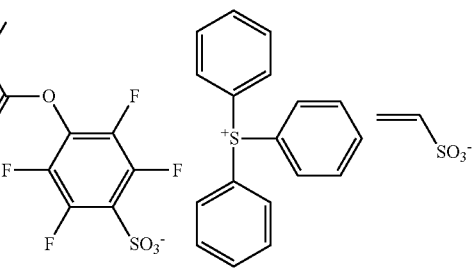

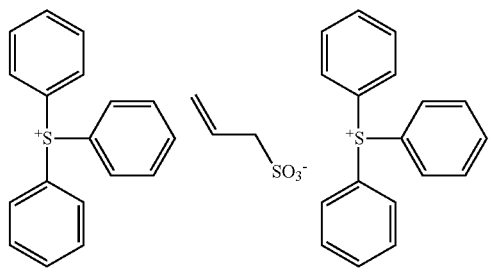
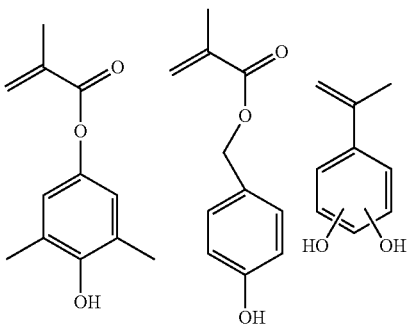

As to the base resin of the resist used in the patterning process of the present invention, it is preferable to copolymerize a repeating unit a1 having a carboxyl group thereof substituted with an acid labile group, a repeating unit a2 having a phenolic hydroxyl group thereof substituted with an acid labile group, and repeating units b1 and b2 having an acid generator of a sulfonium salt having a sulfonic acid which is bonded to a main chain; but a repeating unit c having a phenolic hydroxyl group may also be copolymerized thereto as an adhesive group.

Specific example of the monomer to obtain the repeating unit c having a phenolic hydroxyl group includes the followings.

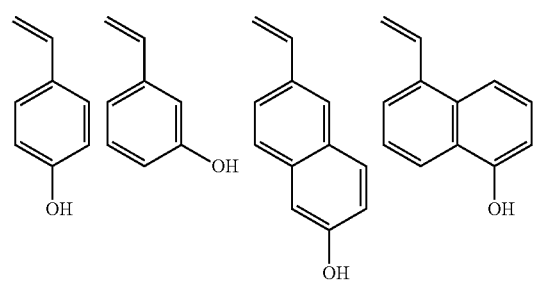
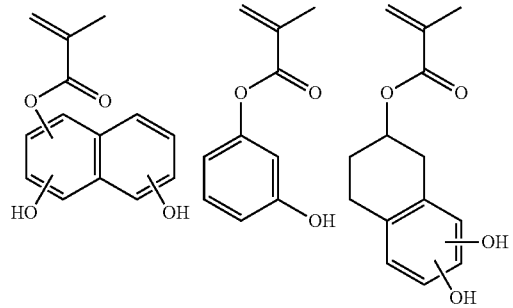
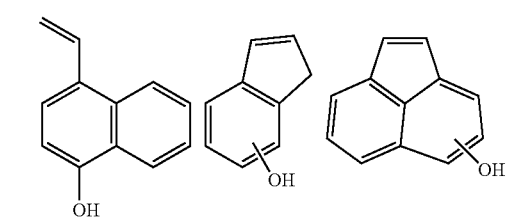
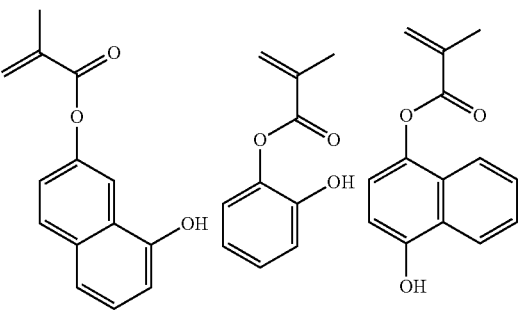

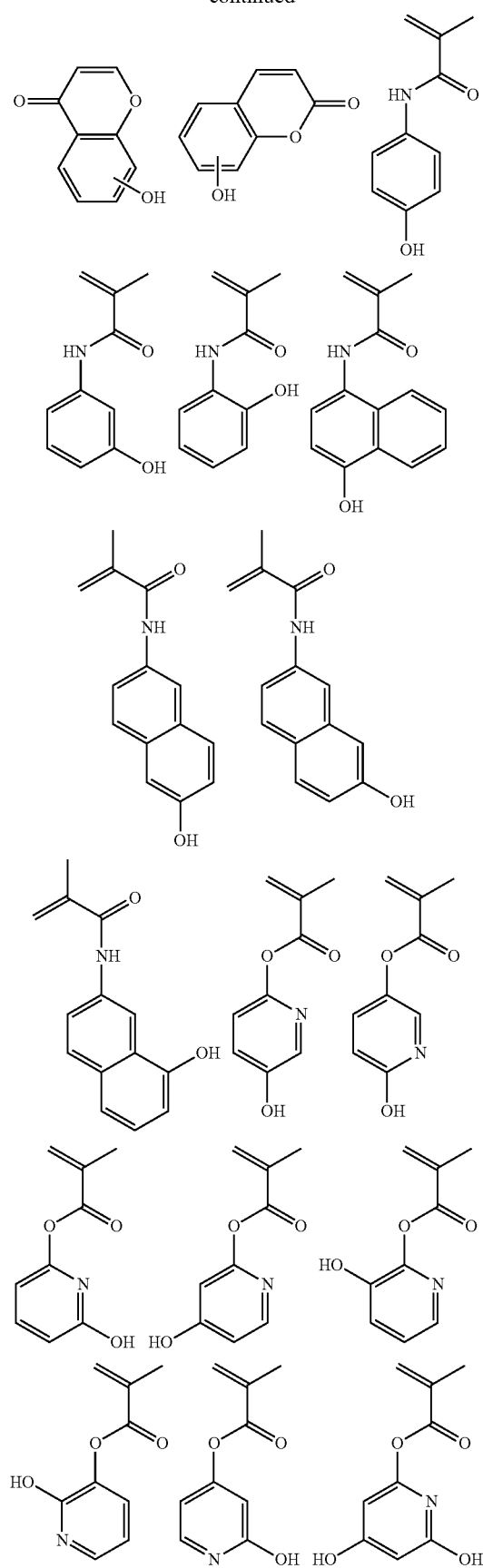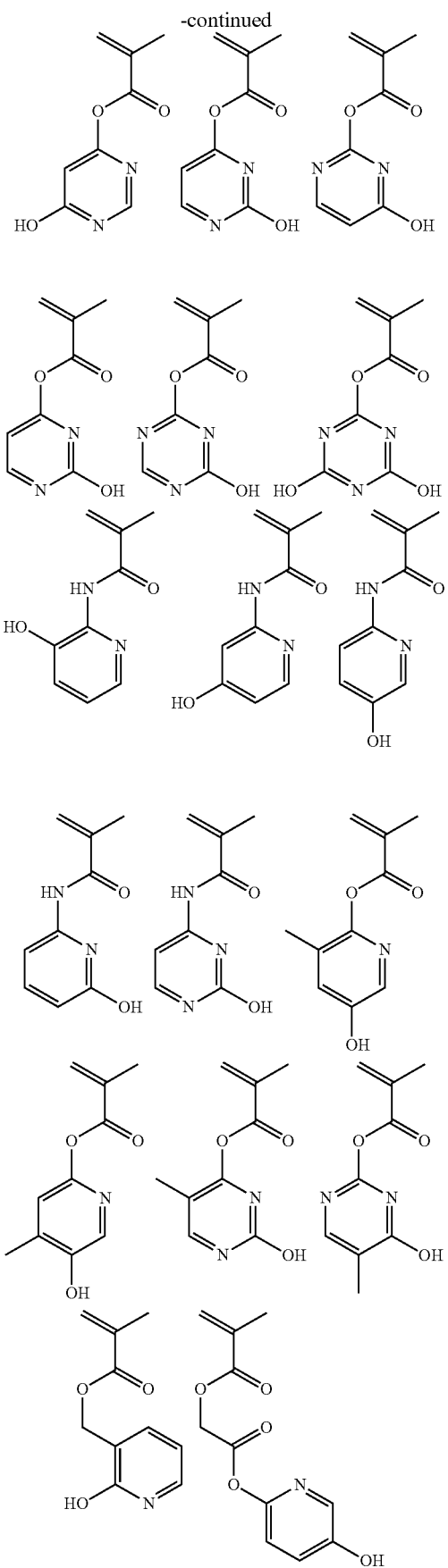

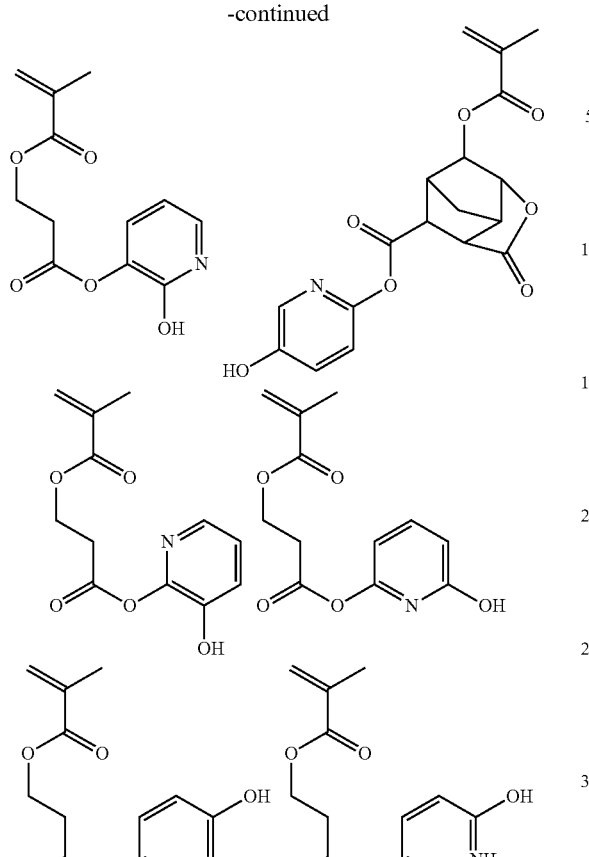

In addition, a repeating unit d having, as other adhesive groups, a hydroxyl group, a carboxyl group, a lactone ring, a carbonate group, a thiocarbonate group, a carbonyl group, a cyclic acetal group, an ether group, an ester group, a sulfonate ester group, a cyano group, an amide group, and —O—C(=O)-G- (G represents a sulfur atom or NH) may be copolymerized thereto. Specific example of the monomer to obtain the repeating unit d includes the followings.

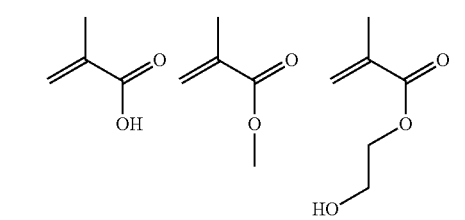

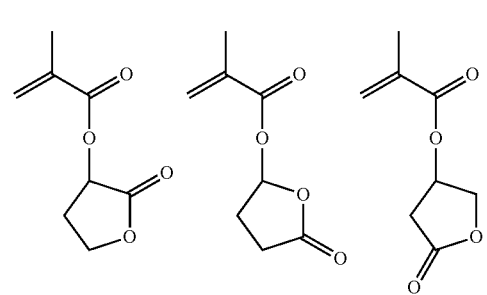

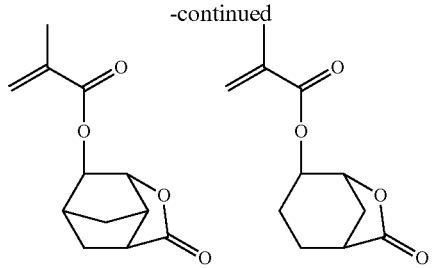

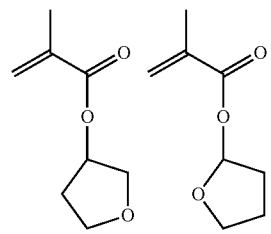

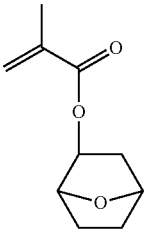

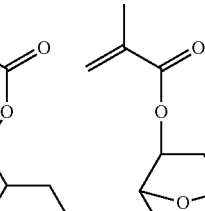

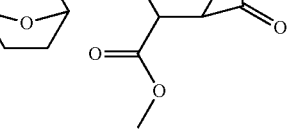

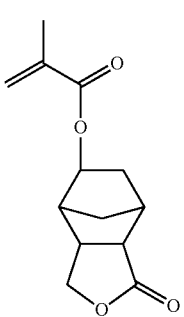

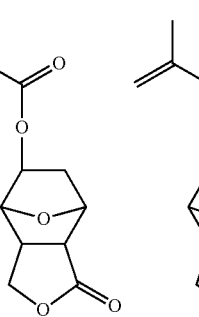

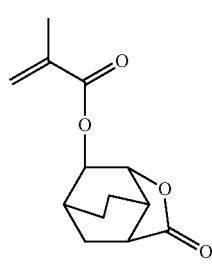

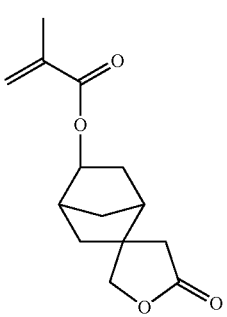

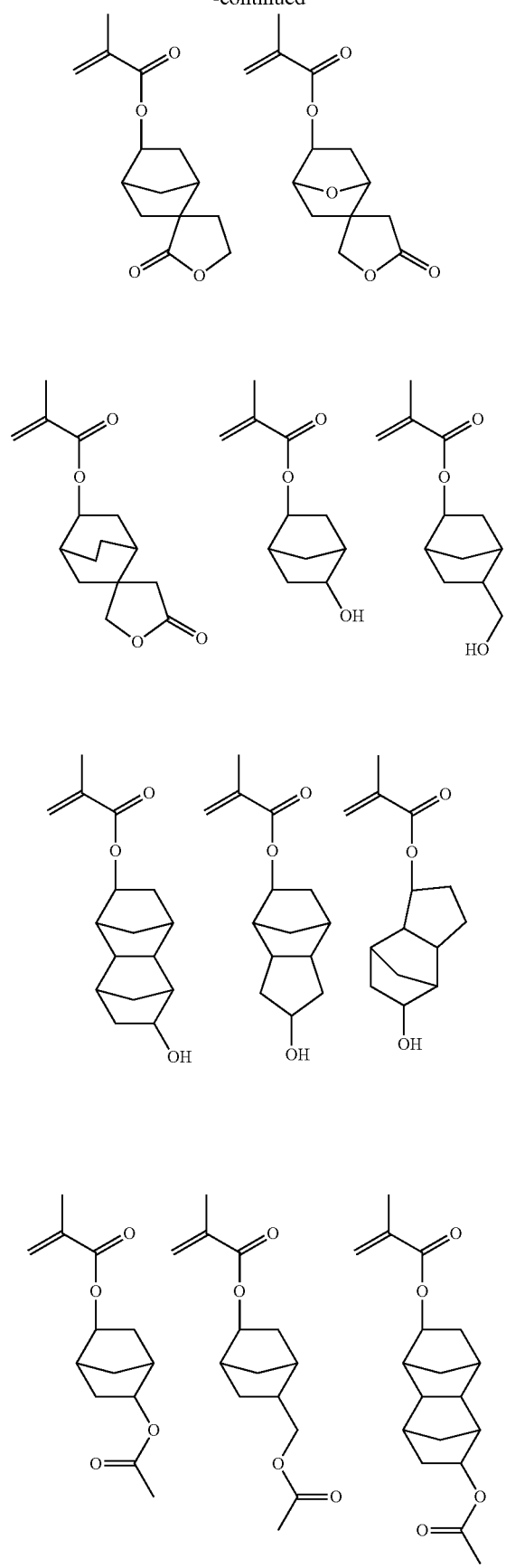
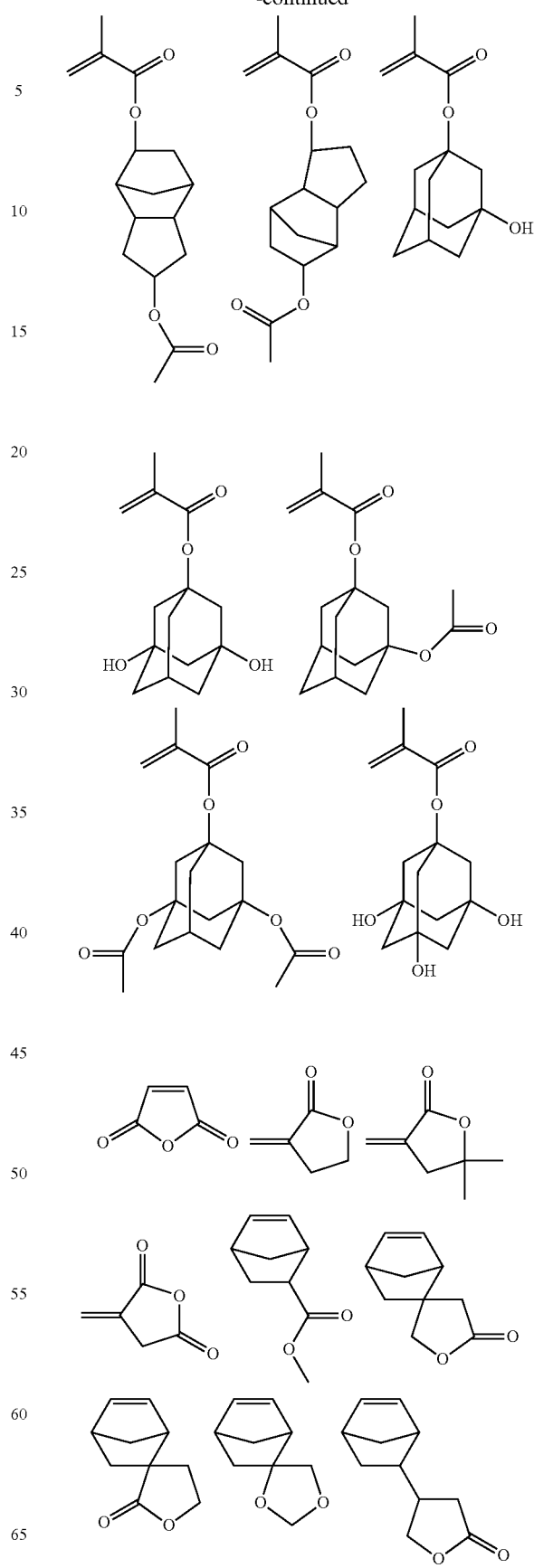

103
-continued
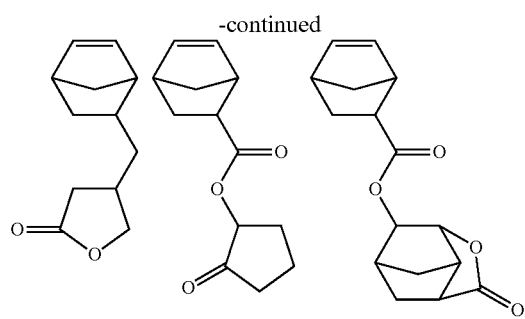
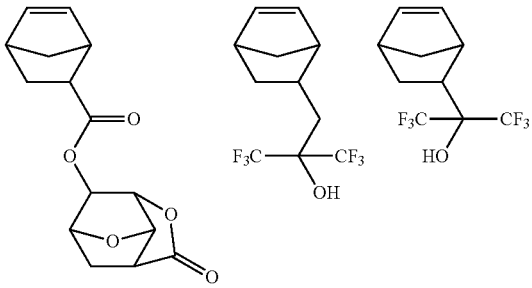
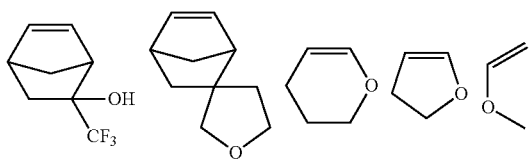
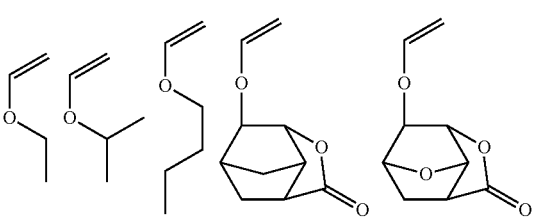
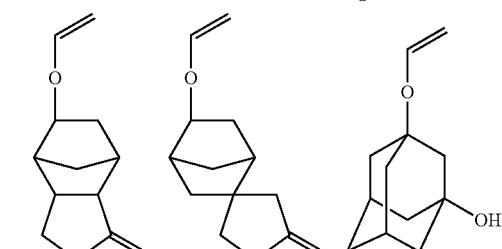
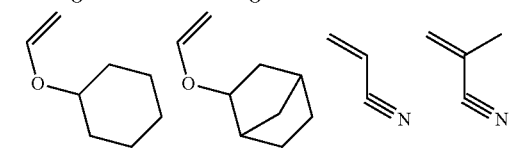
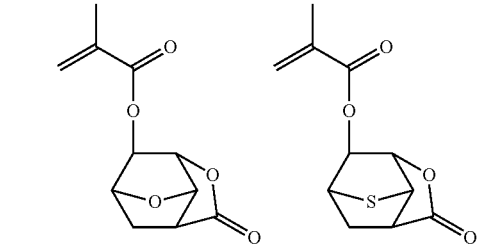
104
-continued
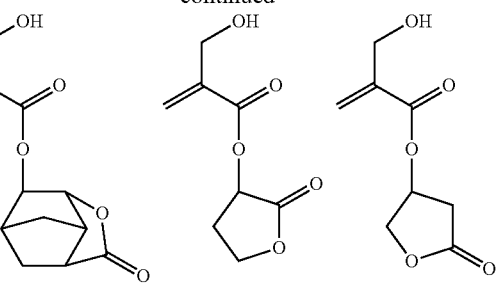
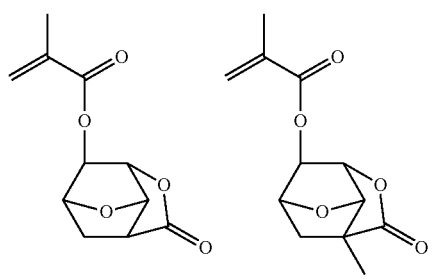
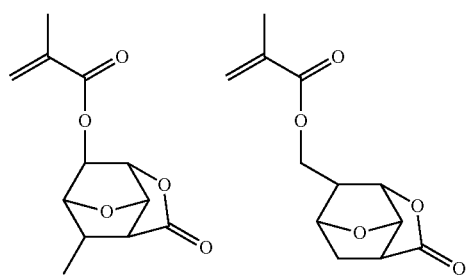
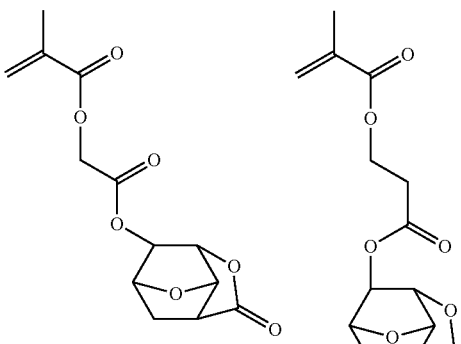
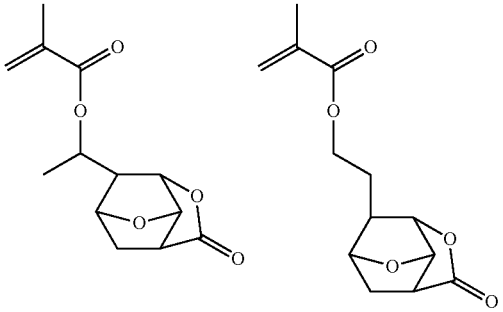

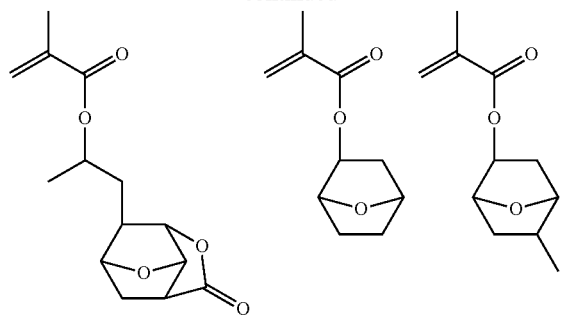
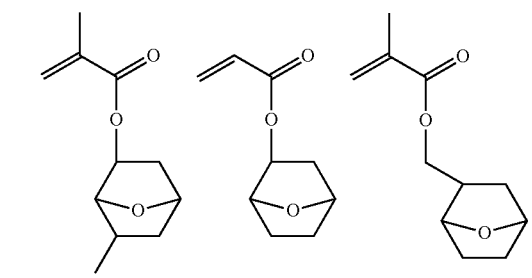
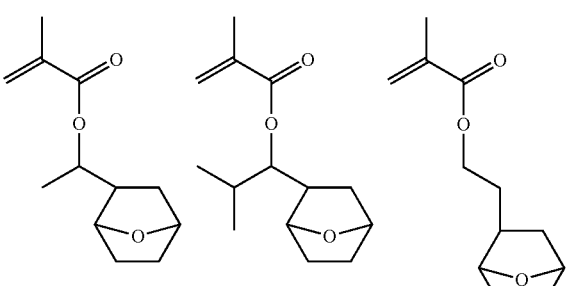
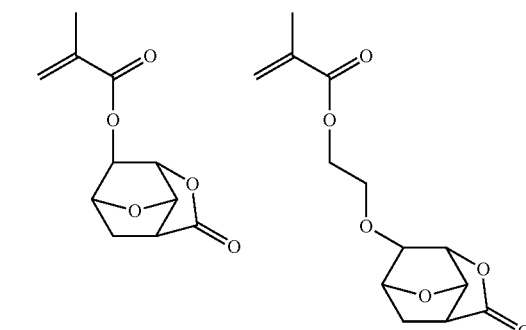
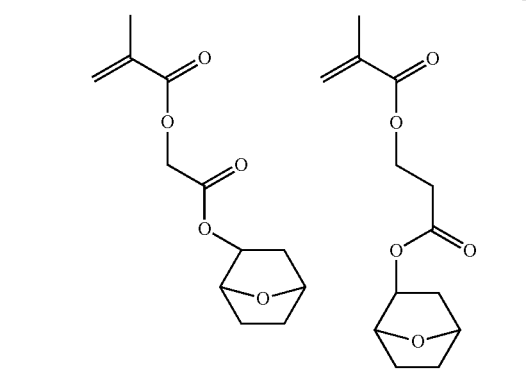
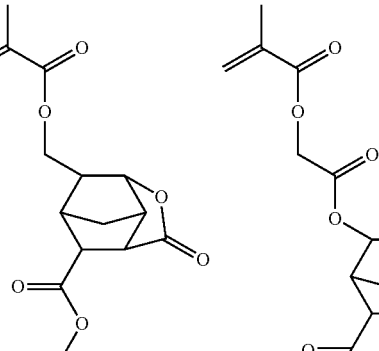
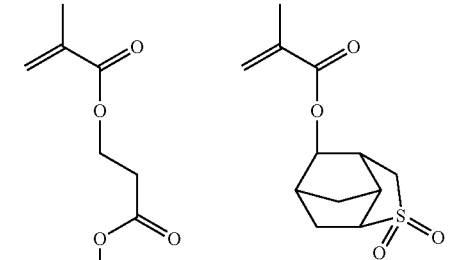
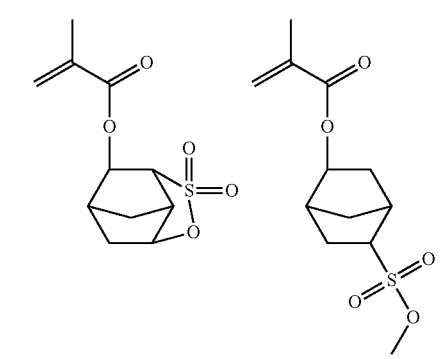
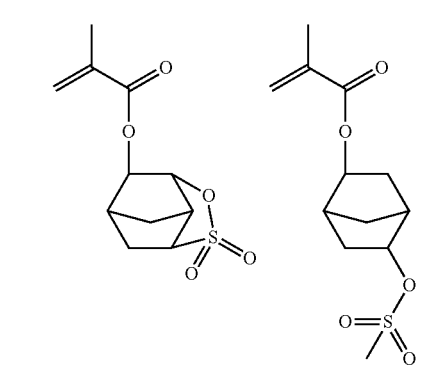

107
-continued
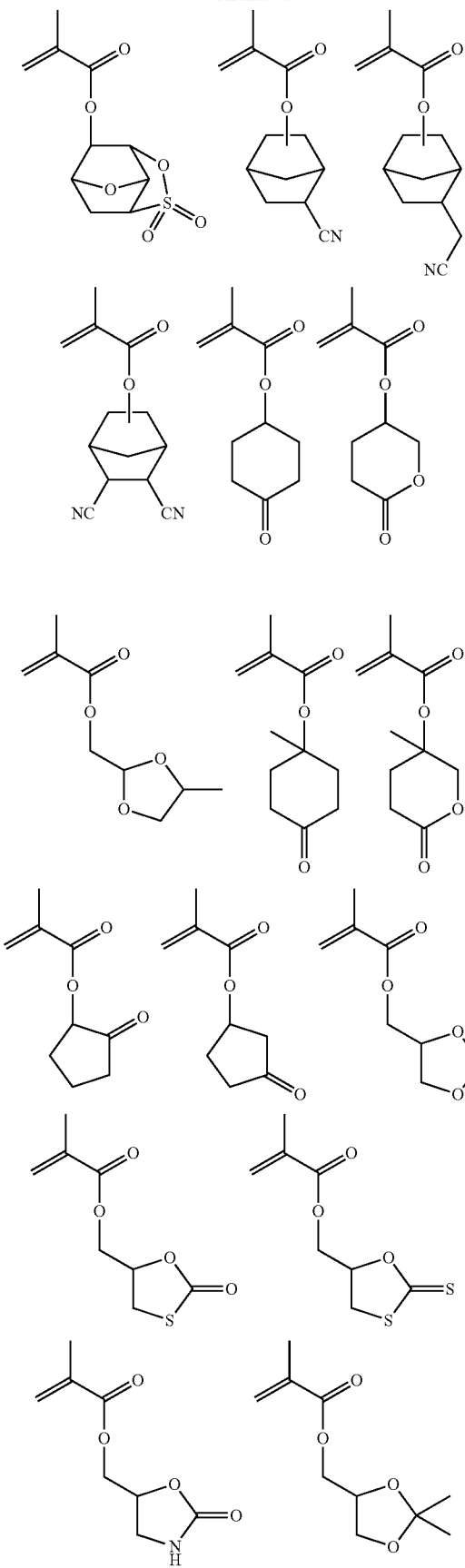
108
-continued
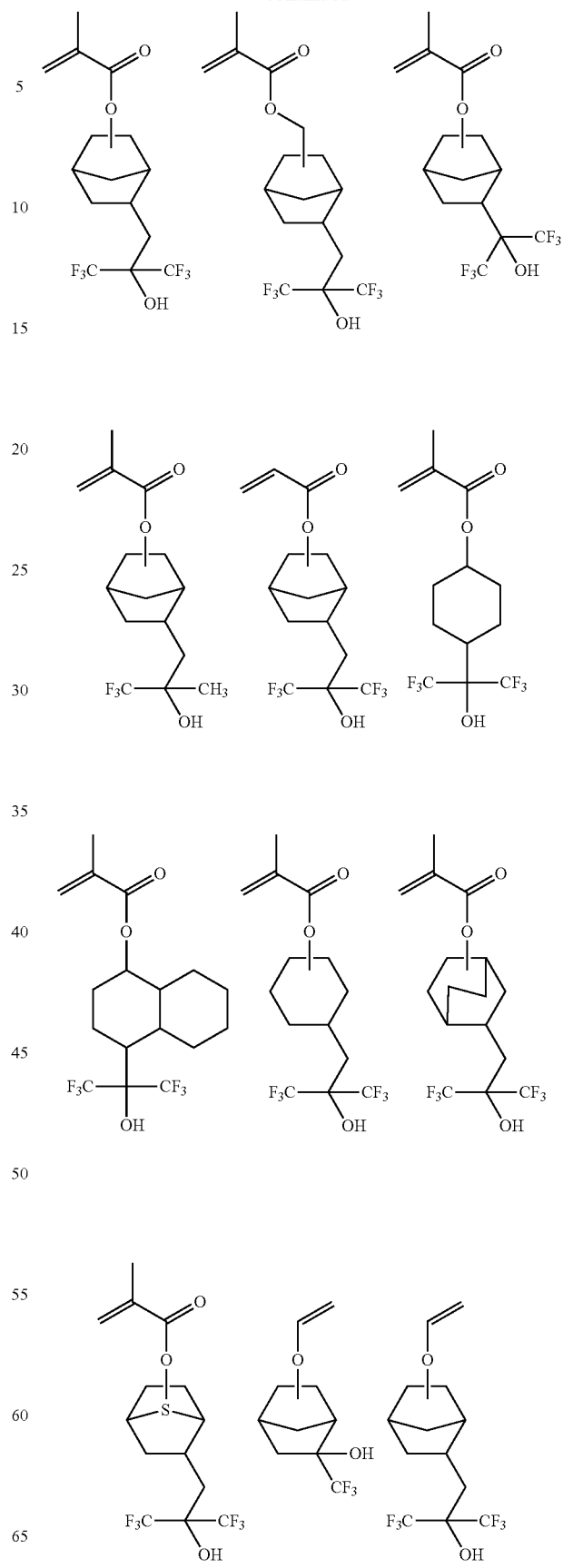

109
-continued
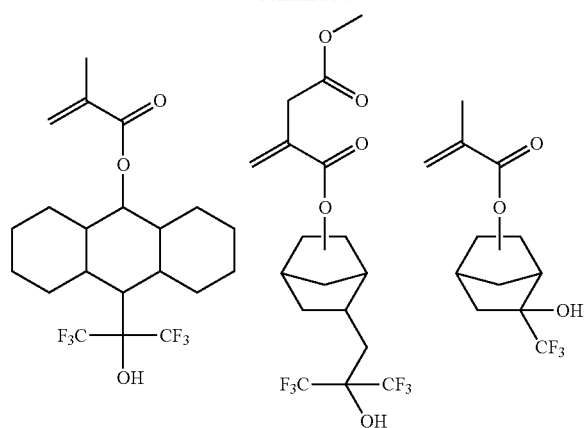
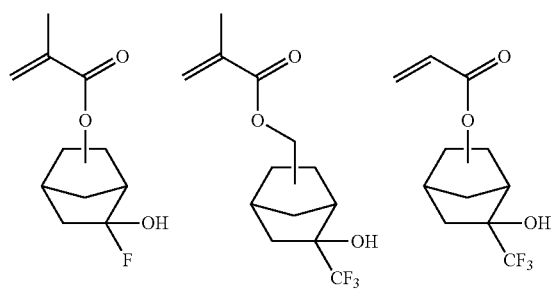
110
-continued
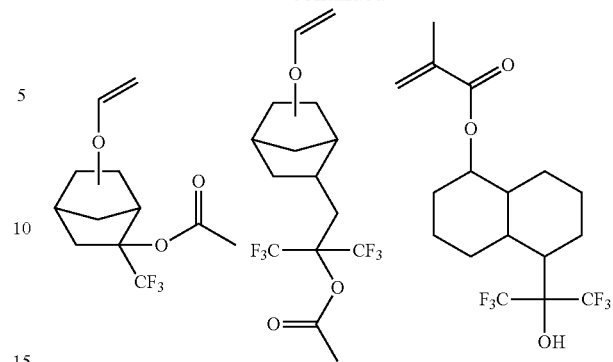
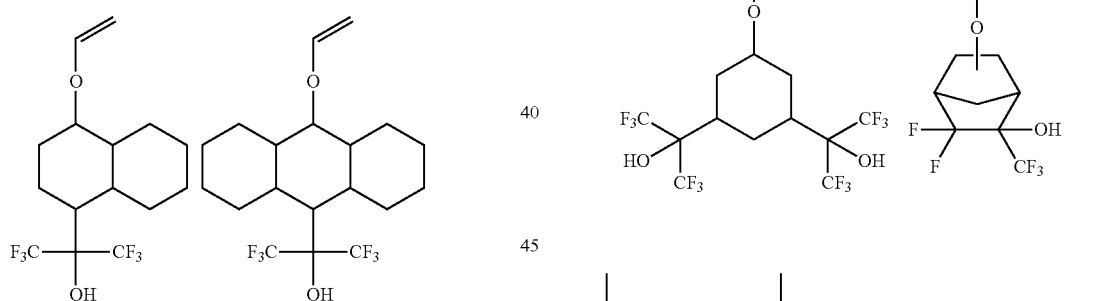
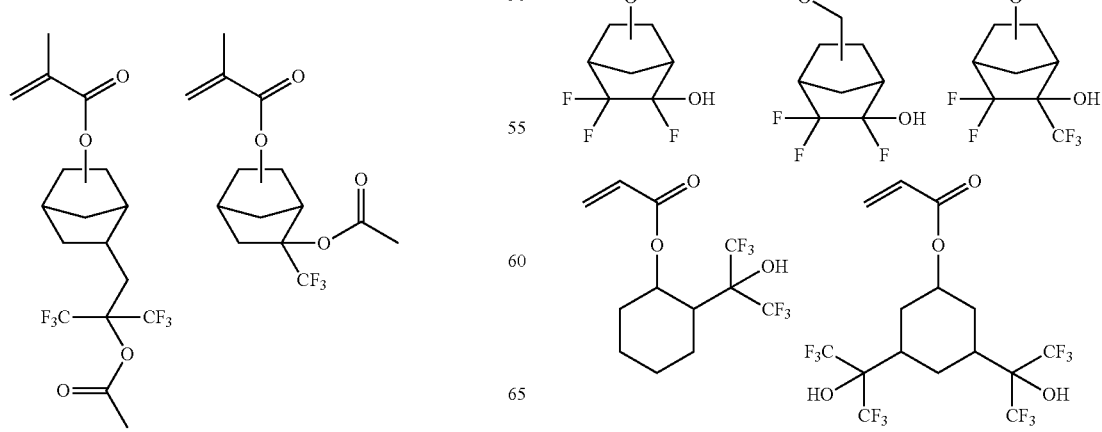

111
-continued
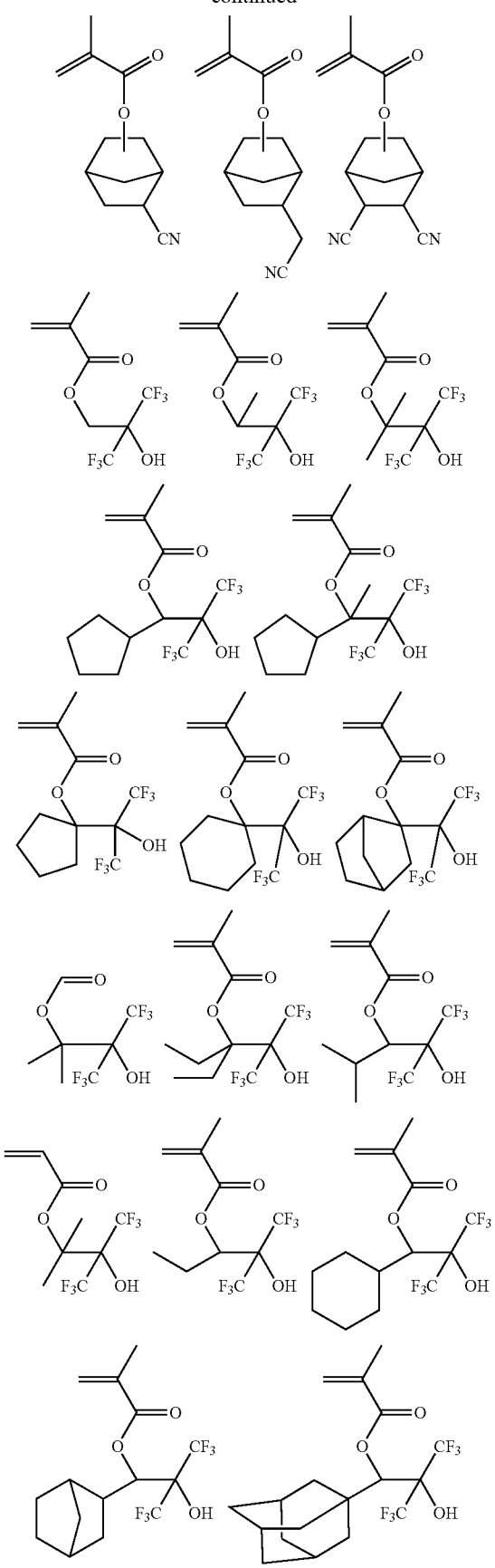
112
-continued
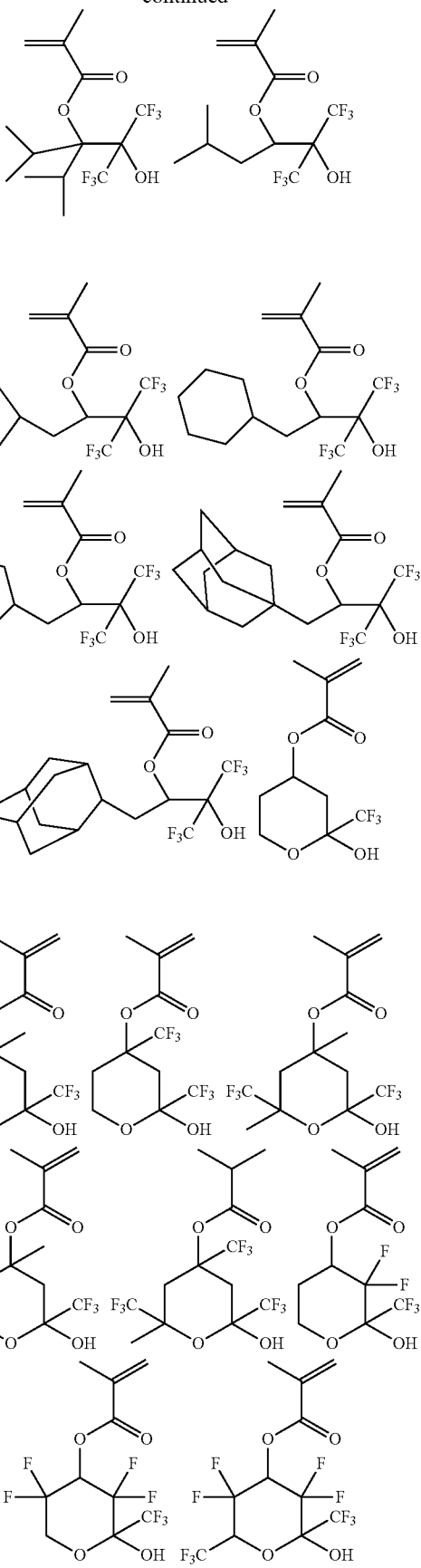

113
-continued
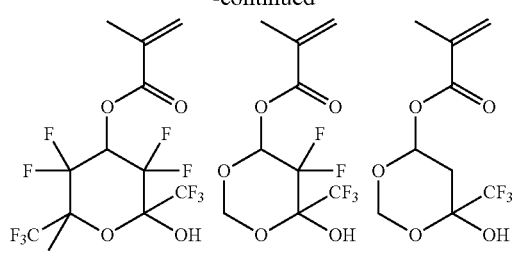
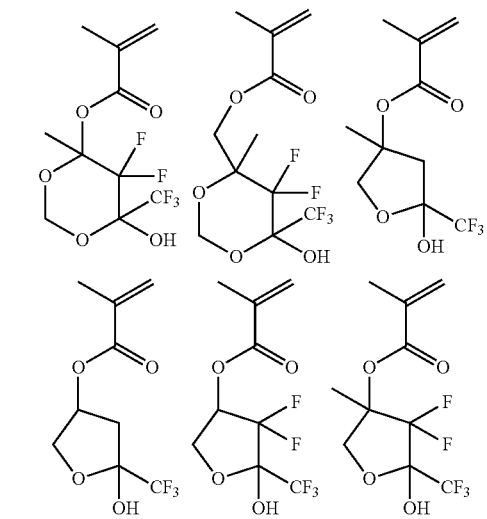
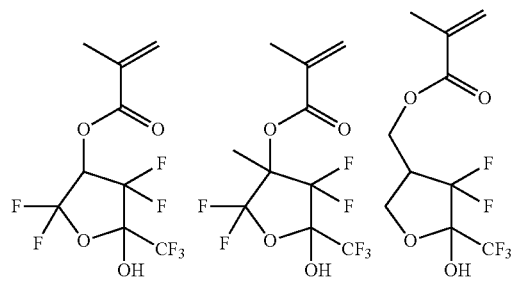
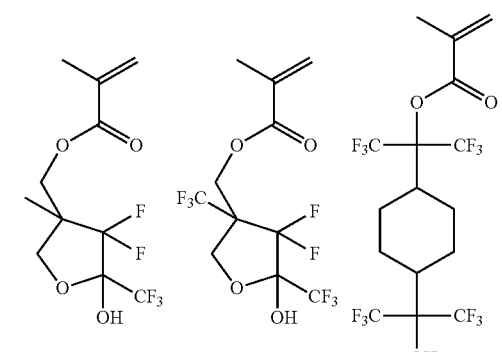
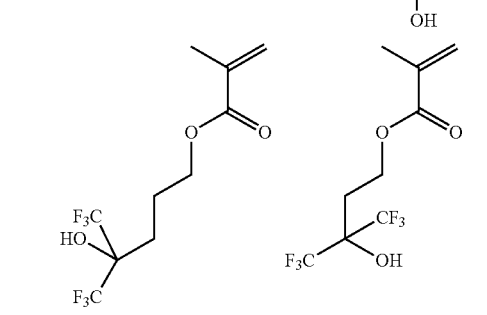
114
-continued
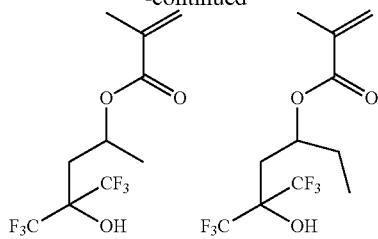
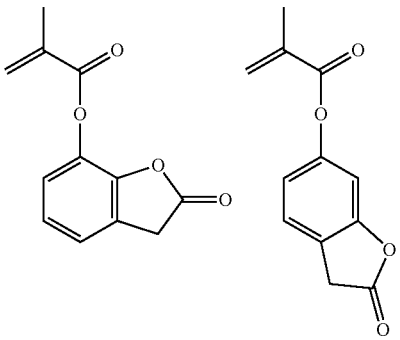
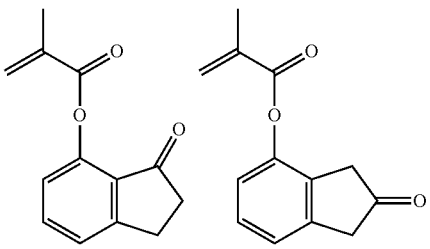
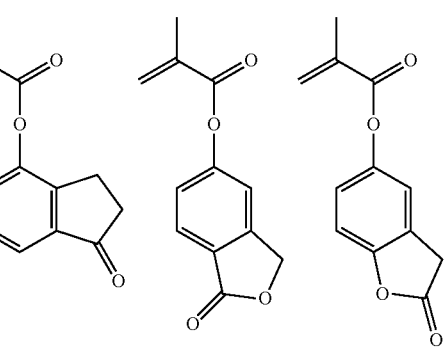
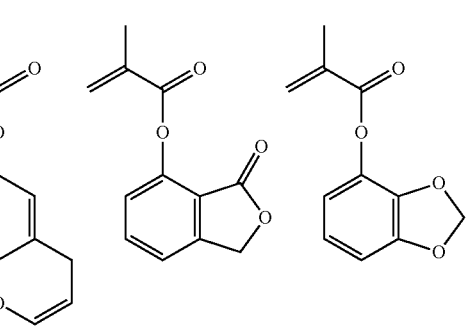

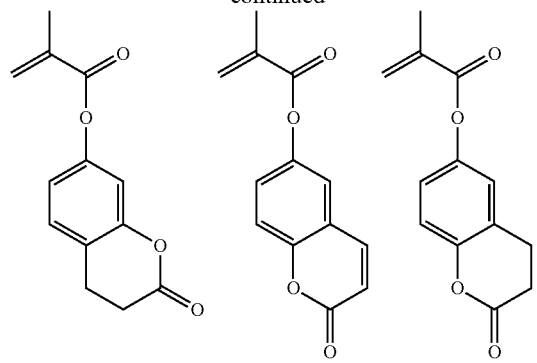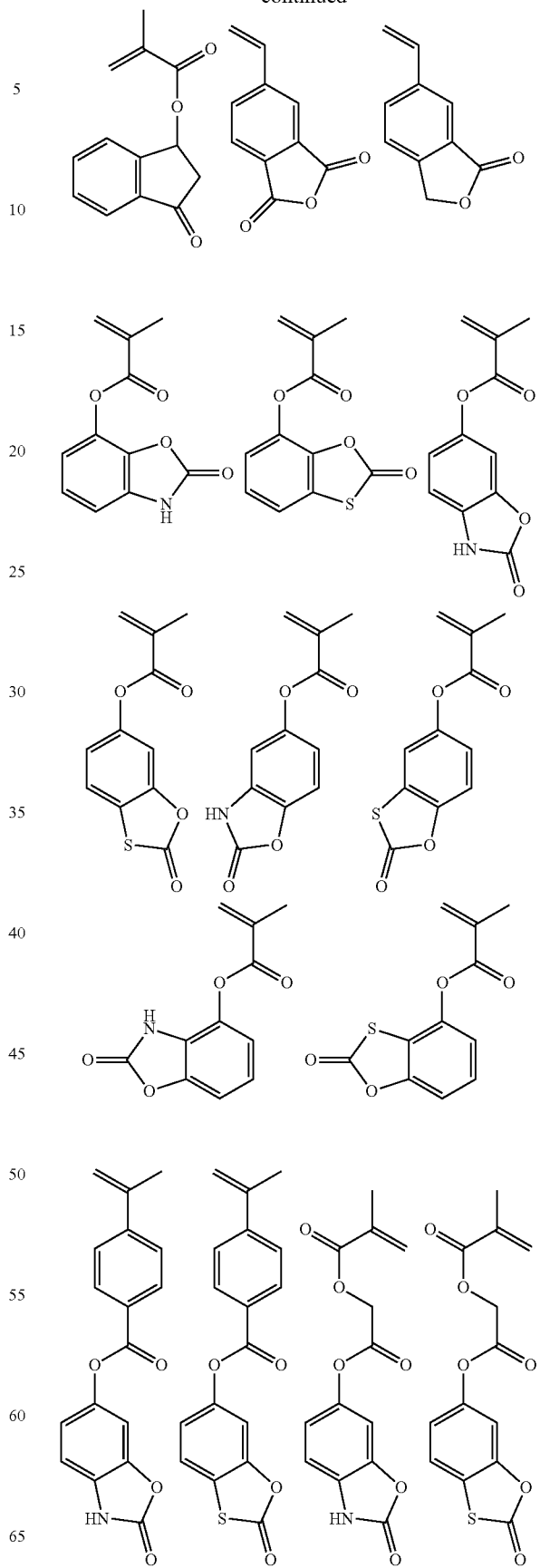

-continued

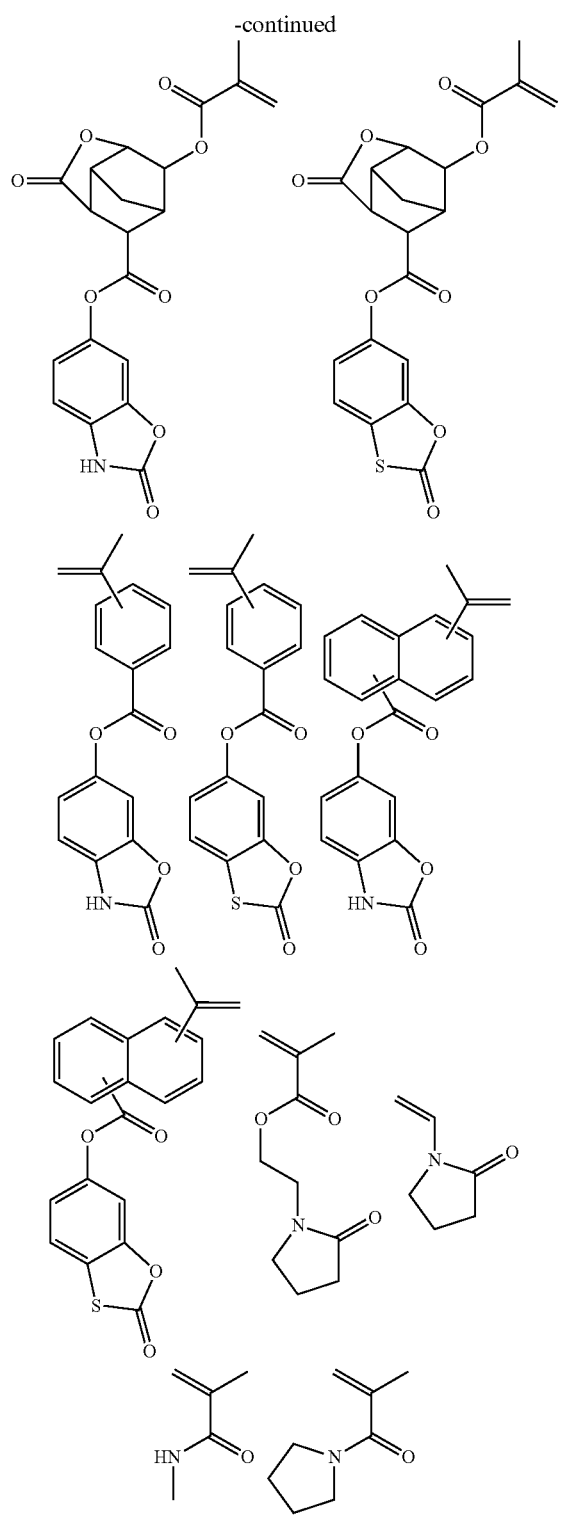

In the case of a monomer having a hydroxyl group, the hydroxyl group may be substituted during polymerization with an acetal group such as an ethoxyethoxy group, which is readily de-protected by an acid, and then de-protected by a weak acid and water after polymerization, or the hydroxyl group may be substituted with an acetyl group, a formyl group, a pivaloyl group, or the like and then hydrolyzed by alkali after polymerization.

Further, indene, benzofuran, benzothiophene, acenaphthylene, chromone, cumarin, norbornadiene, or a derivative thereof e may be copolymerized thereto, as shown below as specific examples thereof.

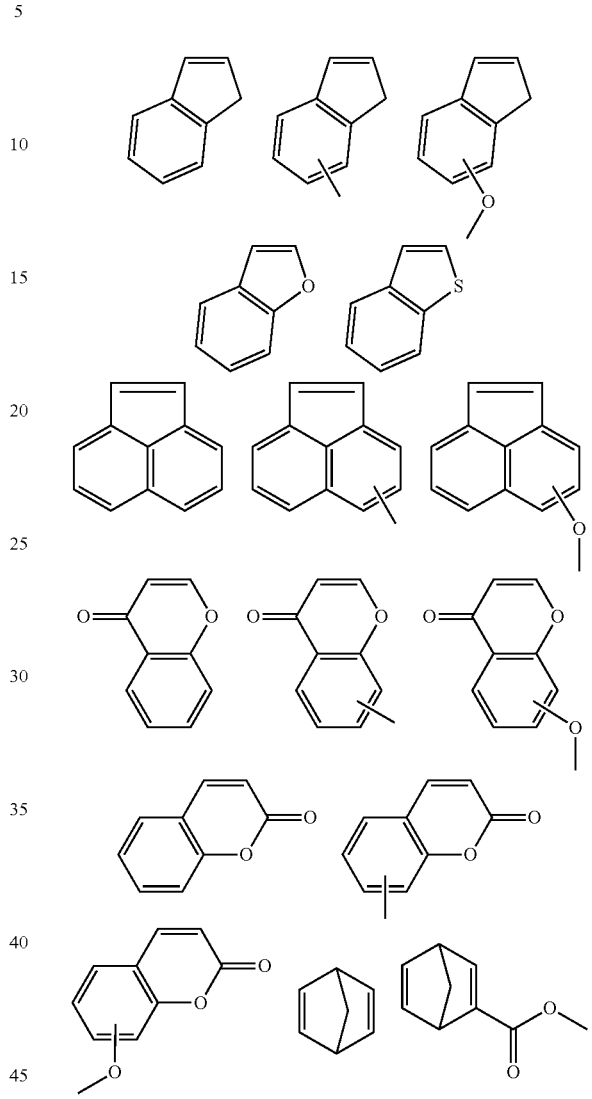

As to a repeating unit f other than the foregoing copolymerizable units, styrene, vinyl naphthalene, vinyl anthracene, vinyl pyrene, methylene indane, and so on may be mentioned.

Copolymerization ratios of a1, a2, b1, b2, c, d, e, and f used in a resist polymer which is combined with the top coat composition of the present invention are as following: $0 \leq a1 \leq 0.9$, $0 \leq a2 \leq 0.9$, $0 < a1+a2 < 1$, $0 \leq b1 \leq 0.3$, $0 \leq b2 \leq 0.3$, $0 < b1+b2 \leq 0.3$, $0 \leq c < 1.0$, $0 \leq d < 1.0$, $0 \leq e < 1.0$, $0 \leq f < 1.0$, and $0.7 \leq a1+a2+b1+b2+c+d \leq 1.0$; preferably $0 \leq a1 \leq 0.8$, $0 \leq a2 \leq 0.8$, $0.1 \leq a1+a2 \leq 0.8$, $0 \leq b1 \leq 0.5$, $0 \leq b2 \leq 0.5$, $0.02 \leq b1+b2 \leq 0.5$, $0 \leq c \leq 0.8$, $0 \leq d \leq 0.8$, $0 \leq e \leq 0.5$, $0 \leq f \leq 0.5$, and $0.8 \leq a1+a2+b1+b2+c+d \leq 1.0$; or more preferably $0 \leq a1 \leq 0.7$, $0 \leq a2 \leq 0.7$, $0.1 \leq a1+a2 \leq 0.7$, $0 \leq b1 \leq 0.4$, $0 \leq b2 \leq 0.4$, $0.02 \leq b1+b2 \leq 0.4$, $0 \leq c \leq 0.7$, $0 \leq d \leq 0.7$, $0 \leq e \leq 0.4$, $0 \leq f \leq 0.4$, and $0.85 \leq a1+a2+b1+b2+c+d \leq 1.0$.

In one method to synthesize these polymers, for example, monomers to give repeating units shown by a1, a2, b1, b2, d, e, and f are polymerized thermally in the presence of a radical polymerization initiator in an organic solvent to obtain a copolymer of the polymer.

Illustrative example of the organic solvent used at the time of polymerization includes toluene, benzene, tetrahydrofuran, diethyl ether, and dioxane. Illustrative example of the polymerization initiator includes 2,2'-azobisisobutyronitrile (AIBN), 2,2'-azobis(2,4-dimethylvaleronitrile), dimethyl 2,2'-azobis(2-methylpropionate), benzoyl peroxide, and lauroyl peroxide, wherein polymerization may be performed by heating, preferably at 50 to 80° C. The reaction time thereof is 2 to 100 hours, or preferably 5 to 20 hours.

Alternatively, in the case of copolymerizing a hydroxystyrene or a hydroxyvinylnaphthalene, an acetoxystyrene or an acetoxyvinylnaphthalene is used in place of a hydroxystyrene or a hydroxyvinylnaphthalene; and after polymerization, the forgoing acetoxy groups are de-protected by an alkaline hydrolysis as mentioned above to give the hydroxystyrene or the hydroxyvinylnaphthalene.

Illustrative example of the base used during the alkaline hydrolysis includes an aqueous ammonia and triethylamine. The reaction temperature thereof is −20 to 100° C., or preferably 0 to 60° C.; and the reaction time thereof is 0.2 to 100 hours, or preferably 0.5 to 20 hours.

In the polymer used in the resist composition, the weight-average molecular weight thereof is 1000 to 500000, or preferably 2000 to 30000, respectively. If the weight-average molecular weight is 1000 or more, a resist composition having good heat resistance can be obtained, while if it is 500000 or less, an alkaline-dissolvability thereof is not deteriorated whereby not causing a phenomenon of a footing profile after patterning.

In the polymer used in the resist composition, if the molecular weight distribution (Mw/Mn) of a multicomponent copolymer is wide, foreign matters may appear on a pattern after exposure, or a pattern profile may be deteriorated, because a polymer of a low molecular weight and a polymer of a high molecular weight exist. Therefore, in accordance with progress of miniaturization in the pattern rule, effects of the molecular weight and the molecular weight distribution as mentioned above are prone to be larger; and thus, the molecular weight distribution of a multicomponent copolymer to be used is preferably in the range of 1.0 to 2.0, or especially in the narrow dispersion range of 1.0 to 1.5 to obtain a resist composition which can be suitably used in a fine pattern size.

A polymer shown here is suitable as a base resin of especially a positive resist composition. When a positive resist composition is formed by using, as a base resin, a polymer like this, and by appropriately blending thereof, in accordance with an intended purpose, with an organic solvent, an acid generator, a dissolution inhibiting agent, a basic compound, a surfactant, and so on, dissolution rate of the polymer into a developer is accelerated by a catalytic reaction in the exposed part thereof whereby giving a highly sensitive positive resist composition which has high dissolution contrast and resolution of the resist film, a large exposure margin, an excellent process adaptability, an excellent etching resistance while having a good pattern profile after exposure, and a small coarseness-fineness size difference especially because of a controlled acid diffusion; and thus, the composition thereof has a high practical value and is highly useful as a resist composition especially for a very-large-scale integrated circuit. Especially if this is used in a chemically amplified positive resist composition containing an acid generator whereby utilizing an acid-catalyzed reaction, even higher sensitivity and excellent properties can be obtained; and thus, this is extremely useful.

Figure 2:
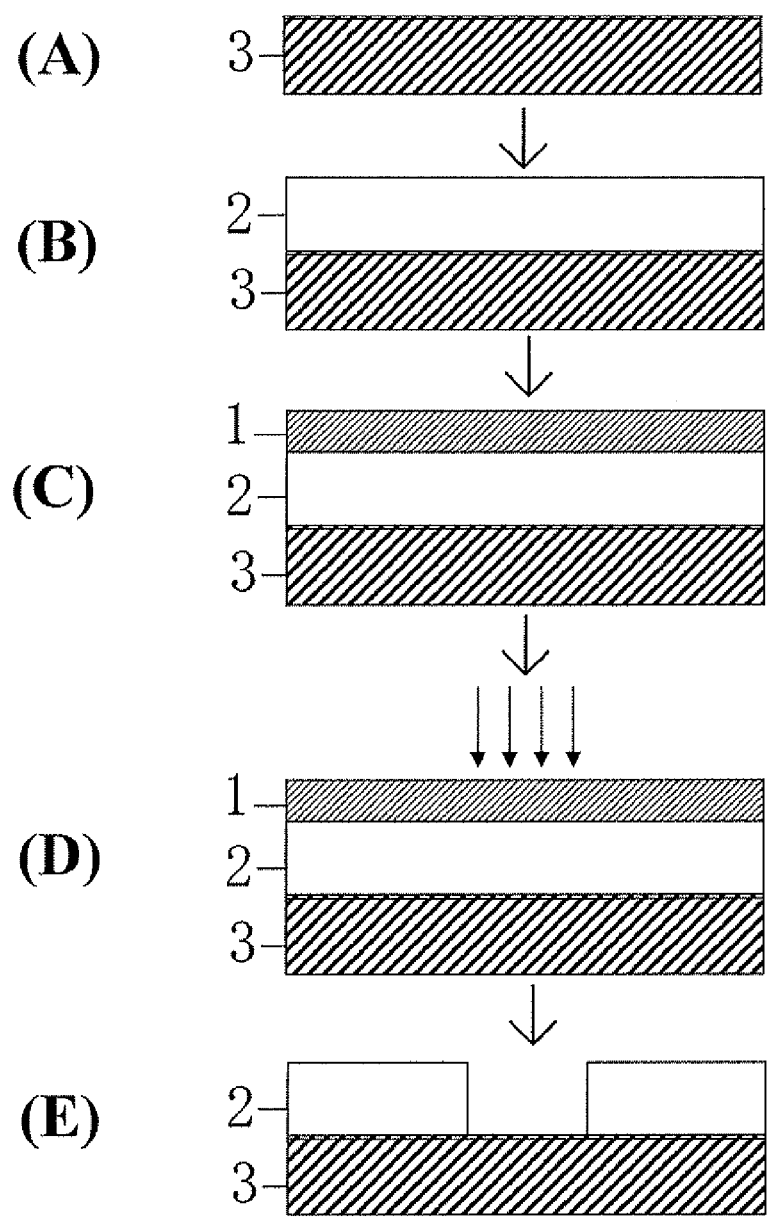
FIG. 2 is a flow diagram showing a patterning process by using the resist top coat of the present invention.

Next, explanation will be made on the patterning process using the resist top coat composition of the present invention. As shown in FIG. 2, in the patterning process of the present invention, at least, photoresist film 2 is formed on wafer 3 (FIGS. 2(A) and 2(B)), and then on the photoresist film 2 is formed resist top coat 3 by using the resist top coat composition (FIG. 2(C)); and then, after exposure (FIG. 2(D)), development is performed (FIG. 2(E)). In this development, it is preferable that development of the photoresist film 2 and removal of the resist top coat 1 are performed by using an alkaline developer.

That is, firstly, the photoresist film 2 is formed on the wafer 3 (FIGS. 2(A) and 2(B)). This film may be formed, such as for example, by a spin coating method. At this time, to reduce dispense amount of the photoresist film composition during spin coating, it is preferable that the photoresist film composition be dispensed by spin coating under the state of the substrate being wetted by a solvent for the photoresist or by a solution mixed with the solvent for the photoresist (see for example, Japanese Patent Laid-Open Publication No. H09-246173). By doing so, spreading property of the photoresist film composition solution onto the wafer 3 can be improved so that dispense amount of the photoresist film composition can be reduced. Meanwhile, in the photoresist film composition, a composition containing a polymer comprising the repeating units a1, a2, b1, and b2 may be used as the base for the composition.

Film thickness of the photoresist film 2 is preferably in the range of 10 to 500 nm, in particular 20 to 300 nm (FIG. 2(C)).

Then, the resist top coat 1 is formed on the photoresist film 2 by using the resist top coat composition of the present invention.

This film may be formed, such as for example, by a spin coating method. In spin coating of the resist top coat composition too, the same process as the photoresist film 2 as mentioned above may be used; and thus, the resist top coat composition may be applied after surface of the photoresist film 2 is wetted by a solvent before application of the resist top coat composition. Film thickness of the resist top coat 3 thus formed is preferably in the range of 2 to 200 nm, in particular 5 to 50 nm. To wet surface of the photoresist film 2 by a solvent, a rotation coating method and a vapor prime method may be used, though a rotation coating method may be used more preferably. As to the solvent used during this process, a solvent not dissolving the photoresist film 2 is selected preferably from a higher alcohol, an ether solvent, and a fluorinated solvent as mentioned before.

The alkaline-dissolution rate of the resist top coat 1 of the present invention is preferably 3 nm/second or higher, or more preferably 5 nm/second or higher.

After the resist top coat 1 is formed on the resist film 2, exposure is performed (FIG. 2(D)), Wavelength of the exposing light is in the range of 3 to 15 nm, or an electron beam may be used in the exposure.

Environment during the exposure is preferably a vacuum environment; and the exposure is performed preferably by using a light with the wavelength of 3 to 15 nm, or an electron beam. Especially when exposure is performed by using EUV or EB, exposure to both EUV and EB may be performed under vacuum.

After the exposure, baking (post-exposure bake: PEB) is performed as necessary, followed by development (FIG. 2(E)).

In the development process, for example, development is performed in an alkaline developer for 3 to 300 seconds. As to the alkaline developer, an aqueous tetramethylammonium hydroxide solution with the concentration thereof being 2.38% by mass is widely used. An aqueous tetrabutylammonium hydroxide solution may also be used in place of the aqueous tetramethylammonium hydroxide solution.

In this case, it is preferably that, in the development process, the development be performed by the alkaline developer to form the resist pattern on the photoresist film 2, and at the same time the resist top coat 3 on the photoresist film 2 be removed. By doing so, removal of the resist top coat can be performed more conveniently without additionally installing a removal equipment to an existing equipment.

Meanwhile, in addition to the process steps mentioned above, various process steps such as etching, resist removal, washing, and so forth may be performed.

Further, when etching is performed by using the pattern-formed resist film as a mask, an intended pattern can be formed on the substrate 3.

EXAMPLES

Hereinbelow, the present invention specifically explained by showing Examples and Comparative Examples; but the present invention is limited to the following Examples.

Materials shown below were arranged as truxene compounds for the resist top coat of the present invention.

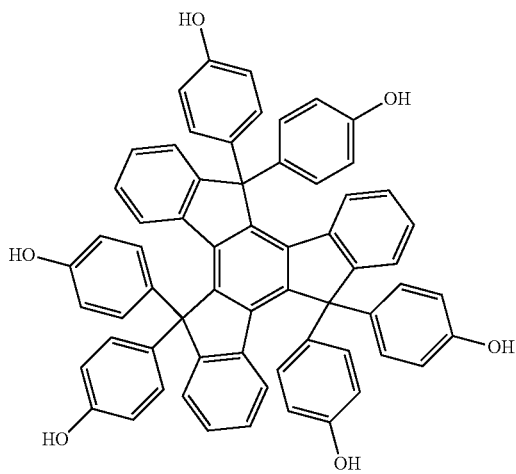

truxene compound 1

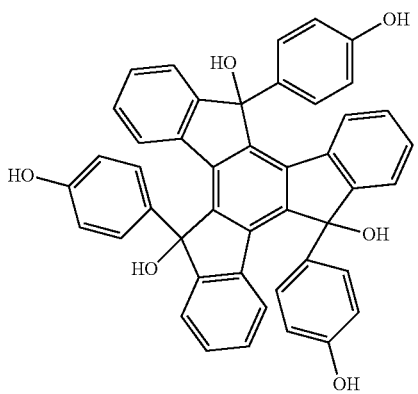

truxene compound 2

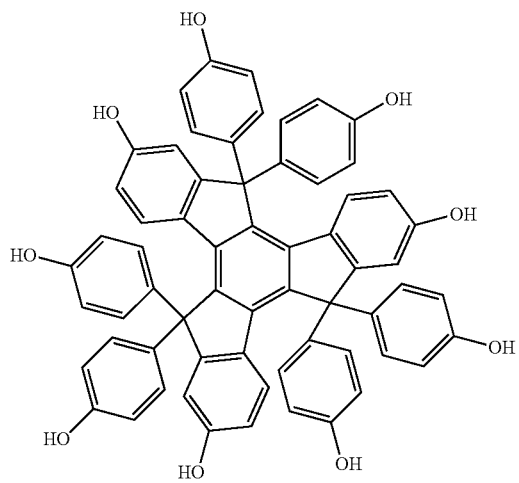

truxene compound 3

As to the compounds for comparative resist top coat in Comparative Examples, materials shown below were arranged.

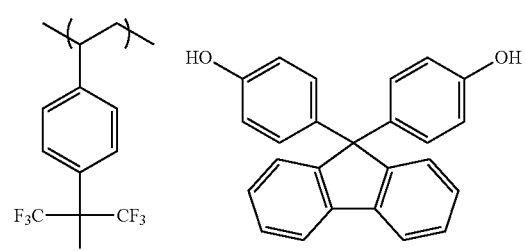

Comparative top coat polymer 1

Compound for Comparative top coat 1

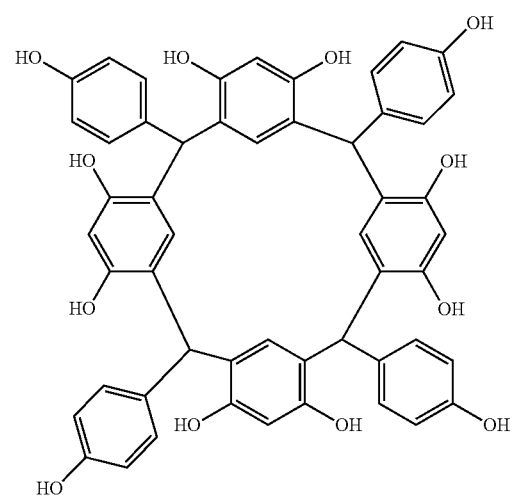

Compound for Comparative top coat 2

A compound shown above and a solvent were mixed to obtain each of resist top coat solutions TC-1 to TC-7 and Comparative TC-1 to TC-3, with the composition thereof shown in the following Table 1.

TABLE 1

| base material (parts by mass) | additive agent (parts by weight) | solvent (parts by mass) |
|---|---|---|
| TC-1 | truxene compound 1 (10) | — | isobutyl alcohol (100) diisopentyl ether (600) |
| TC-2 | truxene compound 2 (10) | — | 2-methyl-1-butanol (100) diisopentyl ether (500) |
| TC-3 | truxene compound 3 (10) | — | 4-methyl-2-pentanol (100) diisopentyl ether (500) |
| TC-4 | truxene compound 3 (10) | — | 4-methyl-2-pentanol (100) dibutyl ether (600) |
| TC-5 | truxene compound 3 (10) | — | 4-methyl-2-pentanol (100) xylene (600) |
| TC-6 | truxene compound 1 (10) | tri-n-octylamine (0.01) | 4-methyl-2-pentanol (100) diisopentyl ether (600) |
| TC-7 | truxene compound 1 (10) | 1-aminopyrene (0.01) | 4-methyl-2-pentanol (100) diisopentyl ether (600) |
| Comparative TC-1 | Comparative top coat polymer 1 (10) | — | diisopentyl ether (500) |
| Comparative TC-2 | compound for comparative top coat 1 (10) | — | isobutyl alcohol (300) diisopentyl ether (300) |
| Comparative TC-3 | compound for comparative top coat 1 (15) | — | isobutyl alcohol (800) |

Each of the resist top coat solutions TC-1 to TC-7 and Comparative TC-1 to TC-3 was applied onto a silicon wafer by spin coating, and then baked at 100° C. for 60 seconds to obtain each of the resist top coats having film thickness of 20 nm (TC-1 to TC-7 and Comparative TC-1 to TC-3).

Then, the silicon wafer having the resist top coat formed thereon by the foregoing method was soaked in an aqueous tetramethylammonium hydroxide solution (TMAH) with the concentration of 2.38% by mass for 30 seconds; and then, film thickness of the resist top coat after soaking was measured. The results thereof are shown in Table 2. It was confirmed that entirety of the resist top coat was dissolved. Accordingly, it can be seen that these top coats are dissolved during the time of development.

TABLE 2

| resist top coat | film thickness after development (nm) |
|---|---|
| TC-1 | 0 |
| TC-2 | 0 |
| TC-3 | 0 |
| TC-4 | 0 |
| TC-5 | 0 |
| TC-6 | 0 |
| TC-7 | 0 |
| Comparative TC-1 | 0 |
| Comparative TC-2 | 0 |
| Comparative TC-3 | 0 |

Next, similarly to the foregoing, each of the resist top coat solutions TC-1 and Comparative TC-1 was applied onto a silicon wafer by spin coating, and then baked at 100° C. for 60 seconds to obtain each of the resist top coats having film thickness of 20 nm (TC-1 and Comparative TC-1); and then n-value and k-value of the film were measured with a spectroscopic ellipsometry (manufactured by J. A. Woolam, Co., Inc.). From the k-value thus obtained, transmittance at the film thickness of 20 nm was obtained. These results are shown in FIG. 3 and FIG. 4.

Figure 3:
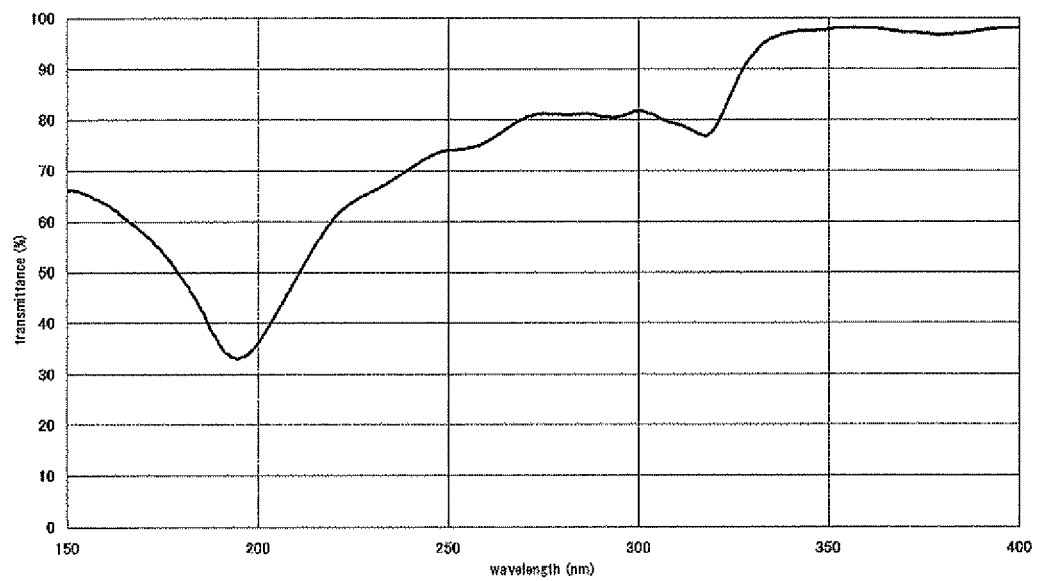
FIG. 3 is a figure showing transmittance of the resist top coat of TC-1.
Figure 4:
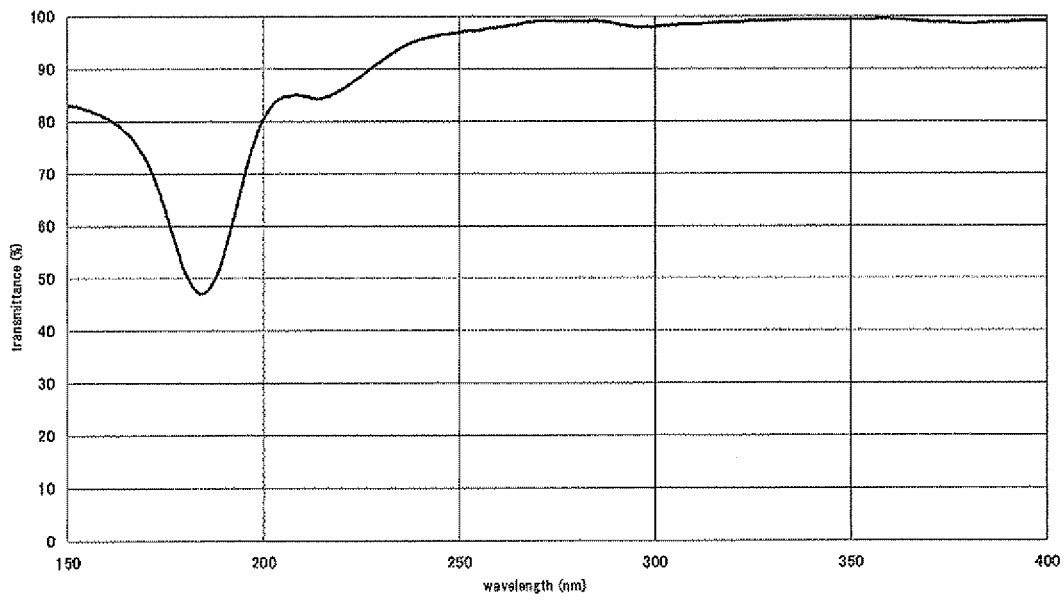
FIG. 4 is a figure showing transmittance of the resist top coat of Comparative TC-1.

As shown in FIG. 3, the truxene having a phenol group, which is used as the top coat of the present invention (TC-1), has broad absorption in the wavelength range of 180 to 250 nm, and thus, has a high shielding effect of an OOB light. On the other hand, as shown in FIG. 4, absorption of the OOB light by the comparative polymer (Comparative TC-1) is small so that there is a risk that sensitization continues by exposure to ArF and KrF.

Evaluation with EUV

Examples 1 to 8 and Comparative Examples 1 to 5

Next, a solution obtained by dissolving each of the following polymers obtained by a usual radical polymerization into a solvent with the composition shown in Table 3 was filtrated by a filter of a 0.2 μm size to prepare each of the positive resist compositions.

The positive resist composition thus obtained was applied onto a Si substrate with the diameter of 8 inches (20 cm) which was coated with a silicon-containing SOG film (SHB-A940, manufactured by Shin-Etsu Chemical Co., Ltd.) with the film thickness of 35 nm, and then it was pre-baked on a hot plate at 105° C. for 60 seconds to obtain a photoresist film with the thickness of 50 nm. On it was applied each of the resist top coat composition solutions TC-1 to TC-7 and Comparative TC-1 to TC-3 by spin coating, and then pre-baked on a hot plate at 100° C. for 60 seconds to obtain a resist top coat with the thickness of 20 nm. It was exposed by using an EUV microstepper (NA of 0.3 with quadrupole illumination). Then, by assuming exposure to the OOB light, entirety of the wafer was exposed to the light with 1 mJ/cm² by using an ArF excimer laser scanner and then to the light with 1 mJ/cm² by using a KrF excimer laser scanner. Then, it was subjected to a post-exposure bake (PEB) on a hot plate at 95° C. for 60 seconds and then developed by a puddle method in an aqueous TMAH solution with the concentration of 2.38% by mass for 30 seconds to obtain the positive photoresist film pattern (Examples 1 to 8 and Comparative Examples 1 to 3). Meanwhile, in Comparative Example 4, a top coat was not formed on the resist. In Comparative Example 5, a top coat was not formed on the resist, and exposure to both ArF and KrF, which supposed the OOB light, was not performed.

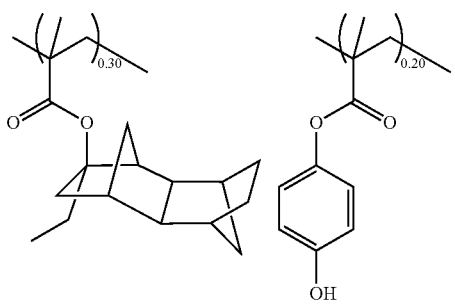

resist polymer 1

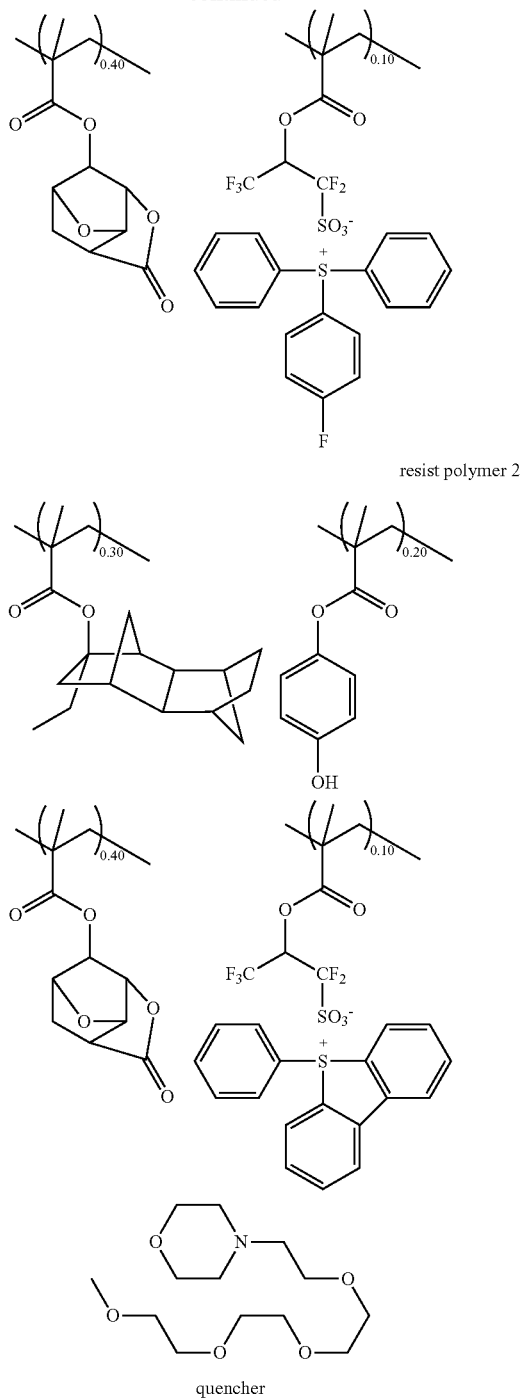

resist polymer 2 quencher

TABLE 3

| | polymer (parts by mass) | quencher (parts by mass) | surfactant (parts by weight) | solvent (parts by mass) |
|---|---|---|---|---|
| resist composition 1 | resist polymer 1 (100) | quencher (0.85) | FC-4430 (0.001) | PGMEA (1,000) PGME (500) Cyclohexanone (3,000) |
| resist composition 2 | resist polymer 2 (100) | quencher (0.85) | FC-4430 (0.001) | PGMEA (1,000) PGME (5,00) |

TABLE 3-continued

| | polymer (parts by mass) | quencher (parts by mass) | surfactant (parts by weight) | solvent (parts by mass) |
|---|---|---|---|---|
| | (100) | | | Cyclohexanone (3,000) |

PGMEA: propylene glycol monoethyl ether acetate
PGME: propylene glycol monomethyl ether
FC-4430: fluorinated surfactant, manufactured by Sumitomo 3M Limite

TABLE 4

| | | top coat | sensitivity (mJ/cm$^2$) | patterning |
|---|---|---|---|---|
| Example 1 | resist composition 1 | TC-1 | 9.5 | rectangularity |
| Example 2 | resist composition 1 | TC-2 | 9.5 | rectangularity |
| Example 3 | resist composition 1 | TC-3 | 9.5 | rectangularity |
| Example 4 | resist composition 1 | TC-4 | 9.7 | rectangularity |
| Example 5 | resist composition 1 | TC-5 | 9.8 | rectangularity |
| Example 6 | resist composition 1 | TC-6 | 9.9 | rectangularity |
| Example 7 | resist composition 1 | TC-7 | 10.0 | rectangularity |
| Example 8 | resist composition 2 | TC-1 | 10.0 | rectangularity |
| Comparative Example 1 | resist composition 1 | Comparative TC-1 | 14.0 | tapered pattern |
| Comparative Example 2 | resist composition 1 | Comparative TC-2 | 9.5 | film loss |
| Comparative Example 3 | resist composition 1 | Comparative TC-3 | 10.0 | film loss |
| Comparative Example 4 | resist composition 1 | — | 8.3 | film loss tapered pattern |
| Comparative Example 5 | resist composition 1 | — | 11.0 | rectangularity |

As shown in Examples 1 to 8, top coats of the present invention contain, as the solvent used therein, a large amount of an ether solvent or an aromatic solvent, which are capable of inhibiting mixing with the resist; and thus, a damage to the resist film is small and mixing between the resist film and the top coat is small, so that a rectangular resist pattern is formed after development. They contain many phenol groups which have high transparency in an EUV light and enhance resist sensitivity because of a sensitization effect thereof to the resist. In addition, a truxene, which has the phenol groups, used as the top coat of the present invention, has broad absorption in the wavelength of 180 to 250 nm; and thus, it has a high shielding effect of the OOB light. On the other hand, as shown in Comparative Examples 1 to 3, although top coats of Comparative Examples have high solubility in an amyl ether, absorption of the OOB light is small; and thus, sensitization continues by exposure to ArF and KrF whereby not only a tapered pattern is formed but also resist sensitivity is decreased because of a fluorine atom contained therein which has absorption in the EUV light. In addition, as shown in Comparative Example 4, when exposure to ArF and KrF was made without forming a top coat, a tapered form was formed. Further, as shown in Comparative Example 5, when exposure to ArF and KrF, which assume the OOB light, was not made without forming a top coat, a rectangular pattern could be obtained; but in an actual EUV scanner, it is very likely that a filter to cut the OOB light is not installed because of an insufficient laser power. Experiments of the pseudo OOB exposure by ArF and KrF simulate the EUV scanner exposure.

It must be stated here that the present invention is not limited to the above-mentioned embodiments. The embodiments shown above are mere examples so that any embodiment composed of substantially the same technical concept as disclosed in the claims of the present invention and expressing a effect is included in the technical scope of the present invention.

What is claimed is:

1. A patterning process, comprising:
   forming a photoresist film on a wafer;
   forming a resist top coat on the photoresist film by using a resist top coat composition that contains a truxene compound having phenol groups shown by the following general formula (1):

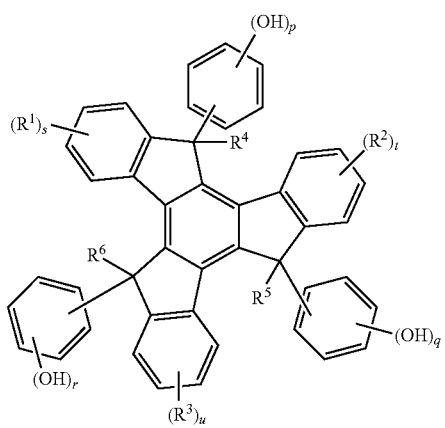

wherein
   $R^1$, $R^2$, and $R^3$ represent the same or different groups of a hydrogen atom; a hydroxyl group; a carboxyl group; a cyano group; a nitro group; an amino group; a halogen atom; or a linear, a branched, or a cyclic alkyl group having 1 to 10 carbon atoms, an alkoxy group, or an acyloxy group;
   each $R^4$, $R^5$, and $R^6$ represents a hydrogen atom, a hydroxyl group, or a substituted or an unsubstituted phenol group, or a naphthol group;
   p, q, and r represent an integer of 1 to 5; and
   s, t, and u represent an integer of 1 to 4; and
   after exposure, developing the photoresist film.

2. The patterning process according to claim 1, wherein the resist top coat composition is soluble in an alkaline developer.

3. The patterning process according to claim 2, wherein the resist top coat composition contains an organic solvent which is a mixture of an alcohol solvent with an ether solvent or with an aromatic solvent.

4. The patterning process according to claim 3, wherein the exposure is performed under vacuum.

5. The patterning process according to claim 2, wherein the exposure is performed under vacuum.

6. The patterning process according to claim 1, wherein the resist top coat composition contains an organic solvent which is a mixture of an alcohol solvent with an ether solvent or with an aromatic solvent.

7. The patterning process according to claim 6, wherein the exposure is performed under vacuum.

8. The patterning process according to claim 1, wherein the exposure is performed under vacuum.

9. The patterning process according to claim 1, wherein the exposure is performed by using a light with a wavelength of 3 to 15 nm, or an electron beam.

10. The patterning process according to claim 1, wherein the developing of the photoresist film comprises:
    developing the photoresist film by an alkaline developer; and
    removing the resist top coat.

11. The patterning process according to claim 1, wherein the photoresist film formed on the wafer has a base resin of a polymer having an average molecular weight of 1000 to 500000 and comprising repeating units a1 and a2 shown by the following general formula (2) and repeating units b1 and b2 shown by the following general formula (3):

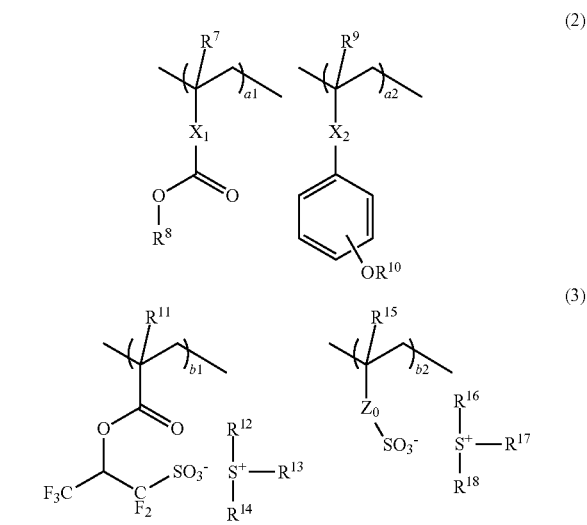

wherein
in the general formula (2),
   each $R^7$ and $R^9$ independently represents a hydrogen atom or a methyl group;
   $R^8$ and $R^{10}$ represent an acid labile group;
   $X_1$ represents a connecting group having 1 to 14 carbon atoms and having any one, or two or more of a single bond, an ester group, a lactone ring, a phenylene group, and a naphthylene group;
   $X_2$ represents a single bond, an ester group, or an amide group; and
in the general formula (3),
   each $R^{11}$ and $R^{15}$ independently represents a hydrogen atom, a fluorine atom, a methyl group, or a trifluoromethyl group;
   $R^{12}$, $R^{13}$, $R^{14}$, $R^{16}$, $R^{17}$, and $R^{18}$ represent the same or different linear, branched, or cyclic alkyl group having 1 to 12 carbon atoms and optionally containing a carbonyl group, an ester group, or an ether group, or an aryl group having 6 to 12 carbon atoms, an aralkyl group having 7 to 20 carbon atoms, or a thiophenyl group;
   $Z_0$ represents a single bond, a methylene group, an ethylene group, a phenylene group, a fluorinated phenylene group, —O—$R^{19}$—, or —C(=O)—$Z_1$—$R^{19}$—; and
   $Z_1$ represents an oxygen atom or NH; $R^{19}$ represents a linear, a branched, or a cyclic alkylene group, a phenylene group, or an alkenylene group having 1 to 13 carbon atoms wherein these groups may optionally contain a carbonyl group, an ester group, an ether group, or a hydroxyl group, or may be optionally fluorine-substituted; and each repeating unit satisfies: $0 \leq a1 \leq 0.9$, $0 \leq a2 \leq 0.9$, $0 < a1+a2 < 1$, $0 \leq b1 \leq 0.3$, $0 \leq b2 \leq 0.3$, $0 < b1+b2 \leq 0.3$, and $0 < a1+a2+b1+b2 \leq 1$.

* * * * *